(12) United States Patent
Furukawa et al.

(10) Patent No.: US 6,770,528 B2
(45) Date of Patent: Aug. 3, 2004

(54) METHOD OF FORMING A DATA-STORING CAPACITIVE ELEMENT MADE IN AN INSULATING FILM ON A SEMICONDUCTOR SUBSTRATE

(75) Inventors: Ryouichi Furukawa, Ome (JP); Kazuyuki Suko, Hachiouji (JP); Masayuki Hiranuma, Westpeak (SG); Koichi Saitoh, Tokyo (JP); Hirohiko Yamamoto, Hachiouji (JP); Tadanori Yoshida, Sayama (JP); Masayuki Ishizaka, Kodaira (JP); Maki Shimoda, Hachiouji (JP)

(73) Assignees: Hitachi ULSI Systems Co., Ltd., Tokyo (JP); Renesas Technology Corp., Tokyo (JP)

( * ) Notice: Subject to any disclaimer, the term of this patent is extended or adjusted under 35 U.S.C. 154(b) by 0 days.

(21) Appl. No.: 10/367,737

(22) Filed: Feb. 19, 2003

(65) Prior Publication Data

US 2003/0148600 A1 Aug. 7, 2003

Related U.S. Application Data

(62) Division of application No. 10/112,945, filed on Apr. 2, 2002, now abandoned, which is a division of application No. 09/610,114, filed on Jun. 30, 2000, now Pat. No. 6,444,405.

(30) Foreign Application Priority Data

Jul. 1, 1999 (JP) .......................................... 11-187450

(51) Int. Cl.$^7$ .......................................... H01L 21/8242
(52) U.S. Cl. ....................... 438/244; 438/255; 438/240; 438/398; 438/665
(58) Field of Search ............................... 438/239, 240, 438/243, 244, 253, 255, 386, 665, 396–398, FOR 132, FOR 220, FOR 212, FOR 430

(56) References Cited

U.S. PATENT DOCUMENTS

| 5,905,280 | A | * | 5/1999 | Liu et al. ..................... 257/301 |
| 5,981,333 | A | * | 11/1999 | Parekh et al. ............... 438/253 |
| 6,051,858 | A | * | 4/2000 | Uchida et al. .............. 257/295 |
| 6,150,211 | A | * | 11/2000 | Zahurak ...................... 438/244 |
| 6,248,625 | B1 | | 6/2001 | Hirota et al. |
| 6,459,138 | B2 | * | 10/2002 | Reinberg .................... 257/534 |

FOREIGN PATENT DOCUMENTS

| JP | 7-7084 | 7/1992 |
| JP | 11017144 | 6/1997 |

* cited by examiner

Primary Examiner—George Fourson
Assistant Examiner—Thanh V Pham
(74) Attorney, Agent, or Firm—Reed Smith LLP; Stanley P. Fisher, Esq.; Juan Carlos A. Marquez, Esq.

(57) ABSTRACT

Conductive layers are formed in the trenches made in an insulating film in the following manner. First, an amorphous silicon film 26A is deposited in the trenches 25 made in a silicon oxide film 24. A photoresist film 30 is then formed on the amorphous silicon film 26A by means of spin coating. Then, exposure light is applied to the entire surface of the photoresist film 30, thereby exposing to light those parts of the photoresist film 30 which lie outside the trenches 25. The other parts of the photoresist film 30, which lie in the trenches 25 are not exposed to light because the light reaching them is inadequate. Further, the photoresist film 30 is developed thereby removing those parts of the film 30 which lie outside the trenches 25 and which have been exposed to light. Thereafter, those parts of the amorphous silicon film 26A, which lie outside the trenches 25, are removed by means of dry etching using, as a mask, the unexposed parts of the photoresist film 30 which remain in the trenches 25.

9 Claims, 38 Drawing Sheets

METHOD OF FORMING A DATA-STORING CAPACITIVE ELEMENT MADE IN AN INSULATING FILM ON A SEMICONDUCTOR SUBSTRATE

The application is a continuation of U.S. application Ser. No. 10/112,945, filed Apr. 2, 2002 abandoned, which is divisional application of U.S. application Ser. No. 09/610,114 filed on Jun. 30, 2000 now U.S. Pat. No. 6,444,405.

TECHNICAL FIELD OF THE INVENTION

The present Invention relates to a method of manufacturing a semiconductor integrated circuit device. More particularly, the invention relates to a technique, which is useful and efficient when applied to the process of forming conductive layers in the trenches or through holes made in an insulating film.

BACKGROUND OF THE INVENTION

The memory cells of a DRAM (Dynamic Random Access Memory) are arranged at the intersections of a plurality of word lines and a plurality of bit lines, which are provided on the major surface of the, semiconductor substrate. Hence, the memory cells are arranged in rows and columns on the major surface of the semiconductor substrate. Each of the memory cells comprises a MISFET (Metal Insulator Semiconductor Field Effect Transistor) and a capacitive element. The MISFET is turned on to select the memory cell. The capacitive element Is connected to the MISFET in series, for storing data.

Each MISFET for selecting one memory cell is provided in an active region of the substrate, which is surrounded by element-Isolating regions. The cell-selecting MISFET comprises a gate insulating film, a gate electrode formed integral with a word line, and a pair of semiconductor regions serving as the source and the drain, respectively. Each bit line is provided above two adjacent cell-selecting MISFETs and electrically connected to the common source or drain of the adjacent MISFETs, which are arranged along the bit line. The data-storing capacitive element is also located above the MISFETs, too, and electrically connected to the common source or drain of the MISFETs.

Japanese Patent Application Laid-Open Publication No. 7-7084 discloses a DRAM of a stacked capacitor structure, in which data-storing capacitive elements are provided above cell-selecting MISFETs. In the DRAM disclosed in the publication, the lower electrode (data-storing electrode) of each data-storing capacitive element is shaped as a hollow cylinder with a larger surface to compensate for the decrease in stored charge which inevitably results from the size reduction of the memory cell. The upper electrode (plate electrode) of the data-storing capacitive element is provided above the lower electrode.

Japanese Patent Application Laid-Open Publication No. 11-17144 discloses the technique of forming a reinforcing member made of insulating film, on the bottom of a hollow cylindrical lower electrode of the type described above. The reinforcing member increases the mechanical strength of the lower electrode thereby preventing the lower electrode from toppling in the course of manufacturing the data-storing capacitive element.

SUMMARY OF THE INVENTION

The Inventors of the present invention have been developing the technique of first forming a trench in a thick silicon oxide film deposited and located above a bit line and then forming the lower electrode (data-storing electrode) of a data-storing capacitive element in the trench.

The data-storing capacitive element is manufactured as follows. First, a thick silicon oxide film is formed above the bit line. A trench is made In-the silicon oxide film by means of dry etching using a mask made of a photoresist film. Then, a polycrystalline silicon film is deposited in the trench and on the silicon oxide film. Thereafter, a coating is formed on the polycrystalline silicon film by means of SOG (Spin On Glass) or the like, thereby protecting the polycrystalline silicon film. A part of the polycrystalline silicon film, which is provided on the silicon oxide film, is removed by dry etching. The other part of the polycrystalline silicon film, which remains. In the trench, will be used as the lower electrode.

Next, the SOG film Is removed from the polycrystalline silicon film remaining In the trench. The SOG film is removed by dry etching or wet etching based upon the difference In etching rate between the silicon oxide film and the SOG film.

Then, a dielectric film, such as a tantalum oxide (Ta2O5) film, is deposited on the polycrystalline silicon film. A conductive film made of titanium oxide or the like is deposited on the tantalum oxide film. A data-storing capacitive element is thereby manufactured, which comprises a lower electrode made of a polycrystalline silicon film, a capacitance insulating film made of a tantalum oxide film, and an upper electrode made of a titanium oxide film.

The data-storing capacitive element described above has its lower electrode provided in a trench made in a silicon oxide film. Provided in the trench, the lower electrode would not be toppled as the conventional lower electrode that is shaped like a hollow cylinder, in the course of manufacturing the data-storing capacitive element. In view of this, the lower electrode is advantageous over the conventional one. However, the lower electrode of the data-storing capacitive element has a smaller surface than the conventional lower electrode, whose inner surface and outer surface are used as a region to effectively hold the accumulated charge. In order to hold the charge reliably, some measures must be taken to increase the surface area of the lower electrode. To Increase the surface area of the lower electrode, the trench in which the lower electrode is provided may be made deeper, and depressions and projections may be made at the surface of the lower electrode.

However, the method of manufacturing the lower electrode, wherein the selective etching of the SOG film Is achieved based upon the difference in etching rate between the silicon oxide film and the SOG film, is disadvantageous In one respect. Since the difference in etching rate between these films is not sufficiently large, the oxide silicon film outside the trench is etched to some extent when the SOG film covering the polycrystalline silicon film provided In the trench is etched. Consequently, the upper surface of the silicon oxide film lowers, in particular where depressions and projections are made at the surface of the polycrystalline silicon film and over-etching is performed to remove those parts of the SOG film which remain in the depressions and between the projections.

If the upper surface of the silicon oxide film lowers, the upper edge of the polycrystalline silicon film formed in the trench protrudes from the plane in which the trench opens. This impairs the surface smoothness of the data-storing capacitive element such that it is inevitably impaired. Further, an electric field concentrates at the upper edge of the polycrystalline silicon film, which inevitably increases the leakage current of the data-storing capacitive element.

An object of the present invention is to provide a technique for enhancing the manufacturing yield of a DRAM comprising data-storing capacitive elements, each having a lower electrode provided in a trench made in an insulating film.

Another object of the invention is to provide a technique of forming a conductive layer in a trench or a through hole made in an insulating film.

Additional objects and novel features of the invention will be obvious from the description, which follows, and the drawings accompanying the present specification.

The representative embodiments of this invention are briefly described as follows.

(1) A method of manufacturing a semiconductor integrated circuit device, according to this invention, comprises the following steps:
  (a) forming a first conductive film on a surface of a semiconductor substrate, forming a first insulating film on the first conductive film, and making a trench or a through hole in the first insulating film;
  (b) forming a second conductive film in the trench or the through hole and on the first insulating film, said second conductive film extending through the trench or the through hole and electrically connected to the first conductive film;
  (c) covering the second conductive film with a photoresist film and applying exposure light to the photoresist film, thereby exposing to light at least that part of the photoresist film which lies outside the trench or the through hole;
  (d) removing a part of the photoresist film which is exposed to light, thereby leaving the other, unexposed part of the photoresist film in the trench or the through hole; and
  (e) removing the unexposed part of the second conductive film which is not covered with the photoresist film, thereby leaving the other part of the second conductive film in the trench or the through hole.

(2) In the method of manufacturing a semiconductor integrated circuit device device described in Paragraph M. the second conductive film may be removed in part in the step (e) by means of etching using the Photoresist film as a mask.

(3) In the method of manufacturing a semiconductor integrated circuit device device, described in paragraph (1), the second conductive film May be removed in part in the step (e) by means of chemical mechanical Polishing.

(4) In the method of manufacturing a semiconductor integrated circuit device device, described in Paragraph (1), wherein the photoresist film may be removed in part in the step (d) by developing the photoresist film.

(5) The method of manufacturing a semiconductor integrated circuit device, described in paragraph (1), after the step (e) has been performed, may further comprise a step (f) of removing that part of the photoresist film lying in the trench or the through hole and growing a third conductive film on the second conductive film exposed in the trench or the through hole, thereby burying the third conductive film in the trench or the through hole.

(6) In the method of manufacturing a semiconductor integrated circuit device, described in paragraph (5), the second conductive film may be made of titanium nitride or tungsten.

(7) In the method of manufacturing a semiconductor integrated circuit device, described in paragraph (5), the third conductive film may be made of tungsten or aluminum alloy.

(8) The method of manufacturing a semiconductor integrated circuit device, described in paragraph (5), after the step (f) has been performed, may further comprise a step (h) of forming a fourth conductive film on the first insulating film and electrically connecting the fourth conductive film to the first conductive film via the third conductive film in the trench or the through hole.

(9) The method of manufacturing a semiconductor integrated circuit device, described in paragraph (1), may further comprise the following steps (f) and (g) which are performed after the step (e):
  (f) removing that part of the photoresist film which lie in the trench or the through hole, and forming a fifth conductive film in the trench or the through hole and on the first insulating film; and
  (g) growing a sixth conductive film on the fifth conductive film and removing those parts of the sixth and fifth conductive films which lie outside the trench or the through hole, thereby leaving the sixth and fifth conductive film in the trench or the through hole.

(10) In the method of manufacturing a semiconductor integrated circuit device, described in paragraph (9), the second conductive film may be made of titanium nitride or tantalum nitride.

(11) In the method of manufacturing a semiconductor integrated circuit device, described in paragraph (9), the fifth and sixth conductive films may be made of copper.

(12) In the method of manufacturing a semiconductor integrated circuit device, described in paragraph (9), said parts of the sixth and fifth conductive films may be removed by means of chemical mechanical polishing.

(13) A method of manufacturing a semiconductor integrated circuit device, according to the present invention, is one designed to manufacture a semiconductor integrated circuit device that has at least one memory cell composed of a cell-selecting MISFET formed in a major surface of a semiconductor substrate and a data-storing capacitive element provided above the cell-selecting MISFET. This method comprises the steps of:
  (a) forming a cell-selecting MISFET on in a major surface of a semiconductor substrate, forming a first insulating film on the cell-selecting MISFET, and forming, in a through hole made in the first insulating film, a first conductive film electrically connected to a source or drain of the cell-selecting MISFET;
  (b) forming a second insulating film on the first insulating film and making a trench in the second insulating film;
  (c) forming a second conductive film in the trench and on the second insulating film, said second conductive film extending through the trench and electrically connected to the first conductive film;
  (d) covering the second conductive film with a photoresist film and applying exposure light to the photoresist' film, thereby exposing that part of the photoresist film which lies outside the trench to light;
  (e) removing that part of the photoresist film Which has been exposed to light. thereby leaving, in the trench, that part of the photoresist film which is not exposed to light;
  (f) removing that part of the second conductive film which is not covered with the photoresist film, thereby leaving the other part of the second conductive film in the trench; and (g) removing that part of the photoresist film that lies in the trench, and then forming a third insulating film in the trench and on the second insulating film and forming a third conductive film on the third insulating film, thereby forming a data-storing capacitive element composed of a first electrode, a capacitive insulating film and a second electrode which are made of the second conductive film, third insulating film and third conductive film, respectively.

(14) A method of manufacturing a semiconductor integrated circuit device, according to the invention, is one designed to manufacture a semiconductor integrated circuit device that has at least one memory cell composed of a cell-selecting MISFET formed in a major surface of a semiconductor substrate and a data-storing capacitive element provided above the cell-selecting MISFET. This method comprises the steps of:

(a) forming a cell-selecting MISFET on the major surface of the semiconductor substrate, forming a first insulating film on the cell-selecting MISFET, and forming, in a through hole made in the first insulating film, a first conductive film electrically connected to a source or drain of the cell-selecting MISFET;

(b) forming a second insulating film on the first insulating film and making a trench in the second insulating film;

(c) forming, in the trench and on the second insulating film, a second conductive film made of amorphous silicon and electrically connected to the first conductive film via the trench;

(d) covering the second conductive film with a photoresist film and applying exposure light-to the photoresist film, thereby exposing that part of the photoresist film which lies outside the trench to light;

(e) removing that part of the photoresist film which has been exposed to light, thereby leaving, in the trench, that part of the photoresist film which is not exposed to light;

(f) removing that part of the second conductive film which is not covered with the photoresist film, thereby leaving the second conductive film in the trench;

(g) removing that part of the photoresist film which lies in the trench and forming depressions and projections in and on the surface of the second conductive film exposed in the trench;

(h) heat-treating the second conductive film, converting the same to a polycrystalline film; and (i) forming a third insulating film in the trench and on the second insulating film and forming a third conductive film on the third insulating film, thereby forming a data-storing capacitive element composed of a first electrode, a capacitive insulating film and a second electrode which are made of the second conductive film, third insulating film and third conductive film, respectively.

(15) A method of manufacturing a semiconductor integrated circuit device, according to the invention, is one designed to manufacture a semiconductor integrated circuit device that has at least one memory cell composed of a cell-selecting MISFET formed in a major surface of a semiconductor substrate and a data-storing capacitive element provided above the cell-selecting MISFET. The method comprises the steps of:

(a) forming a cell-selecting MISFET on a major surface of a semiconductor substrate, forming a first insulating film on the cell-selecting MISFET, and forming, in a through hole made in the first insulating film, a first conductive film electrically connected to a source or drain of the cell-selecting MISFET;

(b) forming a second insulating film on the first insulating film and then making a trench in the second insulating film;

(c) forming, in the trench and on the second insulating film, a second conductive film made of amorphous silicon and electrically connected to the first conductive film via the trench;

(d) forming depressions and projections in and on the surface of the second conductive film;

(e) heat-treating the second conductive film, converting the same to a polycrystalline film; and (f) covering the second conductive film with a photoresist film and applying exposure light to the photoresist film, thereby exposing that part of the photoresist film which lies outside the trench to light;

(g) removing that part of the photoresist film which has been exposed to light, thereby leaving that part of the photoresist film which lies in the trench;

(h) removing that part of the second conductive film which is not covered with the photoresist film, thereby leaving the second conductive film in the trench;

(i) removing that part of the photoresist film which lies in the trench, then forming a third insulating-film in the trench and on the second insulating film and forming a third conductive film on the third insulating film, thereby forming a data-storing capacitive element composed of a first electrode, a capacitive insulating film and a second electrode which are made of the second conductive film, third insulating film and third conductive film, respectively.

(16) In the method of manufacturing a semiconductor integrated circuit device, described in paragraph (14), that part of the second conductive film which is not covered with the photoresist film may be removed by means of etching using the photoresist film as a mask.

(17) In the method of manufacturing a semiconductor integrated circuit device, described in paragraph (14), the depressions and projections may be formed in and on the second conductive film, by growing silicon grains on the surface of the second conductive film made of amorphous silicon.

(18) In the method of manufacturing a semiconductor integrated circuit device, described in paragraph (14), wherein when that part of the second conductive film which is not covered with the photoresist film is removed, an upper edge of that part of the second conductive film which lies in the trench is made to recede below a rim of the trench.

(19) In the method of manufacturing a semiconductor integrated circuit device, described in paragraph (18), the upper edge of the second conductive film may be made to recede by a distance substantially equal to a diameter of the depressions and projections formed in and on the surface of the second conductive film.

(20) In the method of manufacturing a semiconductor integrated circuit device, described in paragraph (13), the second insulating film may be a silicon oxide film.

(21) In the method of manufacturing a semiconductor integrated circuit device, described in paragraph (13), the third insulating film may be a film having a large dielectric constant or a ferroelectric film.

(22) A method of manufacturing a semiconductor integrated circuit device, according to the present invention, comprises the steps of:

(a) forming a first conductive film on a major surface of a semiconductor substrate, forming a first insulating film on the first conductive film and then making a through hole in the first insulating film;

(b) forming a photoresist film in the through hole and on the first insulating film, and then exposing to light a part of the photoresist film which lies in the through hole and a part of the part of the photoresist film which lies on a wire-forming region;

(c) removing the part of the photoresist film which has been exposed to light, thereby leaving the unexposed parts of the photoresist film which lie on a part of the first insulating film and in the through hole;

(d) etching the first insulating film by using the unexposed part of the photoresist film as a mask, thereby making a wire trench in the first insulating film;

(e) removing the unexposed part of the photoresist film and forming a second conductive film, on the first insulating film and in the wire trench and through hole, said second conductive film lying in the through hole and electrically connected to the first conductive film via the through hole; and (f) removing the part of the second conductive film which lies on the first insulating film by means of chemical and mechanical polishing, thereby forming a buried wire made of the second conductive film in the wire trench and through hole.

(23) In the method of manufacturing a semiconductor integrated circuit device, described in paragraph (22), the second conductive film may be made of copper.

(24) A method of manufacturing a semiconductor integrated circuit device, according to the present invention, comprises the steps of:

(a) forming a first conductive film on a major surface of a semiconductor substrate, forming a first insulating film on the first conductive film and then patterning the first insulating film and first conductive film, thereby forming a gate electrode made of the first conductive film and covered with the first insulating film;

(b) forming semiconductor regions in two parts of the semiconductor substrate lie at both sides of the gate electrode;

(c) forming a second insulating film on the semiconductor substrate, covering the gate electrode formed on the semiconductor substrate and then forming a third insulating film on the second insulating film, said third insulating film having an etching rate different from that of the second insulating film;

(d) etching the third insulating film by using a first photoresist film as a mask, thereby making-a first trench reaching the second insulating film provided on the semiconductor region and making a second trench reaching the second insulating film provided on the gate electrode;

(e) removing the first photoresist film and forming a second photoresist film in the first and second trenches and on the third insulating film;

(f) applying exposure light to the second photoresist film, thereby exposing to light those parts of the second photoresist film which lie in the second trench and on the third insulating film, and removing those parts of the second resist film which have been exposed to light, thereby leaving an unexposed part of the second photoresist film in the first trench;

(g) etching a part of the second insulating film and a part of the first insulating film lying beneath the second insulating film, by using the second photoresist film left in the first trench as a mask; and (h) removing the second photoresist film and etching the second insulating film lying in the first trench and the first insulating film lying in the second trench, thereby making a first contact hole exposing the semiconductor region and a second contact hole exposing the gate electrode.

(25) In the method of manufacturing a semiconductor integrated circuit device, described in paragraph (24), the first and second insulating films may be made of silicon nitride and the third insulating film is made of silicon oxide film.

(26) The method of manufacturing a semiconductor integrated circuit device, described in paragraph (24) may comprises the following steps (i) and (J) which are performed after the step (h):

(i) forming a second conductive film in the first and second contact holes and on the third insulating film; and (j) patterning the second conductive film, thereby forming first and second wires in the first and second contact holes, which are electrically connected to the semiconductor region and the gate electrode, respectively.

(27) A method of manufacturing a semiconductor integrated circuit device, according to this invention, comprises the following steps:

(a) forming a trench in a first insulating film provided on a major surface of a semiconductor substrate and forming a silicon layer in the trench and on the first insulating film;

(b) forming a second insulating film on the silicon layer laying in the trench and removing that part of the silicon layer which lies outside the trench;

(c) removing that part of the second insulating film which lies in the trench and forming depressions and projections in and on the silicon layer; and (d) forming a dielectric film on the silicon having the depressions and projections in and on the surface, and forming a conductive film on the dielectric film.

(28) In the method of manufacturing a semiconductor integrated circuit device, described in paragraph (27), the silicon layer may be made of amorphous silicon.

(29) In the method of manufacturing a semiconductor integrated circuit device, described in paragraph (27), the first insulating film may be made of silicon oxide and the second insulating film is made of photoresist.

(30) In the method of manufacturing a semiconductor integrated circuit device, described in paragraph (27), the depressions and projections provided in and on the silicon layer may be ones formed by growing silicon grains on the surface of the silicon layer.

(31) In the method of manufacturing a semiconductor integrated circuit device, described in paragraph (29), the step (b) may include the following sub-steps:

(b-1) forming a photoresist film in the trench and on the first insulating film and then applying exposure light to the photoresist film, thereby applying light to that part of the photoresist film which lies outside the trench;

(b-2) removing that part of the photoresist film which has been exposed to light, thereby leaving an unexposed part of the photoresist film in the trench; and (b-3) removing that part of the silicon layer which lies outside the trench, by means of etching using the photoresist film as a mask.

(32) In the method of manufacturing a semiconductor integrated circuit device, described in paragraph (27), the Silicon layer having the depressions and projections in and on the surface may constitute a first electrode of a capacitive element, the dielectric film may constitute a capacitive insulating film of the capacitive element, and the Conductive film may constitute a second electrode of the capacitive element.

(33) A method of manufacturing a semiconductor integrate circuit, according to the present invention, comprises the following steps:
  (a) making a trench in a first insulating film provided on a major surface of a semiconductor substrate and then forming a conductive layer in the trench and on the first insulating film;
  (b) forming a photoresist film on the conductive layer and applying exposure light to the photoresist film, thereby exposing to light the entire surface of the photoresist film and a part of the photoresist film which lies in the trench;
  (c) developing the photoresist film, thereby removing that part of the photoresist film which has been entirely exposed to light and leaving that unexposed part of the photoresist film which lies in the trench; and
  (d) removing the unexposed part of the conductive layer which is not covered with the photoresist film.

(34) In the method of manufacturing a semiconductor integrate circuit, described in paragraph (33), that part of the conductive layer may be removed by means of etching using the photoresist film as a mask.

(35) A method of manufacturing a semiconductor integrate circuit, according to the invention, comprises the following steps:
  (a) forming a silicon oxide film on a major surface of a semiconductor substrate and making a trench in the silicon oxide film;
  (b) forming a first conductive film in the trench and on the silicon oxide film;
  (c) covering the first conductive film with a photoresist film and applying exposure light to the photoresist film, thereby exposing to light that part of the photoresist film which lies outside the trench;
  (d) developing that part of the photoresist film which has been exposed to light, thereby leaving the unexposed part of the photoresist film in the trench;
  (e) removing the unexposed-part of the first conductive film which lies on the silicon oxide film, by means of etching using the photoresist film as a mask; and
  (f) removing that part of the photoresist film which lies in the trench, thereby leaving that part of the first conductive film which lies in the trench.

(36) In the method of manufacturing a semiconductor integrate circuit, described in paragraph (35), the photoresist film may be removed in the step (f by means of ashing.

BRIEF DESCRIPTIONS OF THE DRAWINGS

DESCRIPTION OF THE PREFERRED EMBODIMENTS

Figure 1:
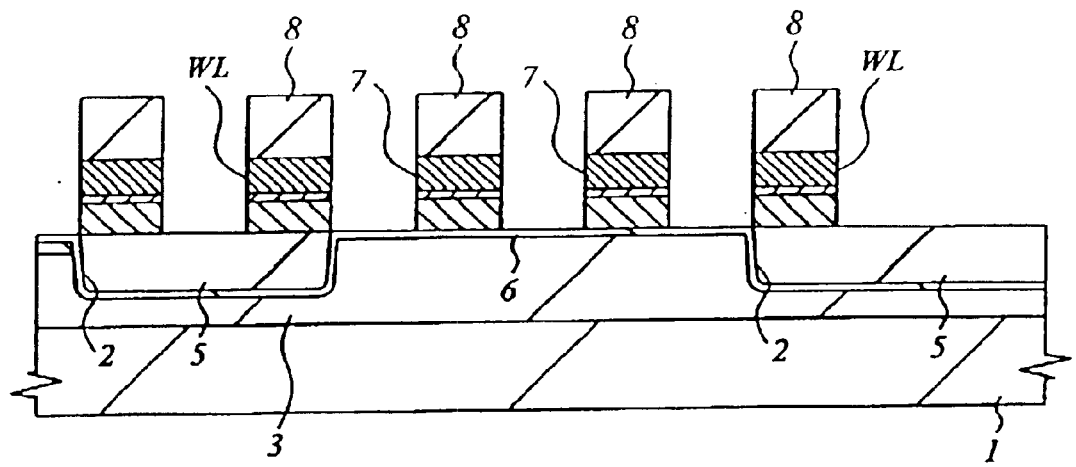
FIG. 1 is a sectional view of a semiconductor substrate, illustrating a method of manufacturing a semiconductor integrated circuit device, i.e. Embodiment 1 of the present invention.

Embodiments of the present invention will be described in detail, with reference to the accompanying drawings. In the drawings illustrating the embodiments, the components of any embodiment, which perform the same functions as those of any other embodiment, are designated with the same reference numerals and symbols and will not be described repeatedly.

(Embodiment 1)

The method of manufacturing a DRAM (Dynamic Random Access Memory), which is Embodiment 1 of the present invention, will be explained, by describing the sequence of manufacturing steps, with reference to FIGS. 1 to 14.

First, as shown in FIG. 1, element-isolating trenches 2 are made in the surface of a semiconductor substrate 1 (hereinafter referred to as "substrate") that is made of, for example, p-type single crystal silicon. More specifically, those parts of the substrate 1 are etched away thereby making the trenches 3. Silicon oxide is deposited in the trenches 3 and on the substrate 1 by means of CVD (Chemical Vapor Deposition). The silicon oxide on the substrate 1 is removed by CMP (Chemical Mechanical Polishing), thereby forming silicon oxide film 5 in the trenches 3. Thereafter, p-type impurities (boron (B)) are ion-implanted into the substrate 1 thereby forming a p-type well 3 in the major surface of the substrate 1.

Next, the substrate 1 is subjected to steam oxidation thus forming a gate insulating film 6 on the surface of the p-type well 3. Gate electrodes 7 (word lines WL) are formed on the gate insulating film 6, in the following manner. First, a polycrystalline silicon film doped with n-type impurities, such as phosphorus (P), is deposited on the substrate 1 by CVD. Then, a tungsten nitride (WN) film is formed on the polycrystalline silicon film by sputtering. Further, a tungsten (W) film is deposited on the tungsten nitride film by sputtering. Then, a silicon nitride film 8 is formed on the tungsten film by CVD. And then, the tungsten nitride film, the tungsten film and the silicon nitride film 8 are patterned by dry etching using a photoresist film as a mask.

Figure 2:
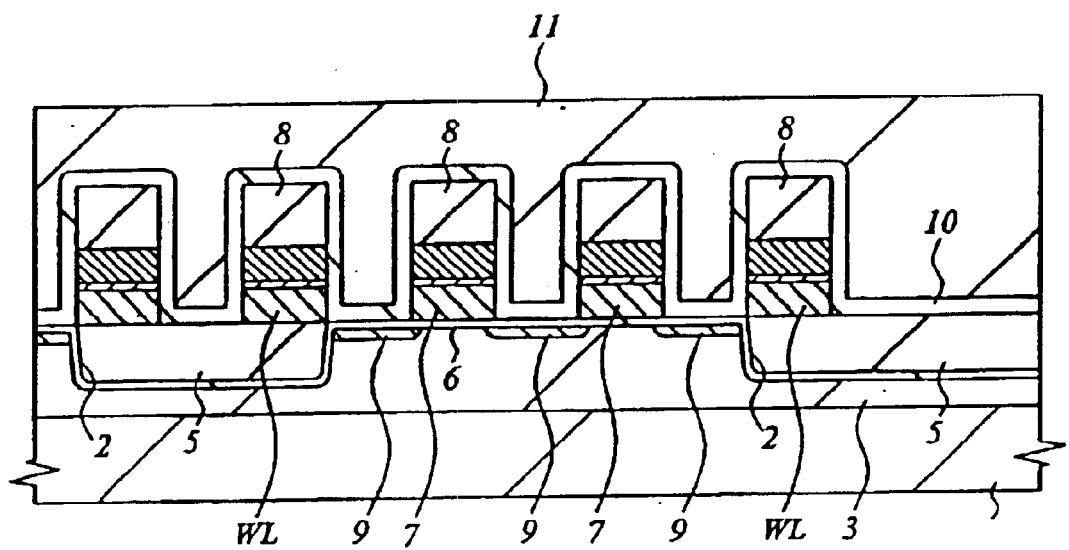
FIG. 2 is a sectional view of the semiconductor substrate, explaining the method of manufacturing a semiconductor integrated circuit device, i.e., Embodiment 1 of this present invention.
Figure 3:
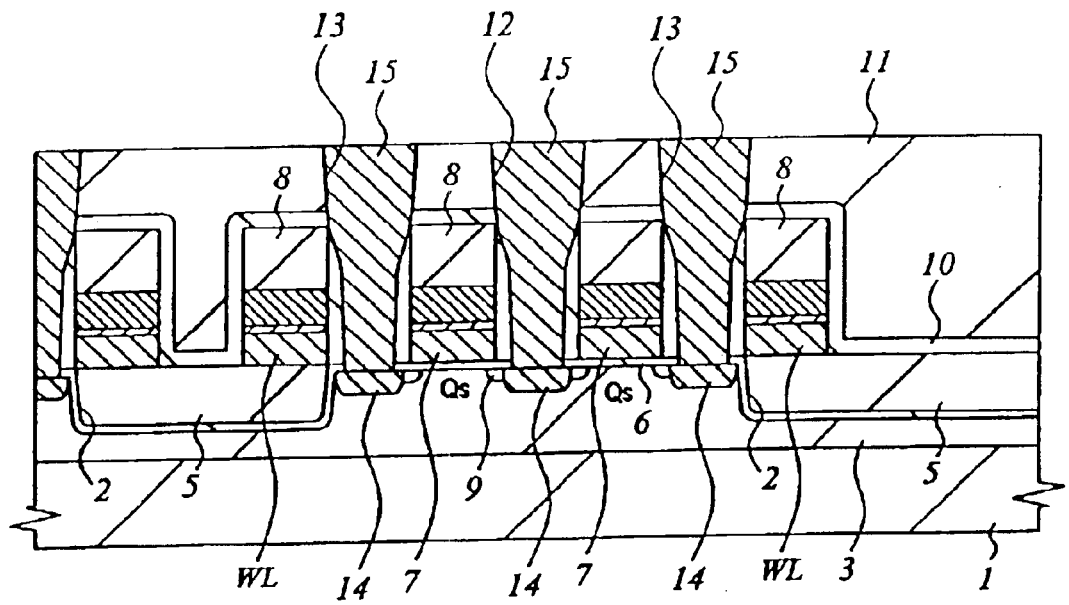
FIG. 3 is a sectional view of the semiconductor substrate, explaining the method of manufacturing a semiconductor integrated circuit device, i.e., Embodiment 1 of the invention.

As shown in FIG. 2, n-type impurities, such as phosphorus (P), are ion-implanted into those parts of the p-type wells 3, which are among the gate electrodes 7. N$^-$-type semiconductor regions 9 are thereby formed. A silicon nitride film 10 is deposited on the gate electrodes 7 (word lines WL) by CVD, and a silicon oxide film 11 is also deposited on the silicon nitride film 10 by CVD. Chemical mechanical polishing is performed on the silicon oxide film 11 such that the film 11 has a flat upper surface. 30 Then, as shown in FIG. 3, the silicon oxide film 11 and silicon nitride film 10 are subjected to dry etching using a photoresist film (not shown) as a mask. Contact holes 12 and 13 are thereby made above the n$^-$-type semiconductor regions 9, respectively. The silicon oxide film 11 is etched at a rate much higher than the rate at which the silicon nitride film 10 is etched, thus preventing the silicon nitride film 10 lying beneath the silicon nitride film 11 from being removed. The silicon nitride film 10 is etched at a rate much higher than the rate at which the substrate I is etched, thereby preventing the substrate 1 from being etched excessively deep. Moreover, the silicon nitride film 10 is subjected to anisotropic etching, thereby leaving the silicon nitride film 10 on the sides of each gate electrode 7 (word line WL). As a result, the contact holes 12 and 13 are self-aligned with respect to the gate electrodes 7 (word lines WL). Hence, there is no need to provide a margin for the alignment between the contact holes 12, 13 and the gate electrodes 7 (word lines WL). This helps to decrease the size of the memory cells of the DRAM.

Next, n-type impurities such as arsenic (As), are ion-implanted into the p-type well 3 through the contact holes 12 and 13 thereby forming n$^+$-type semiconductor regions 14 (sources and drains). The manufacturing steps, described thus far, form n-channel MISFETs Qs, each having a gate insulating film 6, a gate electrode 7 and n$^+$-type semiconductor regions 14 (source and drain) and used to select a memory cell.

Further, plugs 15 are formed in the contact holes 12 and 13. More specifically, the plugs 15 are formed in the following way. First, low-resistance polycrystalline silicon films doped with n-type impurities, such as phosphorus, are deposited in the contact holes 12 and 13 and on the silicon oxide film 11 by means of CVD. Then, the polycrystalline silicon film that lies on the silicon oxide film 11 is removed by dry etching (or by chemical mechanical polishing). The polycrystalline silicon film is thereby left in the contact holes 12 and 13 only.

Figure 4:
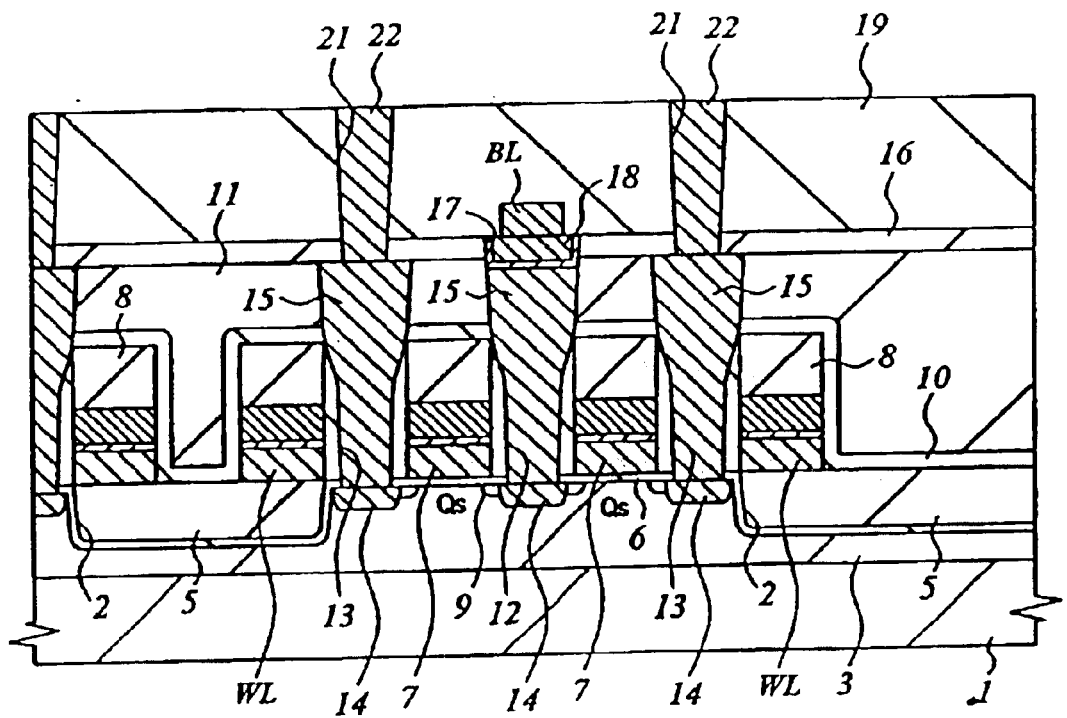
FIG. 4 is a sectional view of the semiconductor substrate, illustrating the method of manufacturing a semiconductor integrated circuit device, i.e., Embodiment 1 of the invention.

As shown in FIG. 4, a silicon oxide film 16 is deposited on the silicon oxide film 11 by means of CVD. Dry etching using a photoresist film (not shown) as a mask is performed on the silicon oxide film 16 to make a through hole 17 that communicates with the contact hole 12. A plug 18 is then formed in the through hole 17. Further, a bit line BL is formed on the plug 18.

More precisely, the plug 18 is formed by the following method. First, a titanium nitride film is deposited in the through hole 17 and on the silicon oxide film 16 by means of sputtering. Then, a tungsten film is deposited in the through hole 17 and on the titanium nitride film also by of sputtering. Thereafter, the titanium nitride film and the tungsten film, except the parts in the through hole 17, are removed by chemical mechanical polishing. The bit line BL is formed in the following manner. First, a tungsten film is deposited on the silicon oxide film 16 by means of sputtering. Then, dry etching using a photoresist film (not shown) as a mask is carried out, thus patterning the tungsten film. The bit line BL thus formed is electrically connected by the plugs 18 and 15 formed in the through holes 17 and 12, respectively, to the drain or source (i.e., n$^+$-type semiconductor region 14) of the cell-selecting MISFET Qs.

Next, a silicon oxide film 19 is deposited on the silicon oxide film 16 by means of CVD. The silicon oxide films 19 and 16 are subjected to dry etching using a photoresist film (not shown) as a mask, thus making through holes 21. A plug 22 is formed in each of the through holes 21 in the following way. First, a low-resistance polycrystalline silicon film doped with n-type impurities such as phosphorus (P) is deposited by CVD in the through hole 21 and on the silicon oxide film 19. Then, that part of the polycrystalline silicon film which is provided on the silicon oxide film 19 is removed by dry etching (or by chemical mechanical polishing), thereby leaving the polycrystalline silicon film in the through hole 21 only.

Figure 5:
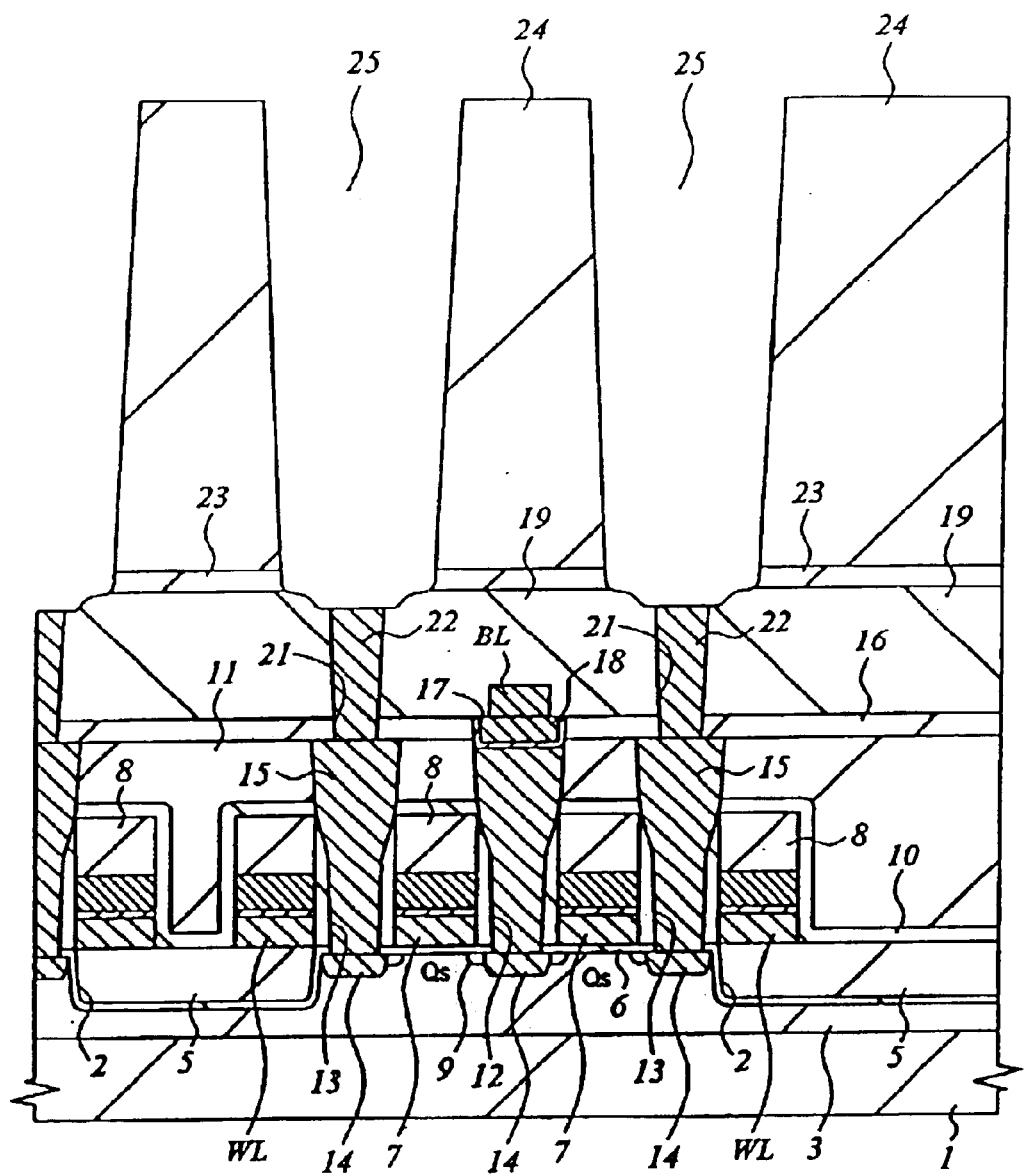
FIG. 5 is a sectional view of the semiconductor substrate, depicting the method of manufacturing a semiconductor integrated circuit device, i.e., Embodiment 1 of this invention.

As shown in FIG. 5, a silicon nitride film 23 is deposited on the silicon oxide film 19 by CVD. Then, a silicon oxide film 24 is deposited on the silicon nitride film 23 by CVD, too. The silicon oxide film 24 and silicon nitride film 23 are subjected to dry etching using a photoresist film (not shown) as a mask, thereby making trenches 25 which are aligned with the through holes 21. The lower electrodes of data-storing capacitive elements (later described) will be formed on the inner walls of these trenches 25. The silicon oxide film 24 must therefore have a large thickness (1 μm or more) to impart a large area to the lower electrodes, thereby to increase the charge that each capacitive element may accumulates.

The silicon oxide film 24 is etched at a rate higher than the rate at which the silicon nitride film 23 may be etched. This prevents the silicon nitride film 23, which lies beneath the silicon oxide film 24, from being removed. The silicon nitride film 23 is etched at a rate higher than the rate at which the silicon oxide film 19 may be etched. This prevents the silicon oxide film 19 from being etched too deep. The silicon nitride film 23 provided beneath the thick silicon oxide film 24 functions as an etching stopper, preventing the silicon oxide film 19 from being etched excessively when the silicon oxide film 24 is etched to make the trenches 25. The trenches 25 can therefore be made with high precision.

Figure 6:
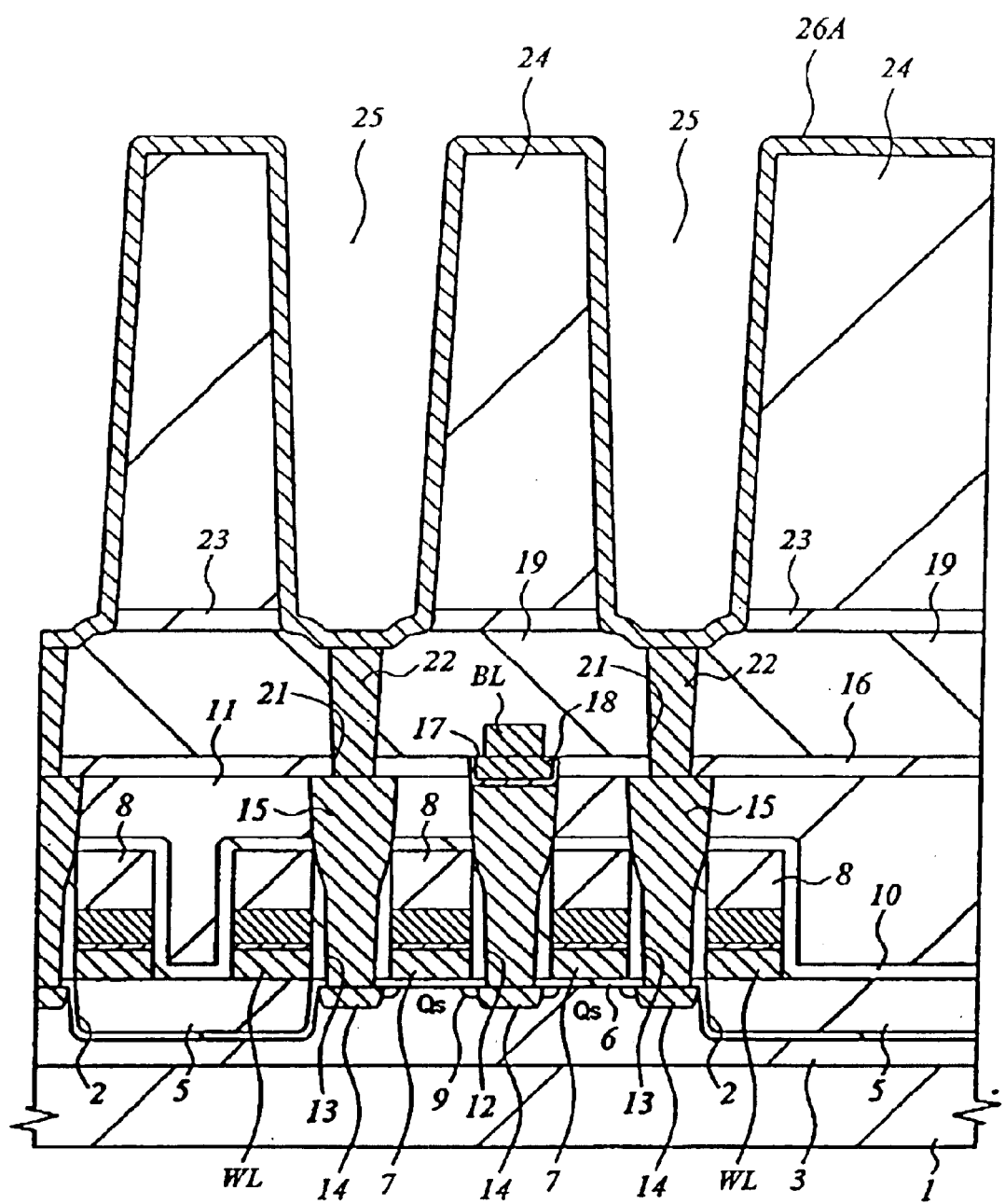
FIG. 6 is a sectional view of the semiconductor substrate, explaining the method of manufacturing a semiconductor Integrated circuit device, i.e., Embodiment 1 of the present invention.

Thereafter, as shown in FIG. 6, an amorphous silicon film 26A doped with n-type impurities Such as phosphorus is deposited in the trenches 25 and the silicon oxide film 24 by means of CVD. The amorphous silicon film 26A is deposited to a small thickness (e.g., 50 to 60 nm) thereby only covering the inner surfaces of the trenches 25.

Figure 7:
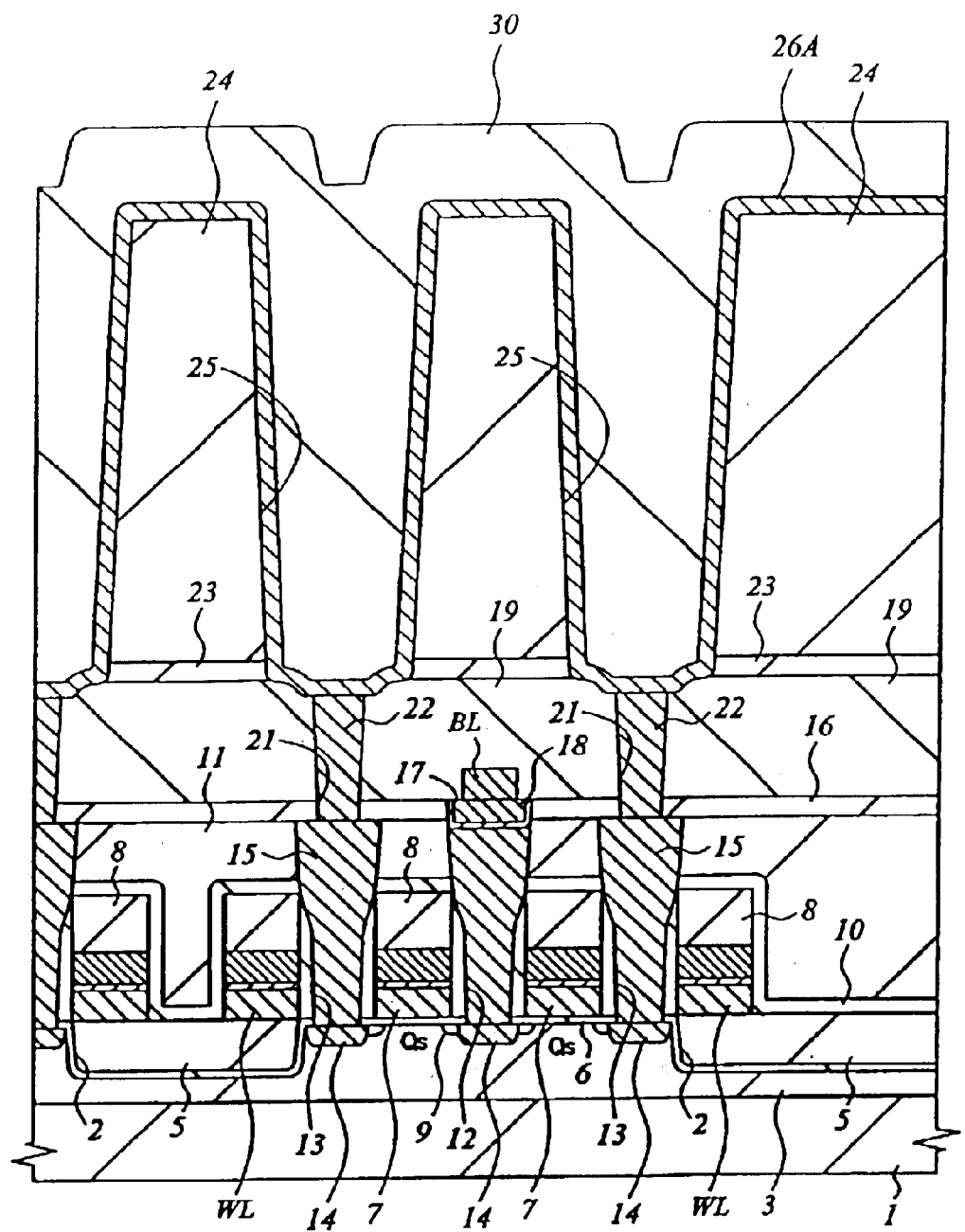
FIG. 7 is a sectional view of the semiconductor substrate, showing the method of manufacturing a semiconductor integrated circuit device, i.e., Embodiment 1 of the present invention.

As shown In FIG. 7, a photoresist film 30 is formed on the amorphous silicon film 26A by spin-coating. The photoresist film 30 is made of positive-type photoresist (e.g., photoresist mainly made of novolac resin).

Figure 8:
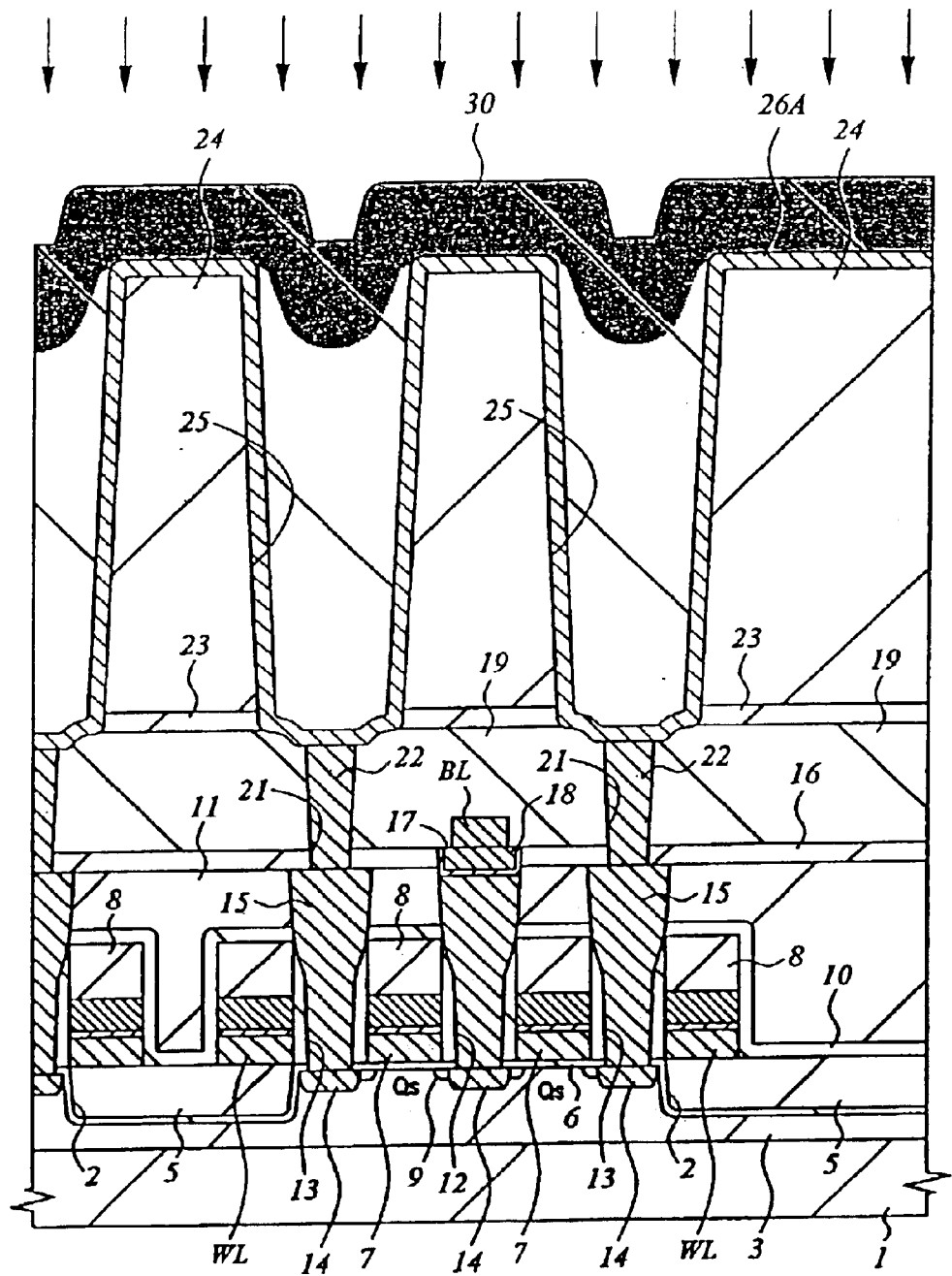
FIG. 8 is a sectional view of the semiconductor substrate, explaining the method of manufacturing a semiconductor integrated circuit device, i.e., Embodiment 1 of this invention.

Then, as FIG. 8 shows, exposure light is applied to the entire surface of the photoresist film 30. At this time, those parts of the photoresist film 30, which exist outside the trenches 25 and near the rims thereof are exposed to light. By contrast, the other parts provided near the bottoms of the trenches 25 are not thoroughly exposed to light, because the exposure light reaching the bottoms of the trenches 25 are weak.

Figure 9:
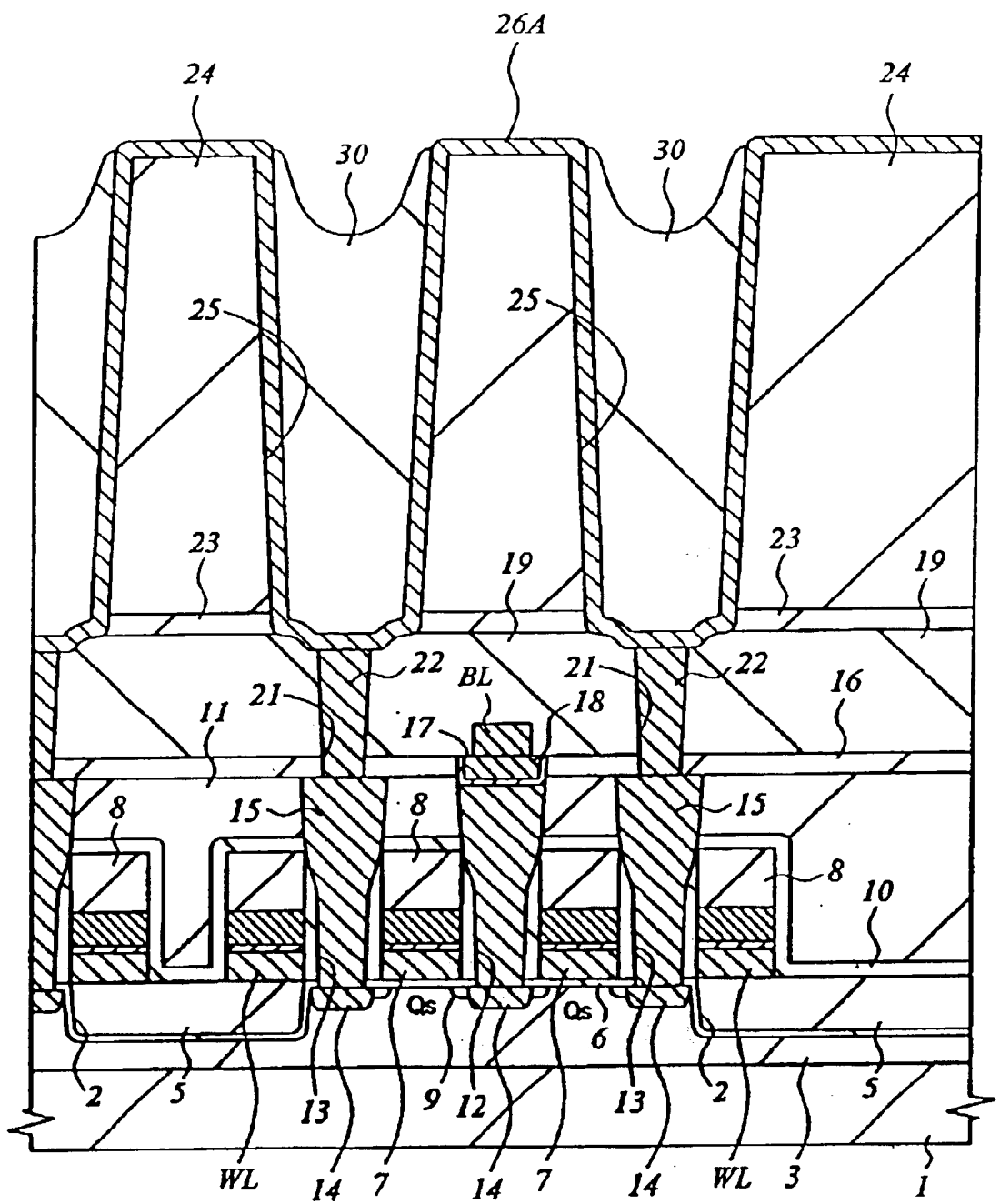
FIG. 9 is a sectional view of the semiconductor substrate, Illustrating the method of manufacturing a semiconductor integrated circuit device, i.e., Embodiment 1 of the invention.

As shown in FIG. 9, the photoresist film 30 is developed with alkali aqueous solution or the like. Those parts of the photoresist film 30, which exist outside the trenches 25 and near the rims thereof, are removed because they are soluble with the developing solution. On the other hand, the other parts of the film 30, which are provided near the bottoms of the trenches 25, are not removed because they have not sufficiently exposed. As a result, those parts of the amorphous silicon film 26A, that are outside the trenches 25, are exposed. The other parts of the film 26A, which exist in the trenches 25, remain covered with the photoresist film 30, except for those parts that are provided near the rims of the trenches 25.

Figure 10:
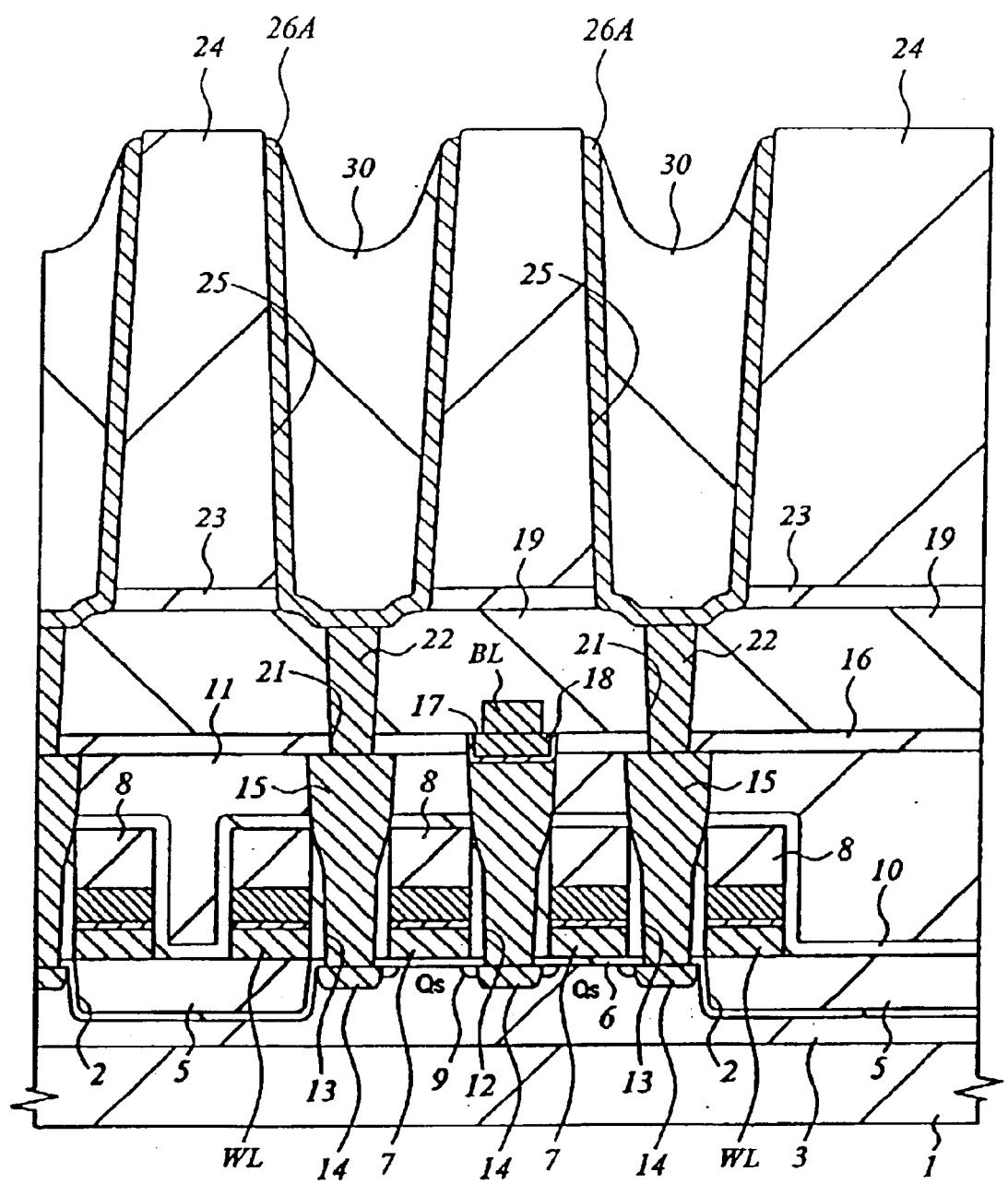
FIG. 10 is a sectional view of the semiconductor substrate, explaining the method of manufacturing a semiconductor integrated circuit device, i.e., Embodiment 1 of the invention.

Next, as shown in FIG. 10, those parts of the amorphous silicon film 26A, which are not covered with the photoresist film 30, i.e., the parts outside the trenches 25 and near the rims thereof, are removed by means of dry etching. The amorphous silicon film 26A is etched at a rate much higher than the rate at which the photoresist film 30 may be etched. This prevents those parts of the amorphous silicon film 26A, which are covered with the photoresist films 30 Provided in the trenches 25, from being exposed and etched away.

It is desired that the amorphous silicon film 26A is subjected to anisotropic etching such that the upper edges of the amorphous silicon films 26 in the trenches 25 may recede downwards a little from the rims of the trenches 25. If the upper edges of the amorphous silicon films 26 so recede downwardly, an electric field will scarcely concentrate at the distal ends (upper edges) of the lower electrodes formed in the trenches 25. It is therefore possible to decrease the leakage current of the data-storing capacitive elements. It is desirable to make the upper edges of the amorphous silicon films 26 recede from the rims of the trenches 25 by a distance (about 50 nm) that is almost equal to the diameter of silicon grains grown in the surface of the amorphous silicon film 26A. If the upper edges of the amorphous silicon films 26 recede shorter than this distance, the silicon grains will protrude from the rims of the trenches 25, and an electric field will concentrate at the silicon grains. Conversely, if the upper edges of the amorphous silicon films 26 recede longer than this distance, the surface of the lower electrode of each capacitive element will decrease, inevitably reducing the charge the capacitive element can accumulate.

Figure 11:
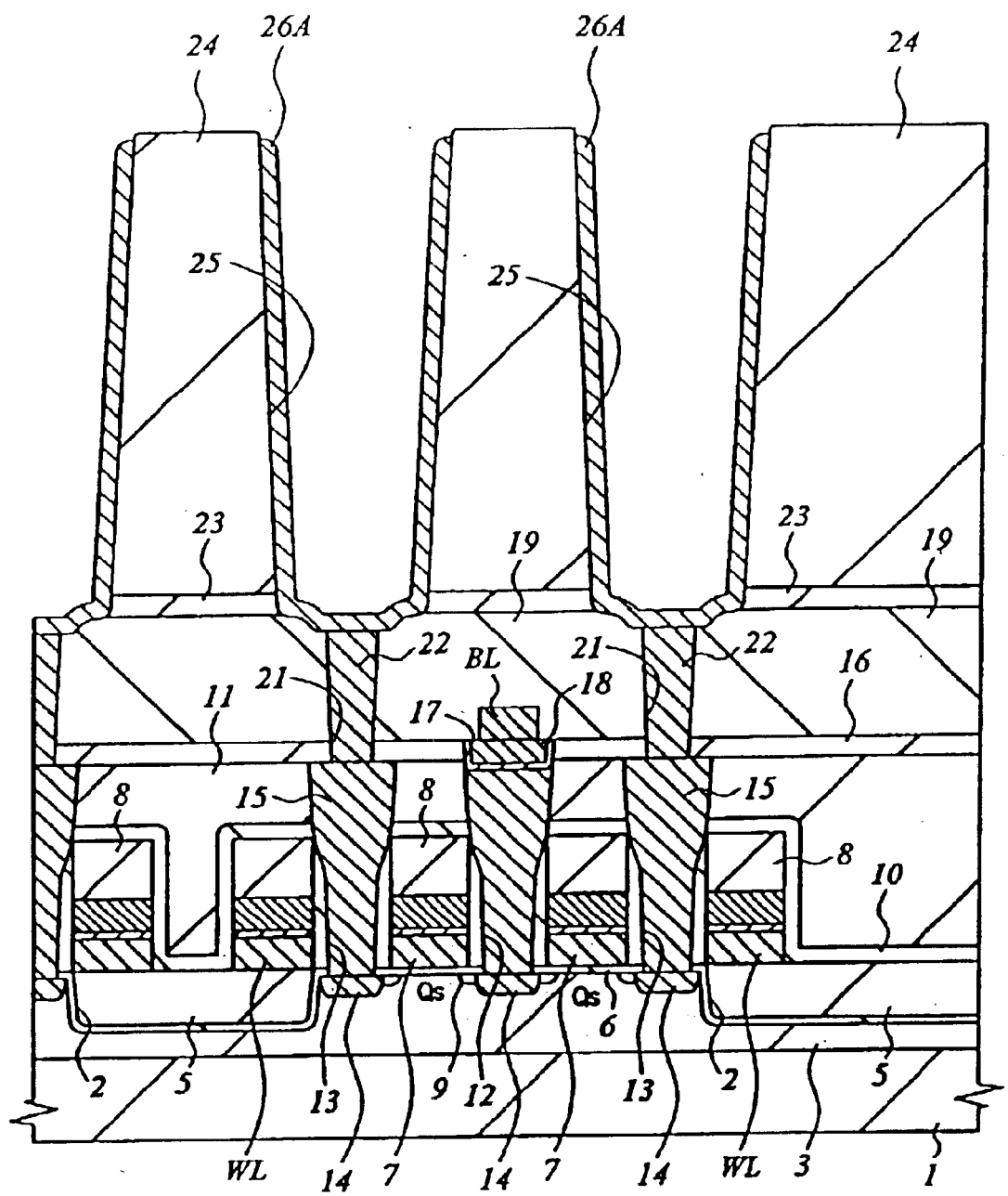
FIG. 11 is a sectional view of the semiconductor substrate, showing the method of manufacturing a semiconductor Integrated circuit device, i.e., Embodiment 1 of the present invention.

Then, as shown in FIG. 11, those parts of the photoresist film 30 which remain in each trench 25 are removed by means of, for example, ozone ashing. Specifically, the photoresist film 30 is oxidized and decomposed with the oxygen radicals generated by thermally decomposing ozone. This ashing is conducted in such a manner that the oxygen radicals are generated in great numbers and for a long time. Many oxygen radicals, so generated, decompose and remove the photoresist film 30 completely from the amorphous silicon film 26A provide in each trench 25 (that is relatively deep).

During the dry etching of those parts of the amorphous silicon films 26A, which are outside the trenches 25, the photoresist film 30 protects the other parts of the amorphous silicon films 26A, which are provided in the trenches 25. Thereafter, the photoresist film 30, which is no longer necessary, is removed by means of ashing. With this method it is possible to minimize the etching of the other parts of the films 26A which exist in the trenches 25, in the course of removing those parts of the amorphous silicon films 26A which are outside the trenches 25. This is because the amorphous silicon film 26A is etched at a rate higher than the rate at which the photoresist film 30 may be etched. Since the photoresist film 30 is removed from the trenches 25 by means of ashing, it is also possible to minimize the etching of those parts of the silicon oxide film 24 provided outside the trenches 25.

Figure 12:
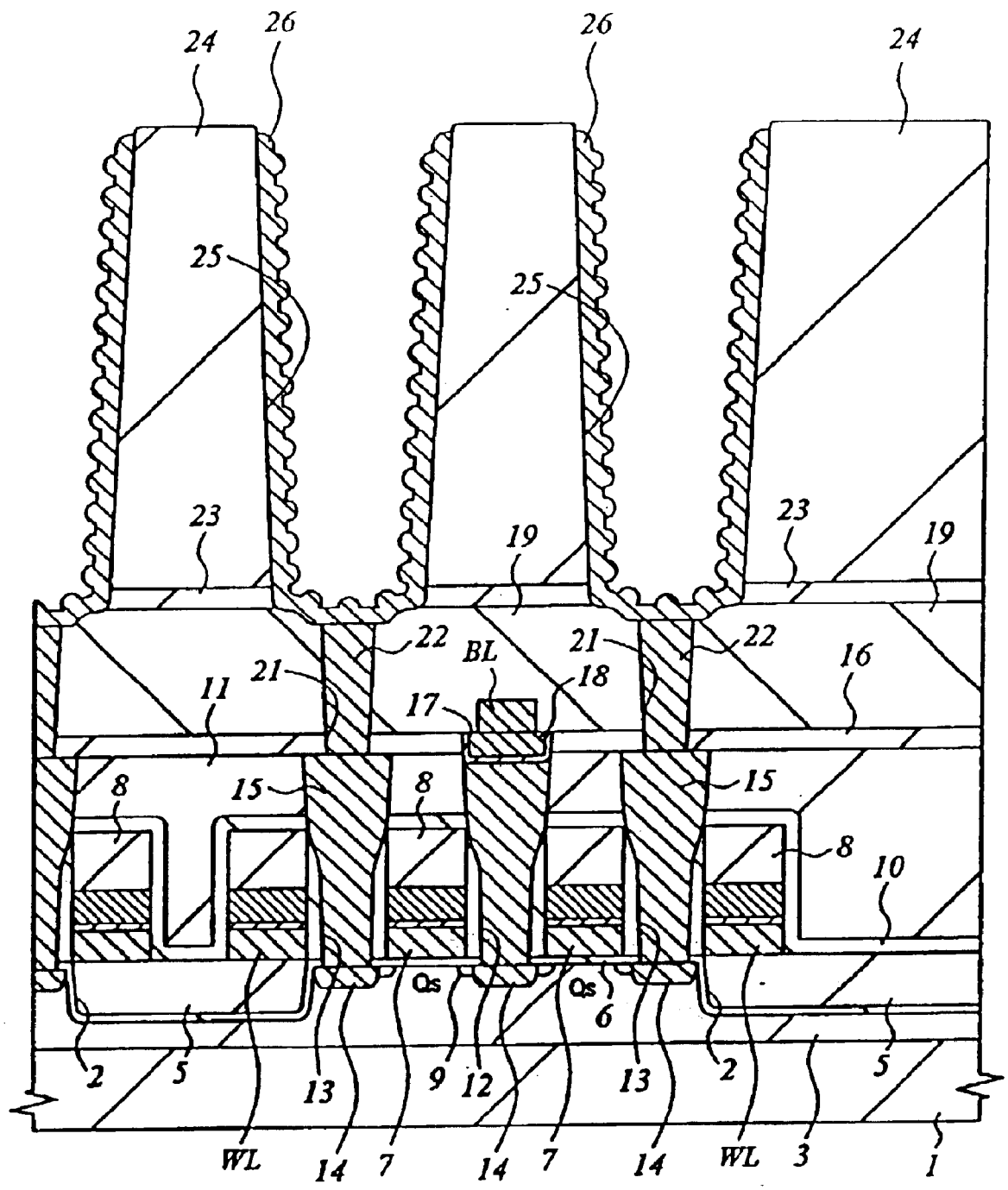
FIG. 12 is a sectional view of the semiconductor substrate, depicting the method of manufacturing a semiconductor integrated circuit device, i.e., Embodiment 1 of the invention.

Next, as shown in FIG. 12, the amorphous silicon films 26A that exist in the trenches 25, are processed by forming polycrystalline silicon films 26 with a rough surface. More precisely, the surfaces of the amorphous silicon films 26A are washed with, for example, a hydrofluoric acid-based washing solution. Then, monosilane ($SiH_4$) or disilane ($Si_2H_6$) is applied to the amorphous silicon film 26A in a pressure-reduced atmosphere. Silicon grains with an average diameter of about 50 nm are thereby grown on the surface of each amorphous silicon film 26A. Thereafter, the substrate 1 is heat-treated thereby converting the amorphous silicon films 26 to polycrystalline silicon films 26. Having a rough surface, each polycrystalline silicon film 26 has a large surface area. This renders it possible to increase the charges the data-storing capacitive element can accumulate.

In the present embodiment, the amorphous silicon films 26A provided in the trenches 25 have their surfaces roughened after the photoresist film 30 (protecting the films 26A) is removed by means of ashing. Therefore, those parts of the photoresist film 30, which remain in the trenches 25, can be easily removed. If a protection film is formed on the amorphous silicon films 26A after roughening the surfaces of the amorphous silicon films 26A and removed after etching away the amorphous silicon films 26A, the protection film would likely remain in the depressions made in the surface of each film 26A and between the projections formed on the surface thereof.

Figure 13:
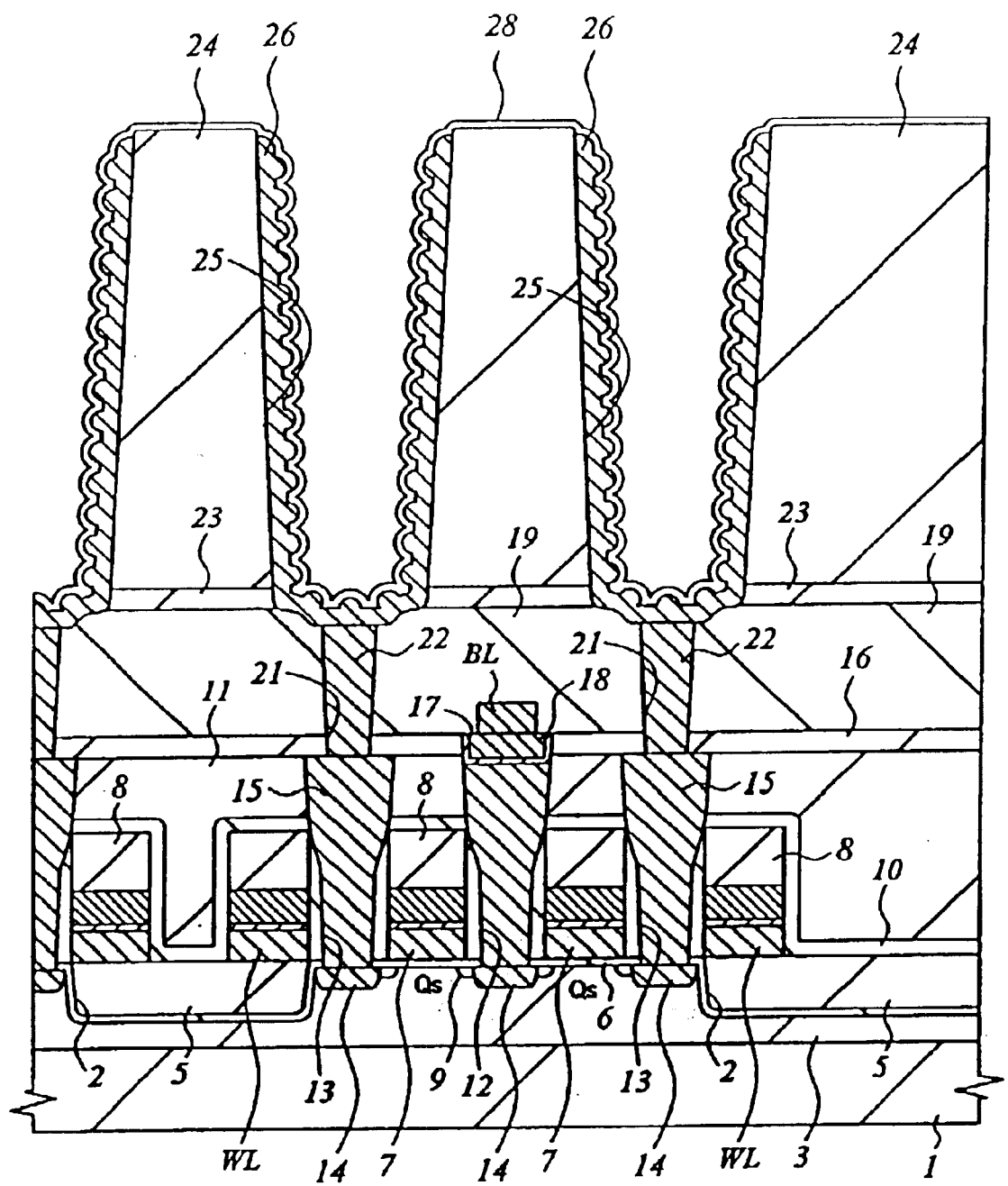
FIG. 13 is a sectional view of the semiconductor substrate, explaining the method of manufacturing a semiconductor integrated circuit device, i.e., Embodiment 1 of this invention.

As shown in FIG. 13, a tantalum oxide ($Ta_2O_5$) film 28 is formed on the exposed top of the silicon oxide film 24 and on the polycrystalline silicon films 26 provided in the trenches 25. The tantalum oxide film 26, which has a large dielectric constant, is formed by thermal CVD in which pentaethoxy tantalum and oxygen are used as source gases. The film 26 has a thickness of about 20 m. Before the tantalum oxide film 26 is formed, the polycrystalline silicon film 26 is nitrided thereby forming a thin silicon nitride film on each polycrystalline silicon film 26. In this case, the thin silicon film reduces the leakage current in the tantalum oxide film 28. Thereafter, the tantalum oxide film 28 is changed and crystallized in an oxygen atmosphere at about 800° C. As a result, a tantalum oxide film 28 is obtained, which has a large dielectric constant and in which the leakage current is small.

Figure 14:
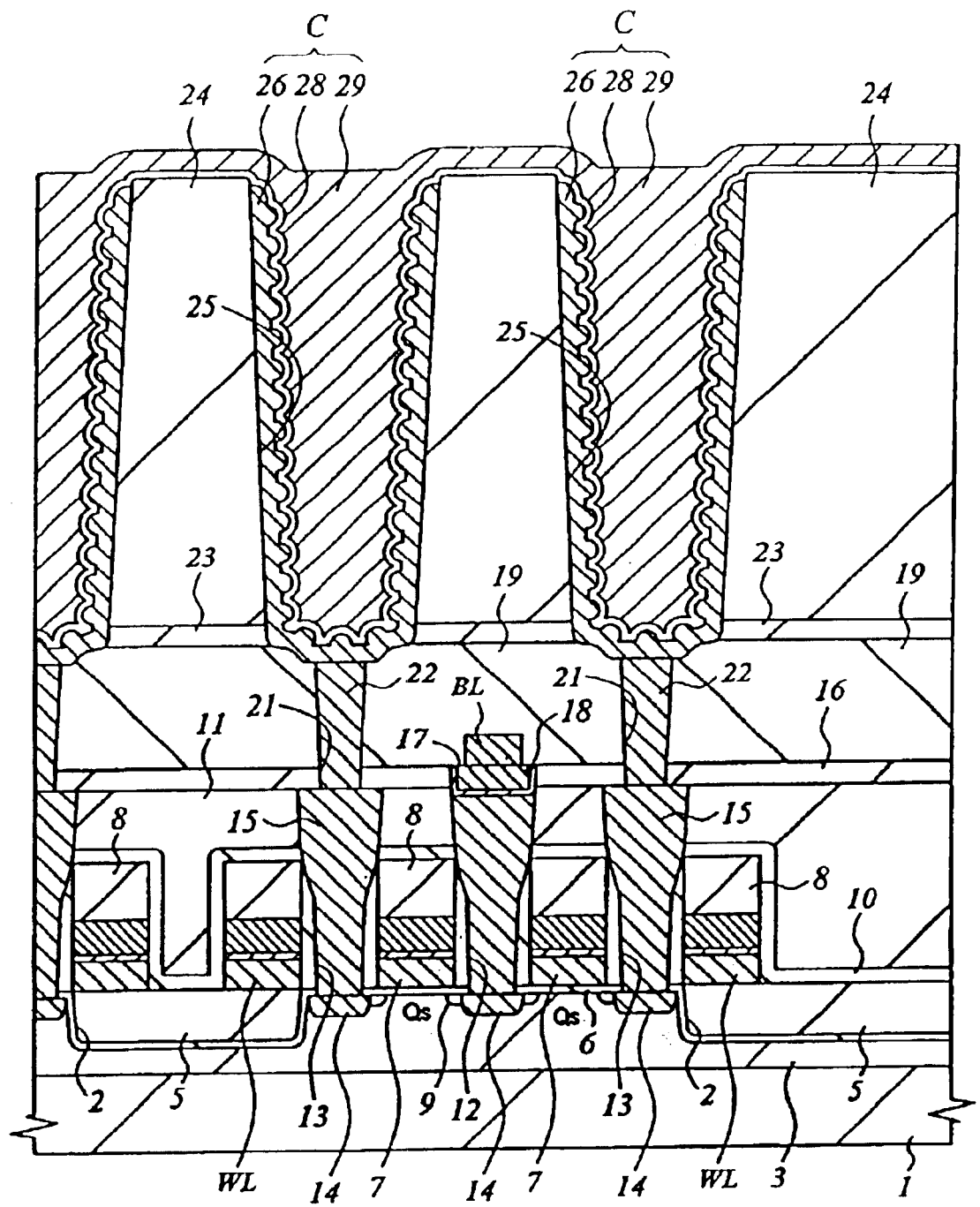
FIG. 14 is a sectional view of the semiconductor substrate, explaining the method of manufacturing a semiconductor integrated circuit device, i.e., Embodiment 1 of the invention.

As shown in FIG. 14, CVD and sputtering are carried out, depositing a titanium nitride (TiN) film 29 on the tantalum oxide film 28. As a result, data-storing capacitive elements C are formed. Each capacitive element C comprises a lower electrode made of the polycrystalline silicon film 26, a capacitance insulating film made of the oxide tantalum film 28, and an upper electrode made of the silicon nitride film 29. The lower electrode (i.e., the polycrystalline silicon film 26) of each data-storing capacitive element C is electrically connected to the other of the source and drain (i.e., $n^+$-type semiconductor regions 14) of the cell-selecting MISFET Qs by the plugs 22 and 15 that are formed in the through hole 21 and the contact hole 13, respectively. Thus, the memory cells of the DRAM are made, each comprising a cell-selecting MISFET Qs and a data-storing capacitive element C connected in series to the MISFET Qs.

Thereafter, aluminum (Al) wires, each comprising two layers, are formed on the data-storing capacitive elements C. A passivation film is formed to cover the aluminum wires. The passivation film is a two-layer film composed of a silicon oxide film and a silicon nitride film formed on the silicon oxide film. Neither the aluminum wires nor the passivation film is illustrated in FIG. 14 and will not be described in detail.

In the present embodiment, the lower electrodes formed in the trenches 25 made in the surface of the silicon oxide film 24 a made of the polycrystalline silicon film 26. Nonetheless, the material of the lower electrodes is not limited to polycrystalline silicon. Nor the materials of the capacitance insulating film and upper electrode are limited to tantalum oxide and titanium nitride, respectively. Rather, the lower electrodes and upper electrodes may be made of tungsten, platinum, ruthenium, iridium or the like. The capacitance insulating film may be made of a metal oxide having a large dielectric constant or a ferroelectric material. To be more specific, the capacitance insulting film may be made of BST, STO, $BaTiO_3$ (barium titanate), $PbTiO_3$ (lead titanate), PZT ($PbZrX$ $Til-XO_3$), PLT ($PbLaX$ $Til-XO_3$), or PUT.

(Embodiment 2)

The method of manufacturing a DRAM (Dynamic Random Access Memory), which is Embodiment 2 of the invention, will be described with reference to FIGS. 15 to 21. Embodiment 2 is differs from Embodiment 1 in the way of forming the lower electrodes (i.e., the polycrystalline silicon films 26) of the data-storing capacitive elements C.

Figure 15:
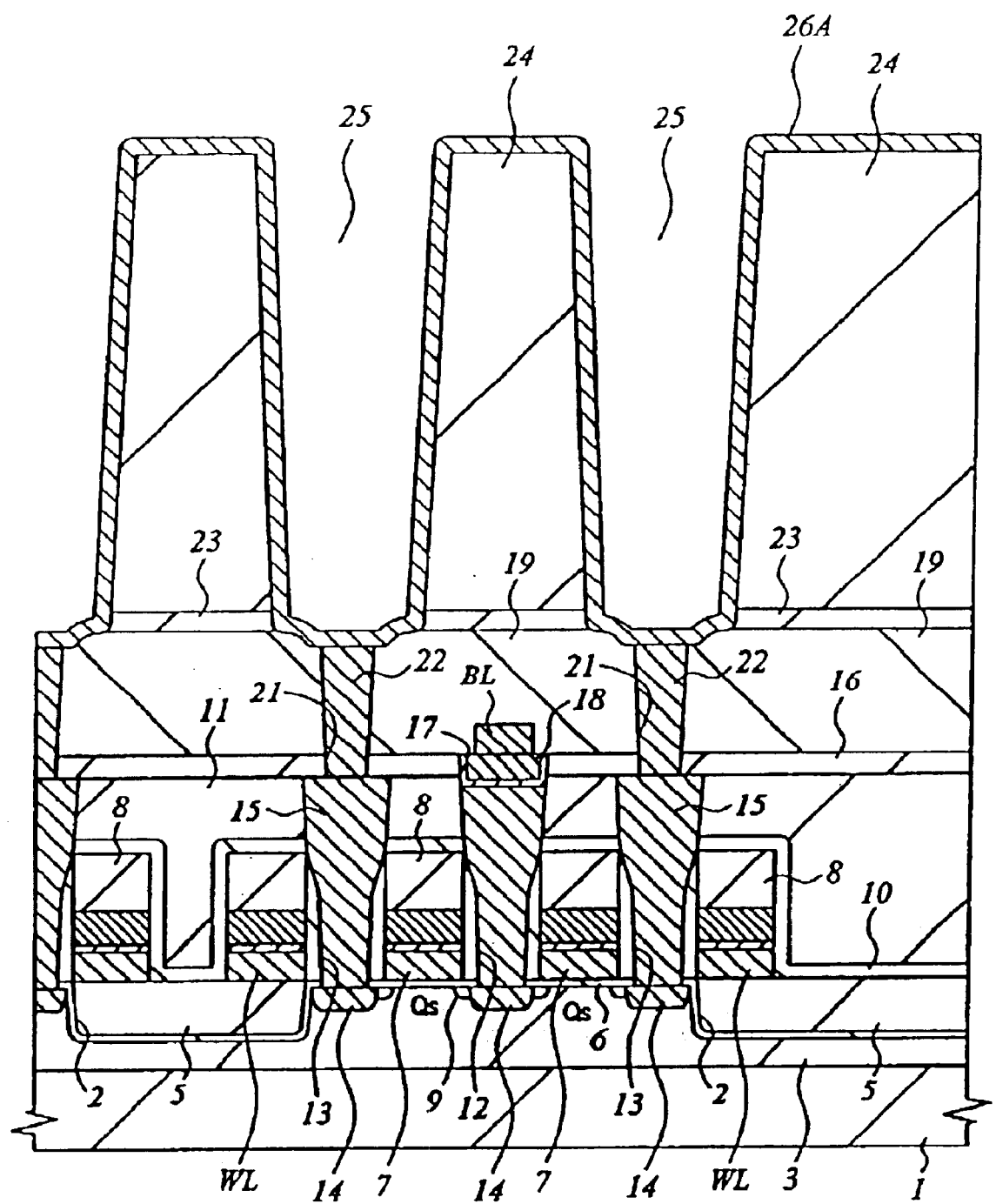
FIG. 15 is a sectional view of a semiconductor substrate, showing a method of manufacturing a semiconductor integrated circuit device, i.e., Embodiment 2 of this invention.

First, as shown in FIG. 15, a silicon nitride film 23 and a thick silicon oxide film 24 are deposited above the silicon oxide film 19 that covers a bit line BL. Deep trenches 25 are made in the silicon oxide film 24 and the silicon nitride film 23. And then, an amorphous silicon film 26A is deposited in the trenches 25 and on the silicon oxide film 24. These steps of manufacturing the DRAM are identical to the steps of Embodiment 1, shown in FIGS. 1 to 6.

Figure 16:
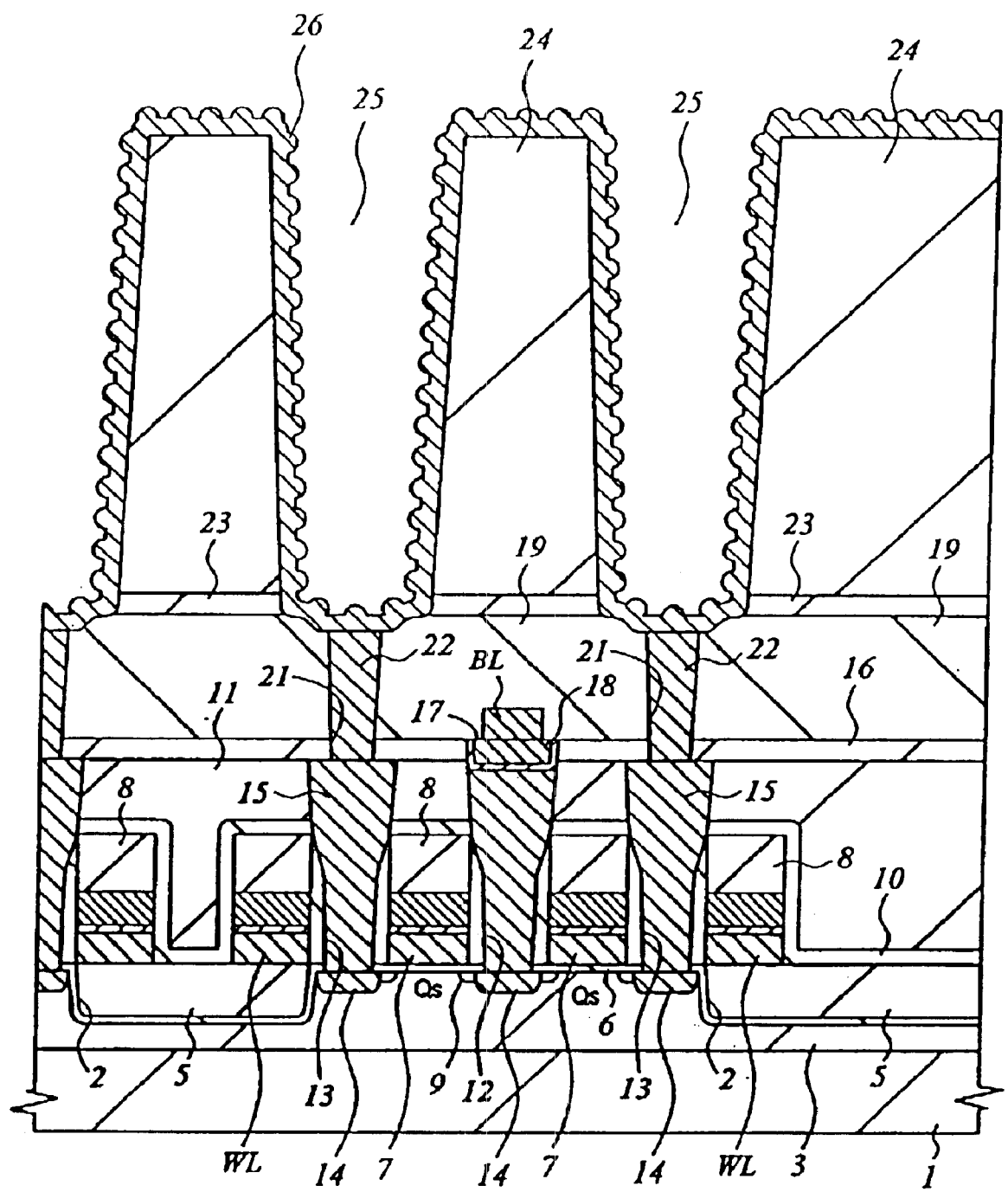
FIG. 16 is a sectional view of the semiconductor substrate, depicting the method of manufacturing a semiconductor integrated circuit device, i.e., Embodiment 2 of the present invention.

Next, as shown in FIG. 16, silicon grains are grown in the surface of the amorphous silicon film 26A. The substrate 1 is then heat-treated thus converting the amorphous silicon film 26A to a polycrystalline silicon film 26. The polycrystalline silicon film 26 has a rough surface, in the trenches 25 and at the upper surface of the silicon oxide film 24. The surface of the amorphous silicon film 26A is roughened in the same manner as in Embodiment 1.

Figure 17:
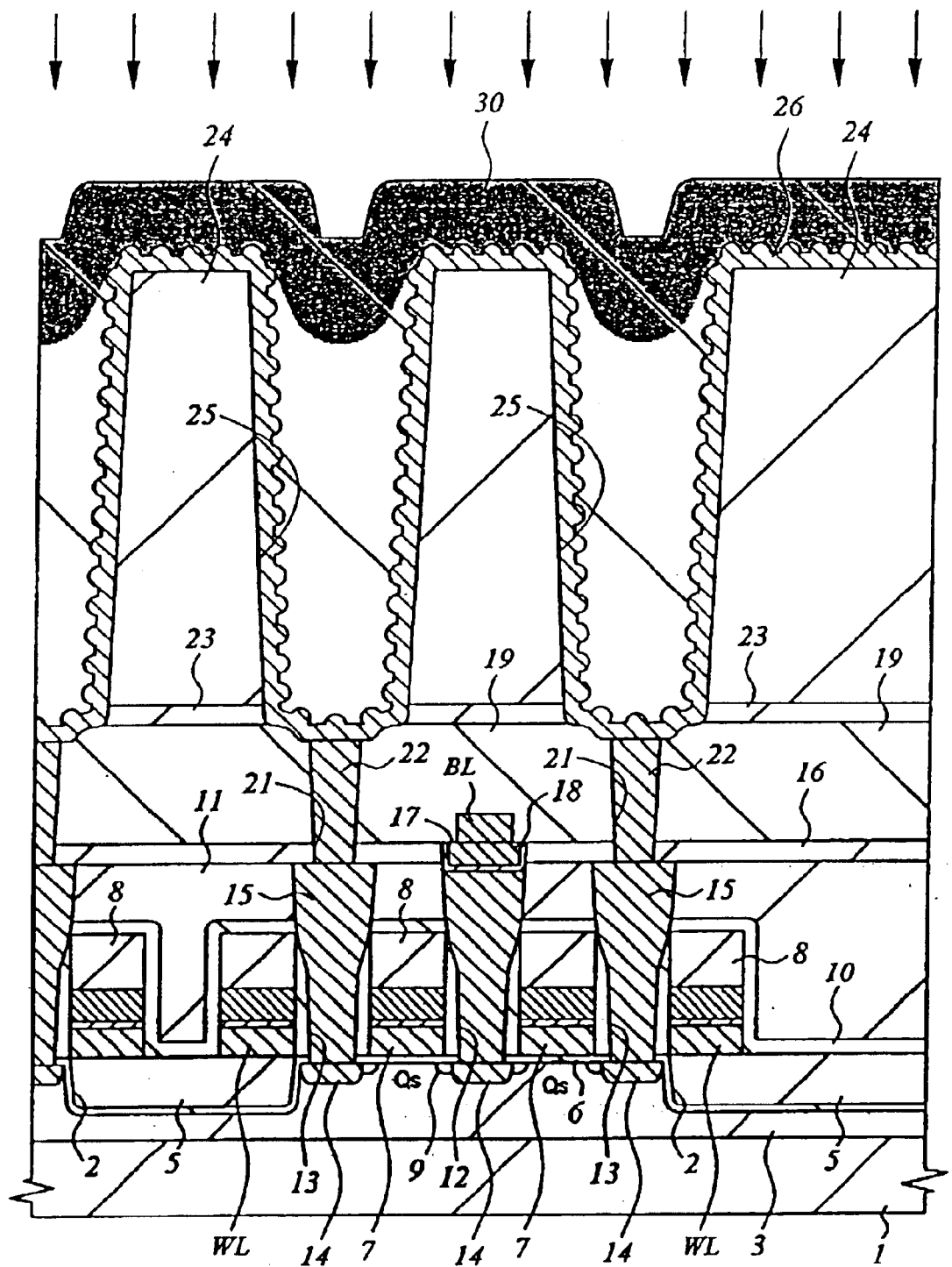
FIG. 17 is a sectional view of the semiconductor substrate, showing the method of manufacturing a semiconductor integrated circuit device, i.e., Embodiment 2 of the invention.
Figure 18:
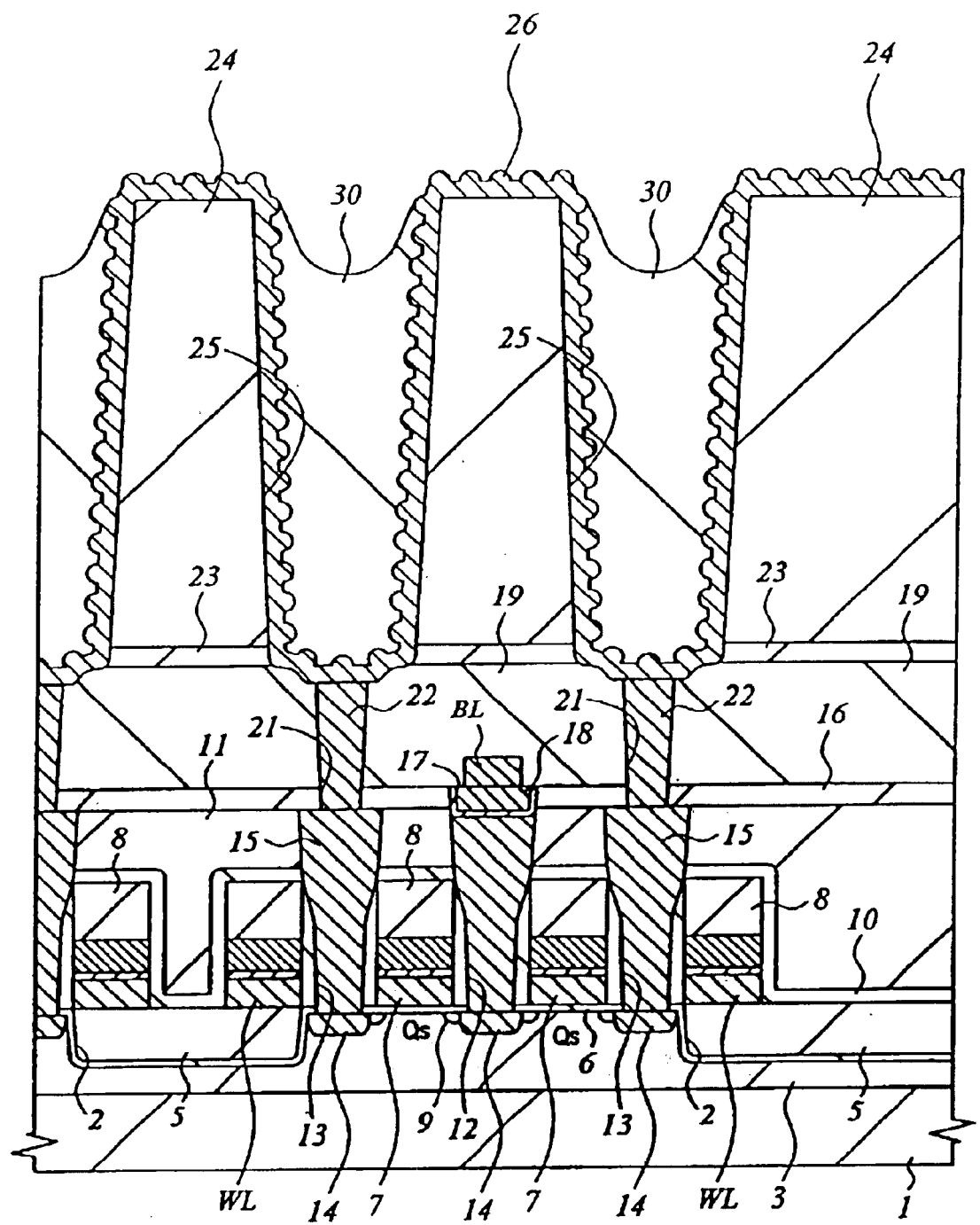
FIG. 18 is a sectional view of the semiconductor substrate, showing the method of manufacturing a semiconductor integrated circuit device, i.e., Embodiment 2 of the invention.

As shown in FIG. 17, a positive-type photoresist film 30 is formed on the polycrystalline silicon film 26 by means of spin-coating. Exposure light is applied to the entire photoresist film 30. As shown in FIG. 18, the photoresist film 30 is developed. Those parts of the film 30 that have been exposed to light are removed. The other parts of the film 30, which have not been exposed to light, remain in the trenches 25.

Figure 19:
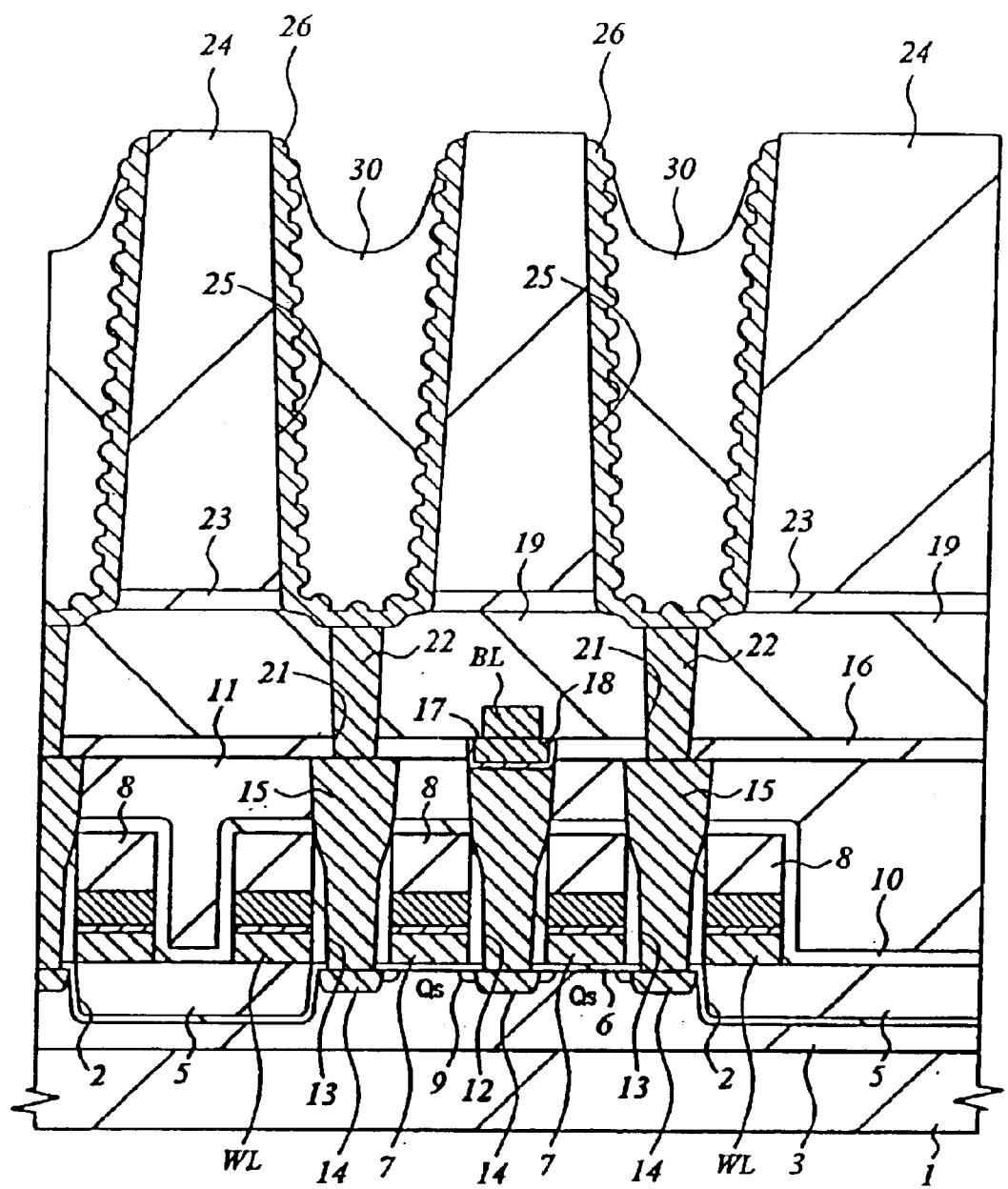
FIG. 19 is a sectional view of the semiconductor substrate, illustrating the method of manufacturing a semiconductor integrated circuit device, i.e., Embodiment 2 of this invention.

Then, as shown in FIG. 19, those parts of the polycrystalline silicon film 26, which are not covered with the photoresist film 30 and present near the upper edges of the trenches 25, are removed by means of dry etching. The polycrystalline silicon film 26 is etched at a rate much higher than the rate at which the photoresist film 30 may be etched, as the amorphous silicon film 26A is etched in Embodiment 1. This prevents the amorphous silicon film 26A, which is covered with the photoresist film 30, from being exposed and etched. It is desired that the amorphous silicon film 26 is subjected to anisotropic etching, such that the upper edges of the amorphous Silicon films 26 near the Upper edges of the trenches 25 recede downwards a little from-the rims of the trenches 25.

The etching of the polycrystalline silicon film 26, whose surface has been roughened, proceeds along the surface of the film 26. Hence, the parts of the film 26, which are on the rims of the trenches 25, may remain not etched. These parts of the film 26, if not etched, will cause short-circuiting between the lower electrodes formed in the trenches 25. The polycrystalline silicon film 26 must, therefore, be etched in such conditions that no parts of the film 26 remain on the upper rims of the trenches 25.

Figure 20:
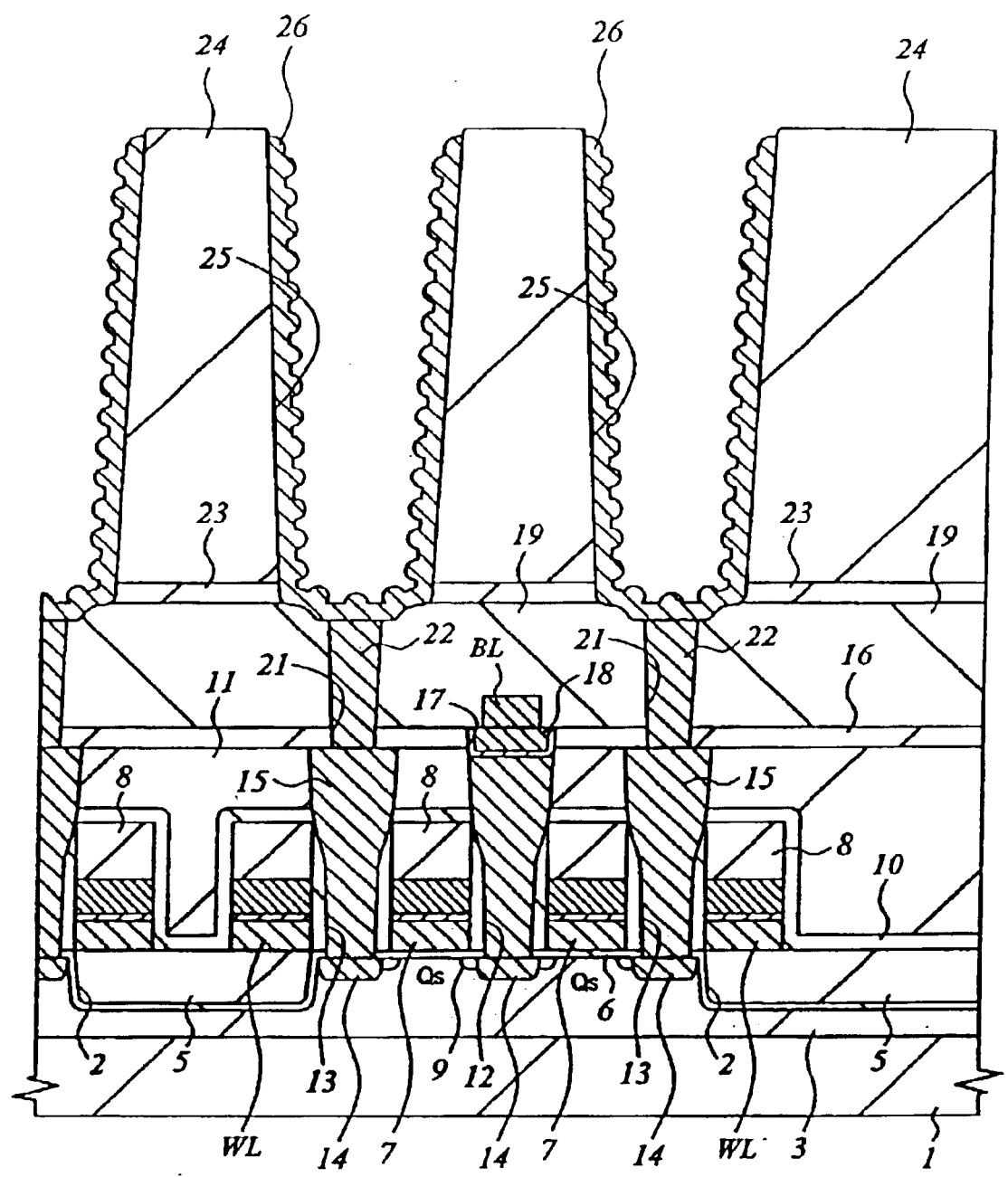
FIG. 20 is a sectional view of the semiconductor substrate, showing the method of manufacturing a semiconductor integrated circuit device, i.e., Embodiment 2 of the present invention.

Next, as shown in FIG. 20, the photoresist film 30 is removed from the trenches 25 by means of, for example, the above-mentioned ozone ashing. The polycrystalline silicon films 26 provided in the trenches 25 are thereby exposed. If photoresist remains among the silicon grains in the surface of each polycrystalline silicon film 26, it will decrease the charges the data-storing capacitive element C can accumulate. Therefore, the photoresist film 30 must be completely and thoroughly in specific ashing conditions.

Figure 21:
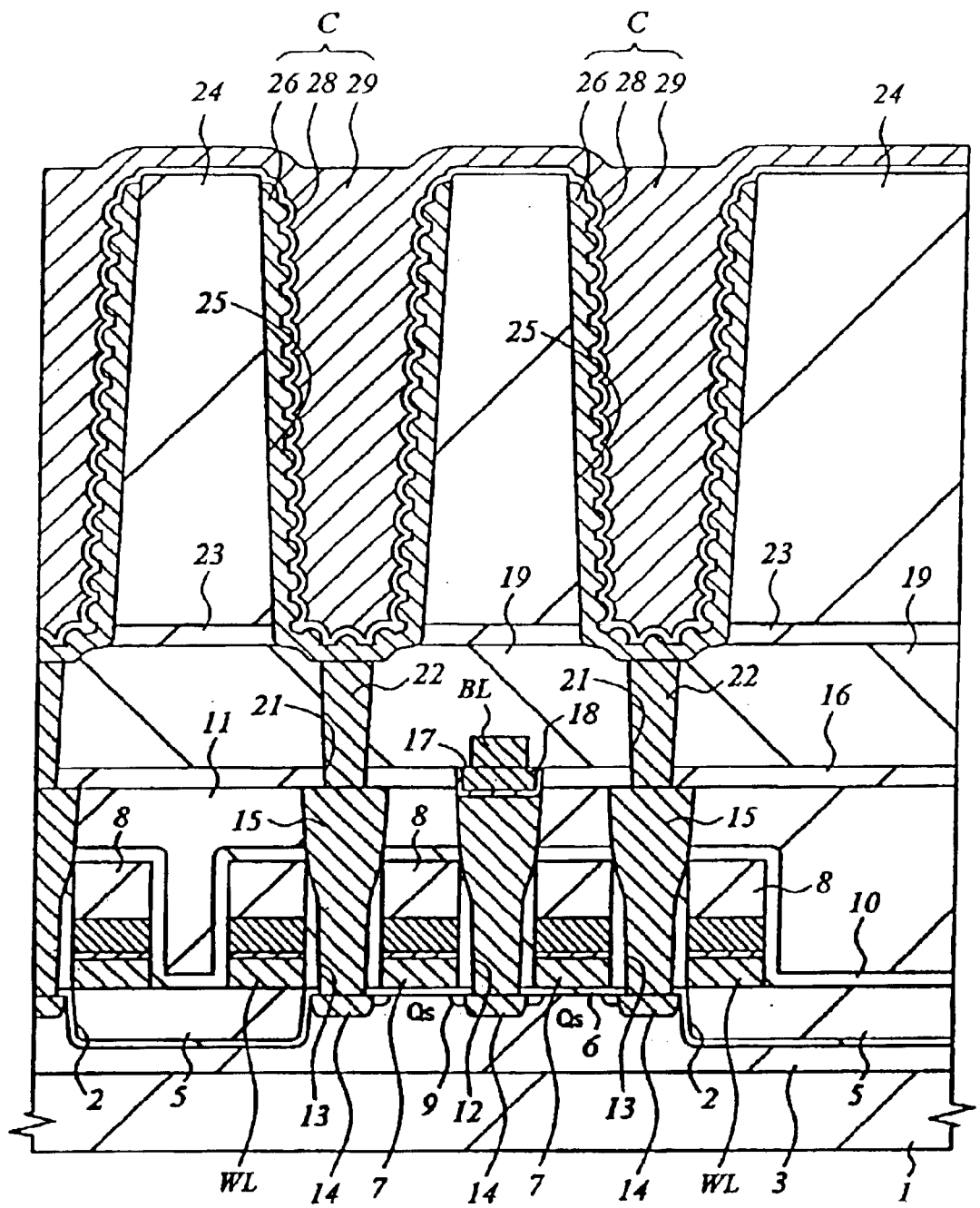
FIG. 21 is a sectional view of the semiconductor substrate, illustrating the method of manufacturing a semiconductor integrated circuit device, i.e., Embodiment 2 of the invention.

As shown in FIG. 21, a tantalum oxide film 28 is deposited on the silicon oxide film 24 and on the polycrystalline silicon films 26 provided in the trenches 25. Heat treatment is then effected, thereby changing and crystallizing the tantalum oxide film 28. A titanium nitride film 29 is deposited on the tantalum oxide film 28. As a result, data-storing capacitive elements C are formed. Each capacitive element C comprises a lower electrode made of the polycrystalline silicon film 26, a capacitance insulating film made of the oxide tantalum film 28, and an upper electrode made of the titanium nitride film 29. The tantalum Oxide film 28 and the titanium nitride film 29 are formed in the Same way as in Embodiment 1.

In Embodiment 2, the photoresist film 30 protects those parts of the amorphous silicon films 26, which are provided in the trenches 25, during the dry etching of the other parts of the amorphous silicon films 26 that are outside the trenches 25. Thereafter, the photoresist film 30, which is no longer necessary, is removed by means of ashing. With this method it is possible to minimize the etching of the other parts of the films 26 which exist in the trenches 25, in the course of removing those parts of the amorphous silicon films 26 which are outside the trenches 25. This is because the amorphous silicon film 26 is etched at a rate higher than the rate at which the photoresist film 30 may be etched.

Since the photoresist film 30 is removed from the trenches 25 by means of ashing, it is also possible to minimize the etching of those parts of the silicon oxide film 24 provided outside the trenches 25.

(Embodiment 3)

A method of forming plugs, which is Embodiment 3 of this invention, will be explained, by describing the sequence of manufacturing steps, with reference to FIGS. 22 to 33.

Figure 22:
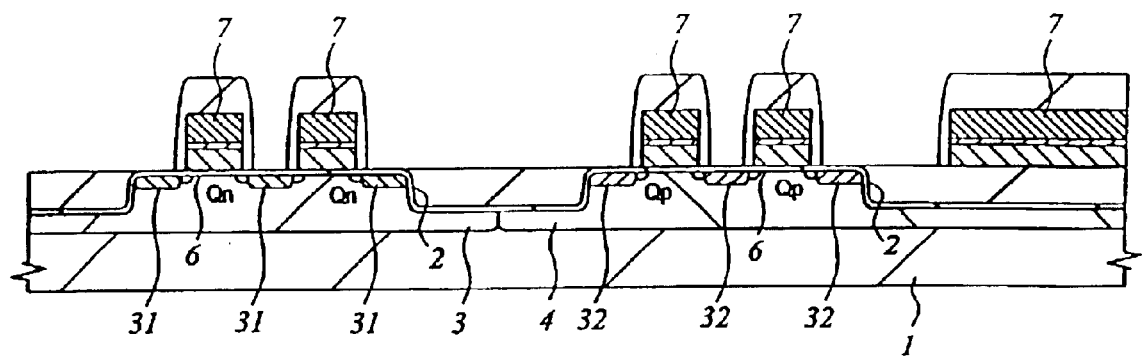
FIG. 22 is a sectional view of a semi-conductor substrate, showing the method of manufacturing a semiconductor integrated circuit device, i.e., Embodiment 3 of the present invention.

First, as shown in FIG. 22, element-isolating trenches 2 are made in the major surface of a semiconductor substrate 1 that is made of, for example, p-type single crystal silicon. Thereafter, p-type impurities (boron (B)) are ion-implanted into one part of the substrate 1, thereby forming a p-type well 3 in the major surface of the substrate 1. Further, n-type impurities (phosphorus or arsenic) are ion-implanted into another part of the substrate 1, thereby forming an n-type well 4.

Next, the CMOS process known in the art is performed, thereby forming an n-channel MISFET Qn in the p-type well 3 and a p-channel MISFET Qp in the n-type well 4. The n-channel MISFET Qn comprises a gate oxide film 6, a gate electrode 7 and $n^+$-type semiconductor regions 31 (source and drain). The p-channel MISFET Qp comprises a gate oxide film 6, a gate electrode 7 and $p^+$-type semiconductor regions 32 (source and drain).

Figure 23:
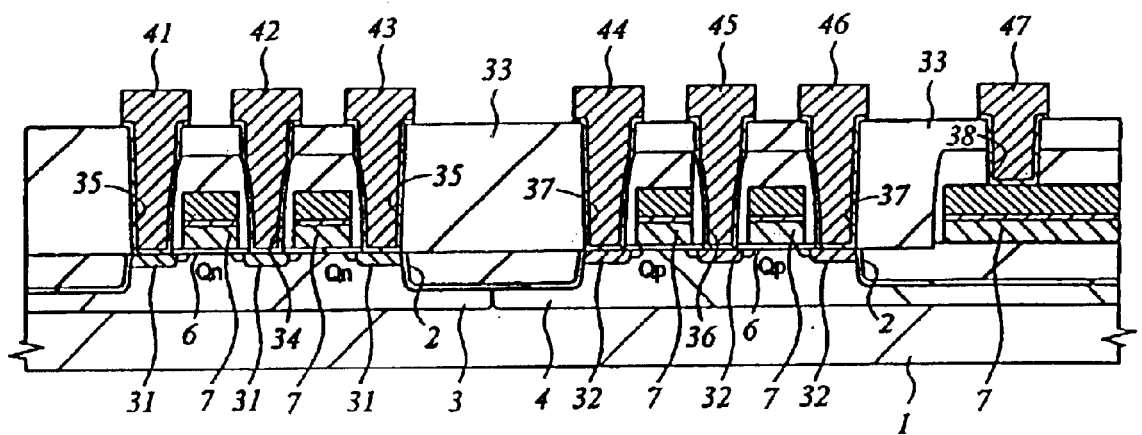
FIG. 23 is a sectional view of the semiconductor substrate, Illustrating the method of manufacturing a semiconductor integrated circuit device, i.e., Embodiment 3 of the present Invention.

As shown in FIG. 23, a silicon oxide film 33 is deposited by CVD on the n-channel MISFET Qn and the p-channel MISFET Qp. And then, the silicon oxide film 33 is subjected to chemical mechanical polishing to obtain a flat upper surface. The silicon oxide film 33 is then subjected to dry etching using a photoresist film (not shown) as a mask. As a result, contact holes 34 and 35 are made, respectively, which expose the $n^+$-type semiconductor regions 31, and contact holes 36 and 37 are made, respectively, which expose the $p^+$-type semiconductor regions 32. At the same time, a contact hole 38 is made, which exposes the gate electrode 7.

Then, first-layer wires 41 to 47 are formed above the silicon oxide film 33. More specifically, the wires 41 to 47 are formed in the following way. First, a titanium nitride film is deposited in the contact holes 34 to 38 and on the silicon oxide film 33 by means of either sputtering or CVD. A tungsten film is deposited on the titanium nitride film by means of CVD. Thereafter, dry etching using a photoresist film as a mask is carried out, thereby patterning both the tungsten film and the titanium nitride film.

Plugs may be formed in the contact holes 34 to 38. In this case, a titanium nitride film is deposited in the contact holes 34 to 38 and on the silicon oxide film 33 by either sputtering or CVD. A tungsten film is then deposited on the titanium nitride film by means of CVD. Those parts of the tungsten film and the titanium nitride film, which are provided on the silicon oxide film 33, are removed by chemical mechanical polishing. Plugs are thereby formed in the contact holes 34 to 38. Next, a tungsten film is formed on the silicon oxide film 33 by sputtering. Dry etching using a photoresist film as a mask is performed, thereby patterning the tungsten film. As a result, first-layer wires 41 to 47 are formed.

Figure 24:
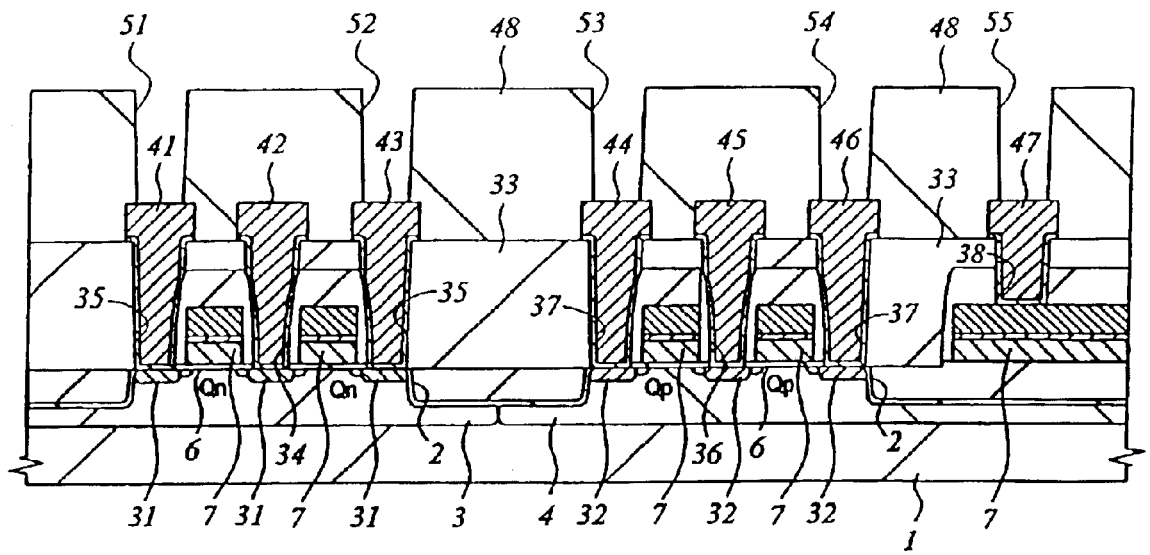
FIG. 24 is a sectional view of the semiconductor substrate, depicting the method of manufacturing a semiconductor integrated circuit device, i.e., Embodiment 3 of this invention.

Next, as shown in FIG. 24, a silicon oxide film 48 is deposited on the silicon oxide film 33 by means of CVD. The silicon oxide film 48 is subjected to chemical mechanical polishing thus attaining a flat upper surface. Dry etching using a photoresist film (not shown) as a mask is conducted on the silicon oxide film 48. Through holes 51 to 55 are thereby made above the first-layer wires 41, 43, 44, 46 and 47, respectively.

Figure 25:
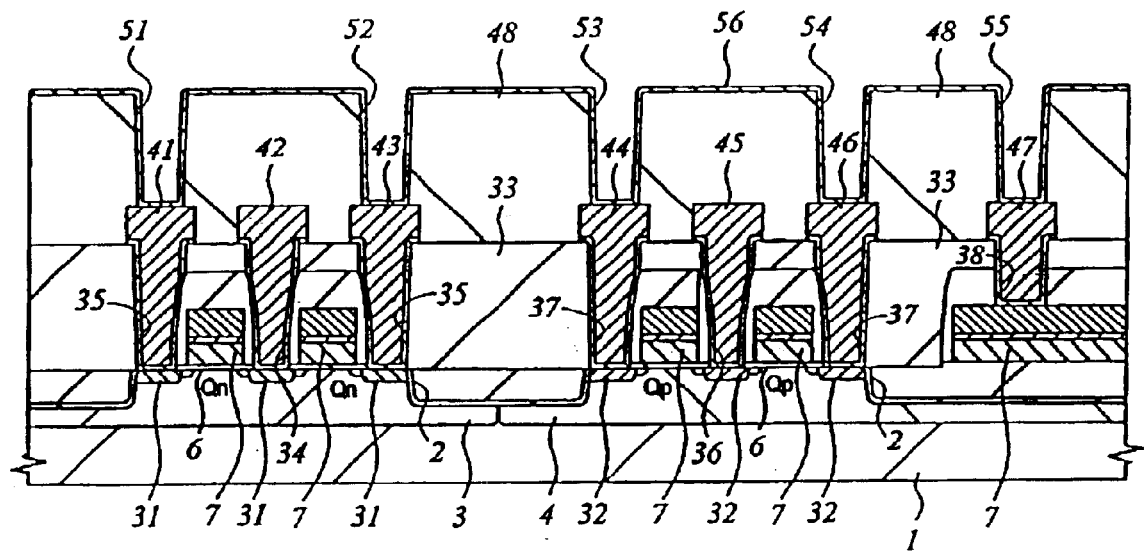
FIG. 25 is a sectional view of the semiconductor substrate, showing the method of manufacturing a semiconductor Integrated circuit device, i.e., Embodiment 3 of the invention.

As shown in FIG. 25, a barrier metal film 56 is formed in the through holes 51 to 55 and on the silicon oxide film 48. The barrier metal film 56 is an adhesion layer to increase the adhesion between the plugs to be formed in the holes 51 to 55 and the silicon oxide film 48. The film 56 is, for example, a titanium nitride film deposited by sputtering or CVD.

Figure 26:
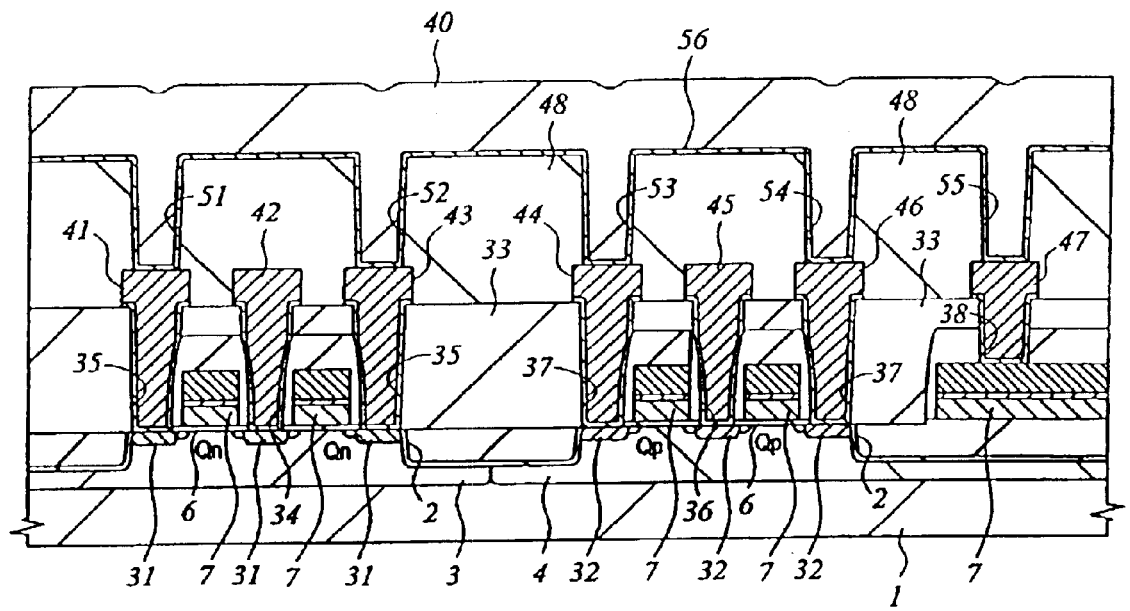
FIG. 26 is a sectional view of the semiconductor substrate, illustrating the method of manufacturing a semiconductor integrated circuit device, i.e., Embodiment 3 of this invention.
Figure 27:
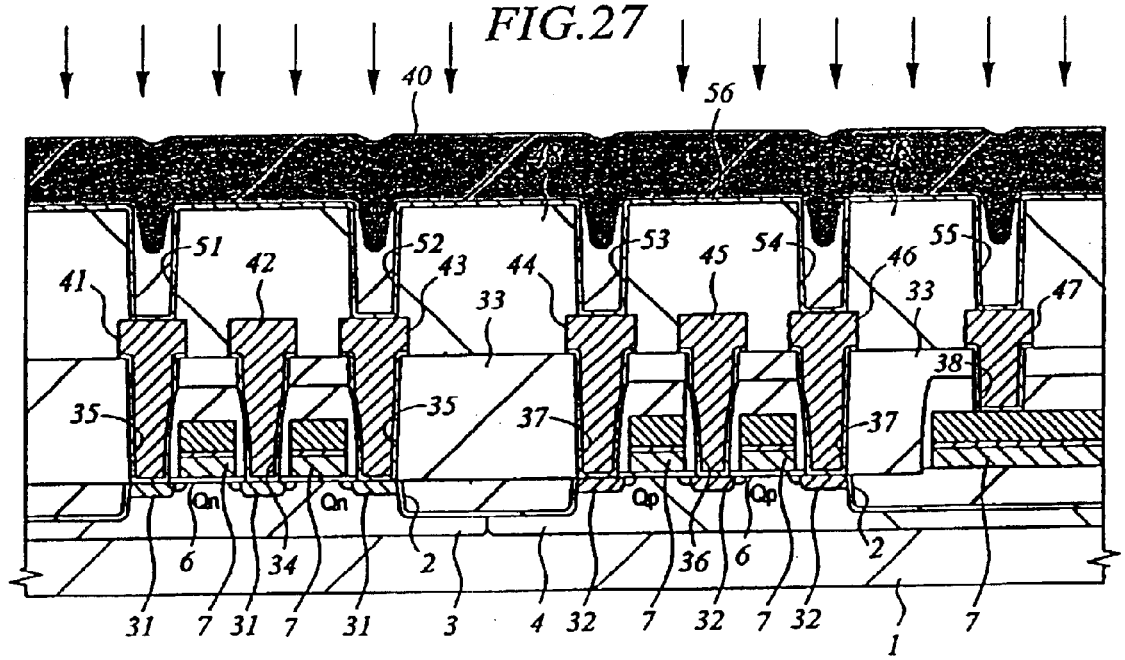
FIG. 27 is a sectional view of the semiconductor substrate, illustrating the method of manufacturing a semiconductor integrated circuit device, i.e., Embodiment 3 of the invention.

As shown in FIG. 26, a positive-type photoresist film 40 is formed on the barrier metal film 56 by means of spin-coating. Exposure light is applied to the entire photoresist film 40 as is illustrated in FIG. 27. At this time, those parts of the photoresist film 40, which exist outside the through holes 51 to 55 and near the rims thereof, are exposed to light. By contrast, the other parts provided deep in through holes 51 to 55 are not thoroughly exposed to light.

Figure 28:
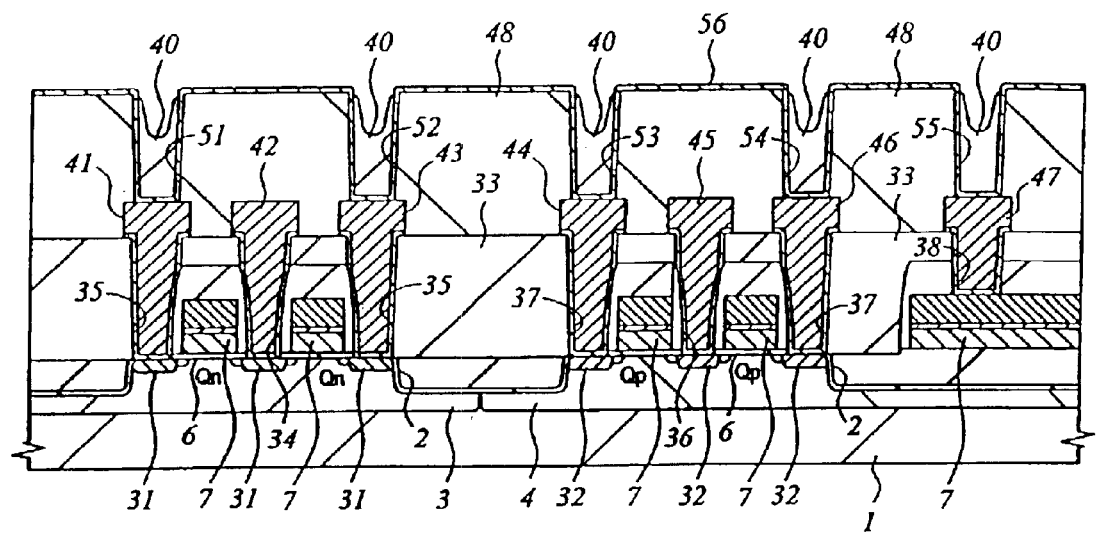
FIG. 28 Is a sectional view of the semiconductor substrate, showing the method of manufacturing a semiconductor integrated circuit device, i.e., Embodiment 3 of the invention.
Figure 29:
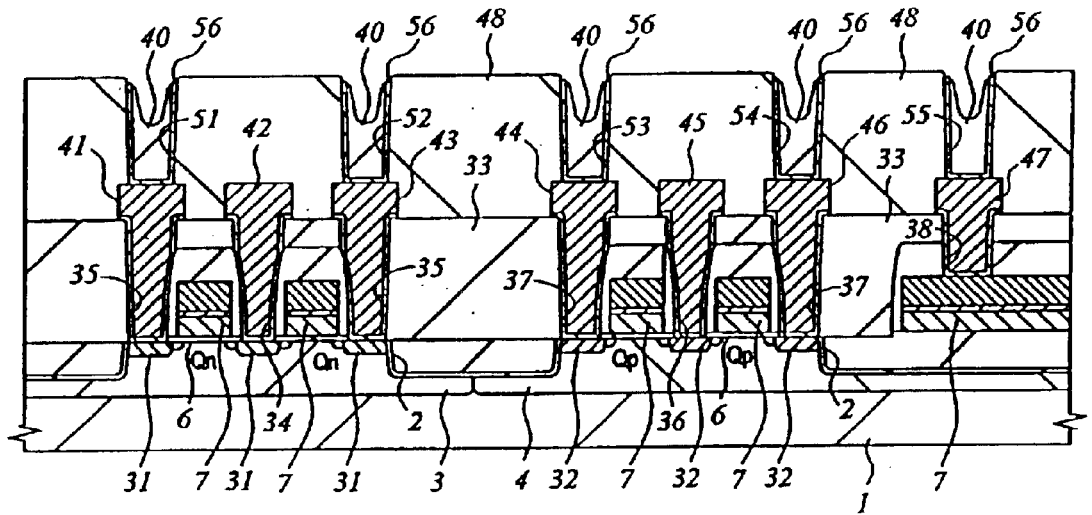
FIG. 29 is a sectional view of the semiconductor substrate, depicting the method of manufacturing a semiconductor integrated circuit device, i.e., Embodiment 3 of the present invention.

Thereafter, as shown in FIG. 28, the photoresist film 40 is developed, whereby those parts of the film 40, which have been exposed to light, are removed. The other parts of the film 40 remain in the through holes 51 to 55. Thereafter, as shown in FIG. 29, those parts of the barrier metal film 56, which lie outside the through holes 51 to 55, are removed by means of dry etching. The other parts of the barrier metal film 56 remain in the through holes 51 to 55, because they are covered with the photoresist film 40. The barrier metal film 56 is etched at a rate much higher than the rate at which the photoresist film 40 is etched. This prevents those parts of the film 56, which are covered with the photoresist films 30 provided in the holes 51 to 55, from being exposed and etched away.

Figure 30:
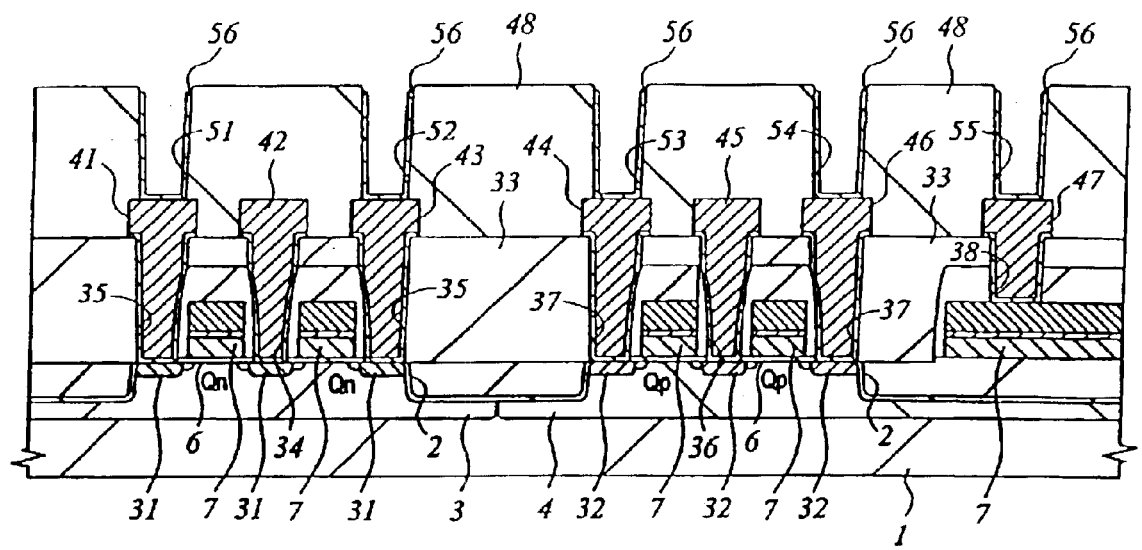
FIG. 30 is a sectional view of the semiconductor substrate, showing the method of manufacturing a semiconductor Integrated circuit device, i.e., Embodiment 3 of the invention.
Figure 31:
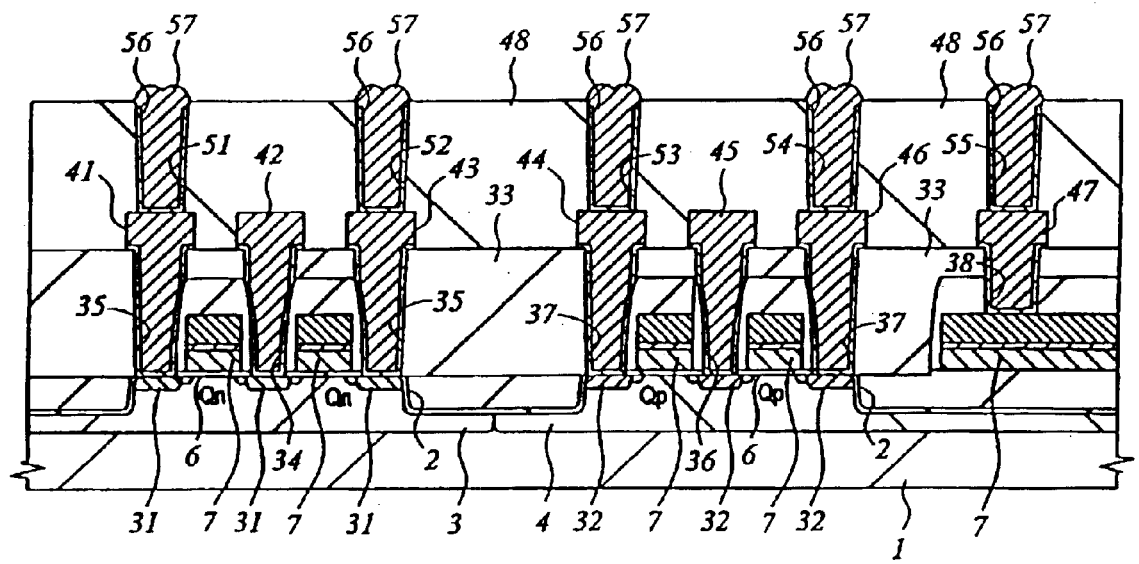
FIG. 31 is a sectional view of the semiconductor substrate, illustrating the method of manufacturing a semiconductor integrated circuit device, i.e., Embodiment 3 of this invention.

Then, as shown in FIG. 30, the photoresist film 30 provided in the holes, 51 to 55 are removed by means of zone, ashing or the like. As shown in FIG. 31, tungsten films 57 are grown on the barrier metal films 56 provided in the through holes 51 to 55, filling the through holes 51 to 55, by means of selective CVD or the like. The tungsten films 57 will be processed into plugs, which electrically connect the first-layer wires 41, 43, 44, 46 and 47 to the second-layer wires which are to be formed on the silicon oxide film 48 in the next manufacturing step.

Figure 32:
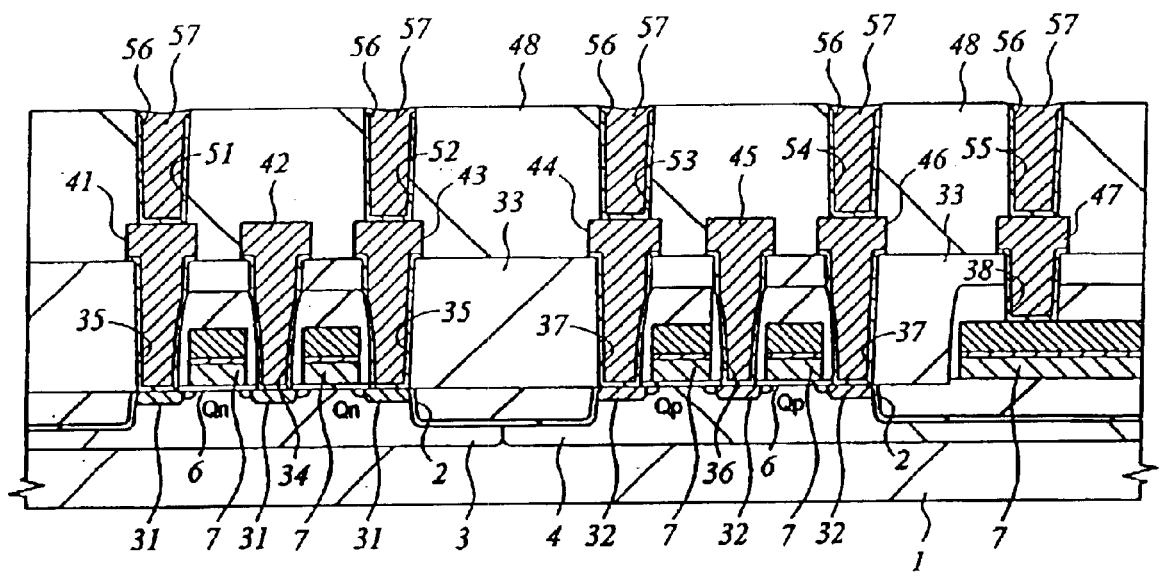
FIG. 32 is a sectional view of the semiconductor substrate, depicting the method of manufacturing a semiconductor integrated circuit device, i.e., Embodiment 3 of the invention.
Figure 33:
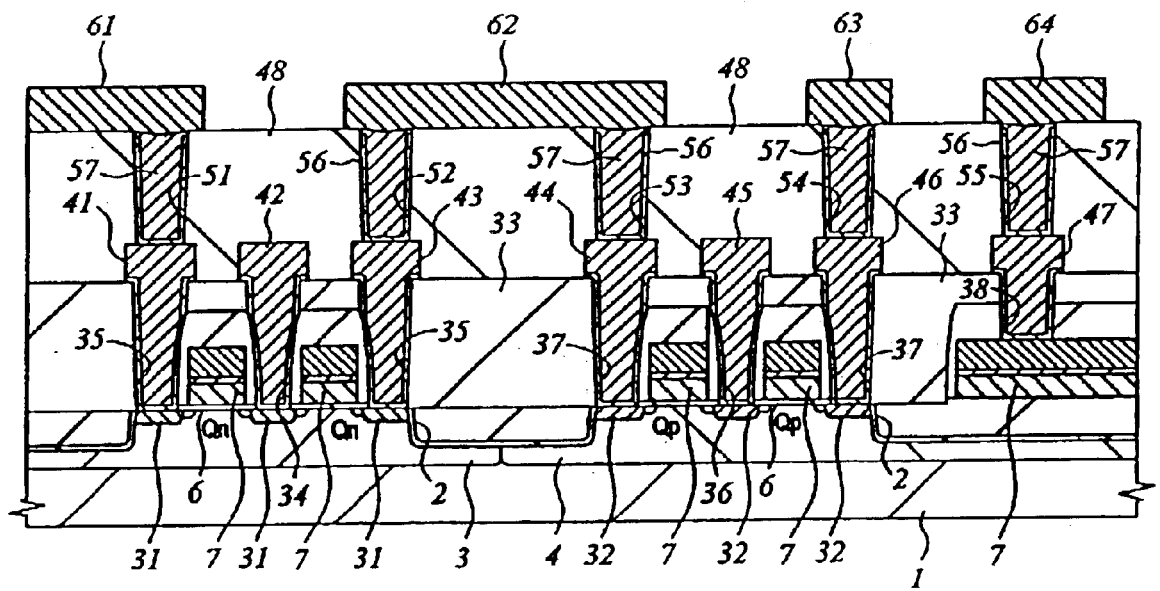
FIG. 33 is a sectional view of the semiconductor substrate, illustrating the method of manufacturing a semiconductor integrated circuit device, i.e., Embodiment 3 of the invention.

As shown in FIG. 32, the parts of the tungsten film 57 which protrude from the through holes 51 to 55 are removed by dry etching (or chemical mechanical polishing), whereby each tungsten film 57 has its upper surface at the same level as the silicon oxide film 48. Thereafter, as shown in FIG. 33, the second-layer wires 61 to 64 are formed on the silicon oxide film 48. Specifically, the tungsten film is deposited on the silicon oxide film 48 by sputtering and patterned by dry etching using a photoresist film as a mask.

(Embodiment 4)

Another method of forming plugs, which is Embodiment 4 of this invention, will be explained, by describing the sequence of manufacturing steps, with reference to FIGS. 34 to 39.

Figure 34:
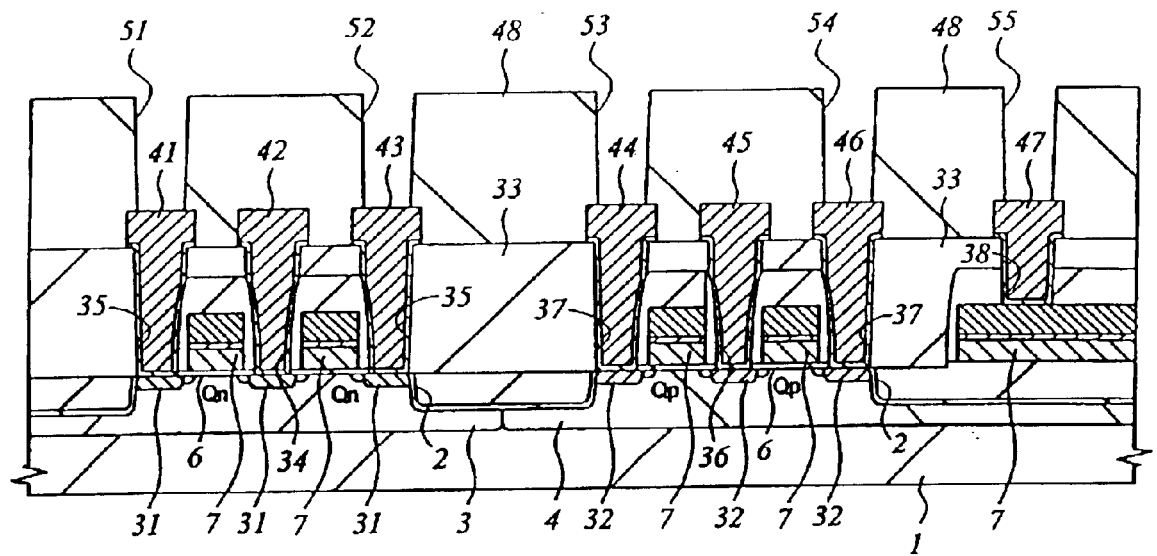
FIG. 34 is a sectional view of a semiconductor substrate, depicting a method of manufacturing a semiconductor integrated circuit device, i.e., Embodiment 4 of the present invention.

First, as shown in FIG. 34, first-layer wires 41 to 47 are formed above an n-channel MISFET Qn and a p-channel MISFET Qp in the same way as in the above Embodiment 3. Further, a silicon oxide film 48 is deposited to cover the first-layer wires 41 to 47. Thereafter, the silicon oxide film 48 is subjected to dry etching, thereby making through holes 51 to 55 in the silicon oxide film 48.

Figure 35:
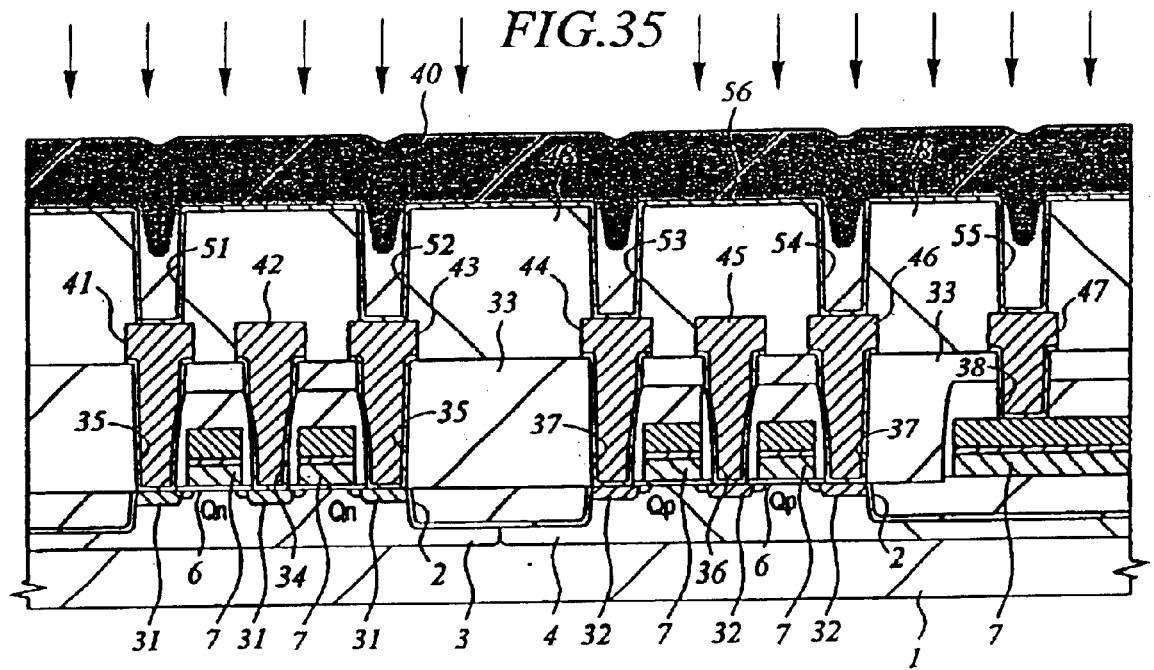
FIG. 35 is a sectional view of the semiconductor substrate, illustrating the method of manufacturing a semiconductor integrated circuit device, i.e., Embodiment 4 of the invention.

Next, as shown in FIG. 35, a barrier metal film 56 is formed in the through holes 51 to 55 and on the silicon oxide film 48. The barrier metal film 56 will be processed into adhesive layers. Thereafter, a positive-type photoresist film 40 is formed above the barrier metal film 56 by means of spin coating. At this time, those parts of the photoresist film 40, which exist outside the through holes 51 to 55 and near the rims thereof, are exposed to light. By contrast, the other parts provided deep in through holes 51 to 55 are not thoroughly exposed to light.

Figure 36:
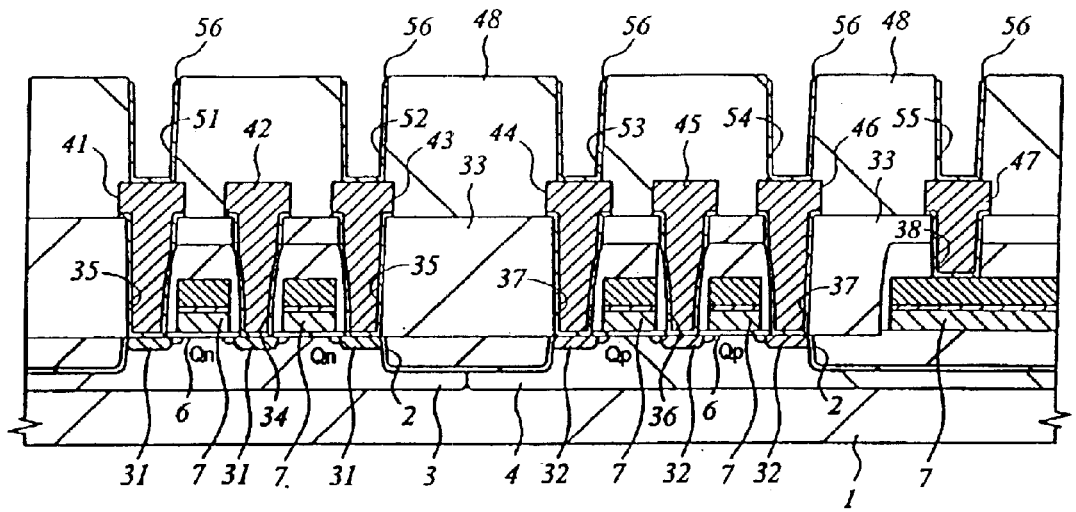
FIG. 36 is a sectional view of the semiconductor substrate, showing the method of manufacturing a semiconductor integrated circuit device, i.e., Embodiment 4 of this invention.

Further, the photoresist film 40 is developed, whereby those parts of the film 40 which have been exposed to light are removed, while leaving the other parts of the film 40 in the through holes 51 to 55. Thereafter, as shown in FIG. 36, those parts of the barrier metal film 56 which are not covered with the photoresist film 40 are removed by means of dry etching. Those parts of the photoresist film 40, which remain in the through holes 51 to 55, are removed by means of zone ashing or the like.

Figure 37:
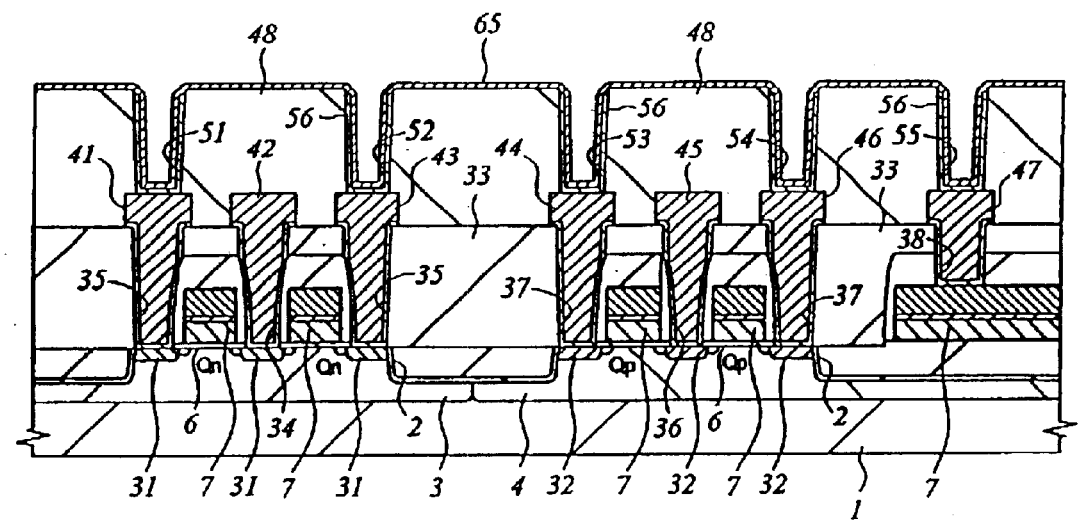
FIG. 37 is a sectional view of the semiconductor substrate, illustrating the method of manufacturing a semiconductor integrated circuit device, i.e., Embodiment 4 of the invention.

As shown in FIG. 37, a shield layer 65 is formed in the through holes 51 to 55 and on the silicon oxide film 48. The shield layer 65 is provided as an under layer for the plugs that will be formed in the through holes 51 to 55 in the next manufacturing step. It is formed by depositing copper (Cu) by, for example, sputtering.

Figure 38:
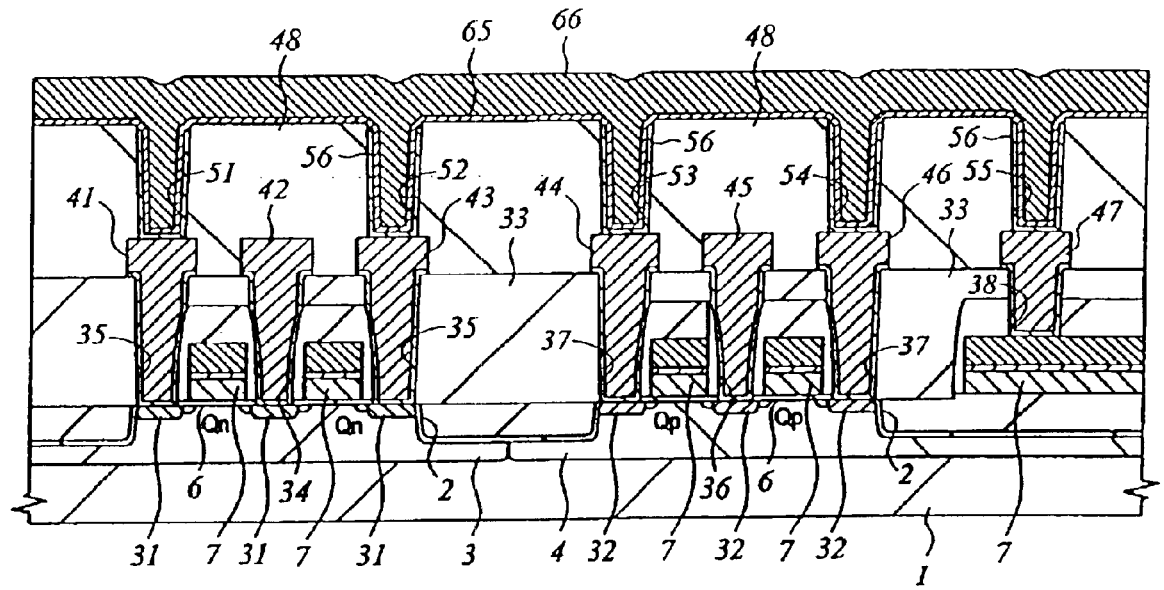
FIG. 38 is a sectional view of the semiconductor substrate, depicting the method of manufacturing a semiconductor integrated circuit device, i.e., Embodiment 4 of the present invention.
Figure 39:
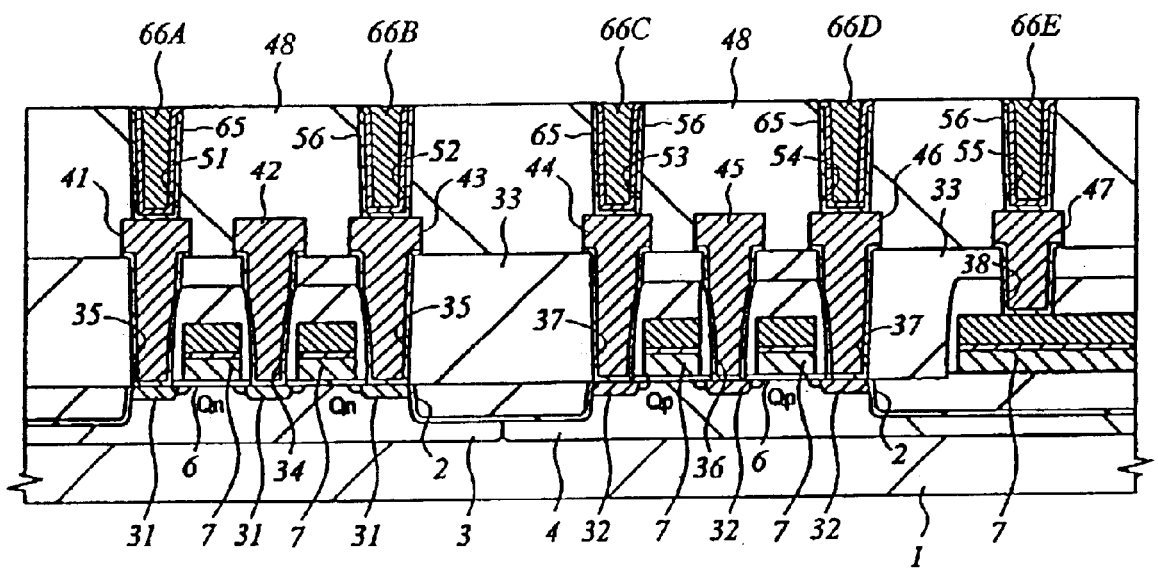
FIG. 39 is a sectional view of the semiconductor substrate, Illustrating the method of manufacturing a semiconductor integrated circuit device, i.e., Embodiment 4 of the invention.

Then, as shown in FIG. 38, a copper film 66 is deposited above the surface of the shield layer 65 by means of electroless plating or vapor deposition. Thereafter, as shown in FIG. 39, those parts of the copper film 66 and the shield layer 65, which lie outside the through holes 51 to 55, are removed by chemical mechanical polishing. Plugs 66A to 66E, each composed of a copper film 66 and a shield layer 65, are thereby formed in the through holes 51 to 55.

Copper tends to diffuse into silicon oxide films and cannot firmly adhere to silicon oxide films. Therefore, it is generally necessary to provide a barrier metal film between a copper film and a silicon oxide film, in order to form copper plugs or copper wires in the through holes made in the silicon oxide film. The barrier metal film should be, for example, a titanium nitride film, which inhibits diffusion of copper and firmly adheres to the silicon oxide film.

In forming copper plugs or copper wires by means of chemical mechanical polishing, it is therefore necessary to polish and remove the copper film or copper shield layer from those parts of the silicon oxide film which lie outside trenches or through holes. Further, it is also necessary to polish and remove the barrier metal film provided beneath the copper film or copper shield layer. Obviously, the chemical mechanical polishing is inevitably complicated.

In the method of forming copper plugs according to the present embodiment, those parts of the barrier metal film 56 which lie outside the through holes 51 to 55 are removed by dry etching before the chemical mechanical polishing is carried out. Thereafter, those parts of the copper film 66 and the shield layer 65 made of copper, too, which lie outside the through holes 51 to 55, are polished and removed. Hence, the chemical mechanical polishing is simple in the present embodiment. The barrier metal film that prevents diffusion of copper may be made of material other than titanium nitride. It can be a tantalum nitride (TaN) film, a tungsten nitride (WN) film or the like.

(Embodiment 5)

A method of forming copper wires, which is Embodiment 5 of the present invention, will be explained, by describing the sequence of manufacturing steps, with reference to FIGS. 40 to 49. In this method, copper wires are buried in dual-damascene fashion.

Figure 40:
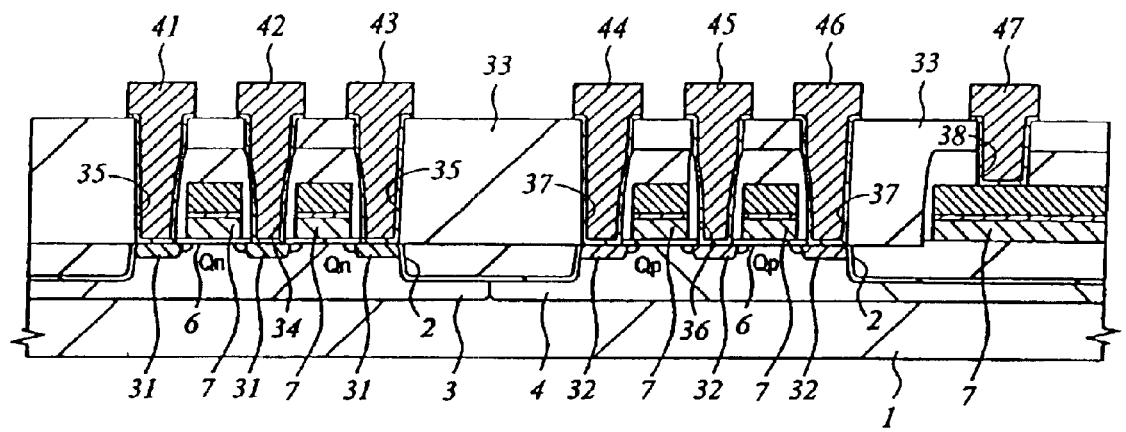
FIG. 40 is a sectional view of a semiconductor substrate, illustrating a method of manufacturing a semiconductor integrated circuit device, i.e., Embodiment 5 of the present invention.
Figure 41:
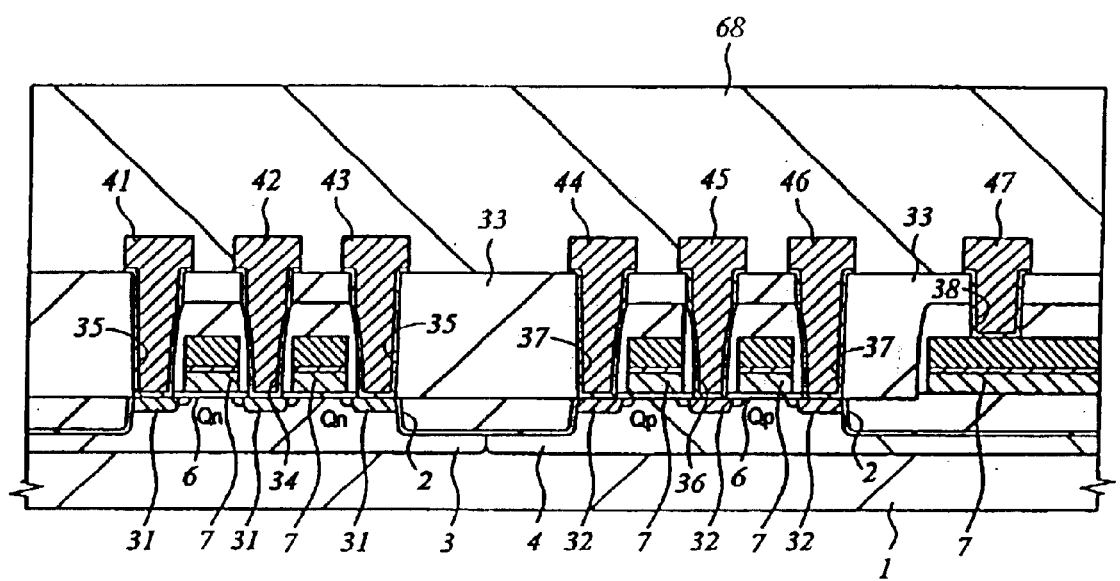
FIG. 41 is a sectional view of the semiconductor substrate, illustrating the method of manufacturing a semiconductor integrated circuit device, i.e., Embodiment 5 of the invention.

First, as shown in FIG. 40, an n-channel MISFET Qn and a p-channel MISFET Qp are made in the same way as in the above Embodiments 3 and 4. Then, first-layer wires 41 to 47 are formed above the n-channel MISFET Qn and the p-channel MISFET Qp. As shown in FIG. 41, a silicon oxide film 68 is deposited by CVD, to cover the first-layer wires 41 to 47.

Figure 42:
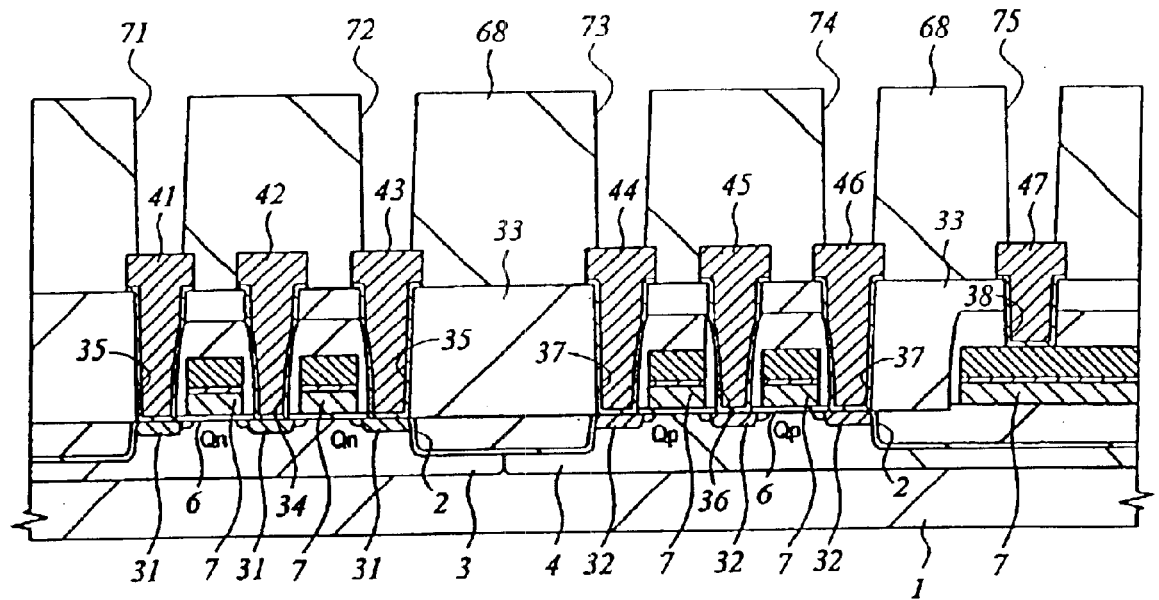
FIG. 42 is a sectional view of the semiconductor substrate, showing the method of manufacturing a semiconductor integrated circuit device, i.e., Embodiment 5 of the invention.
Figure 43:
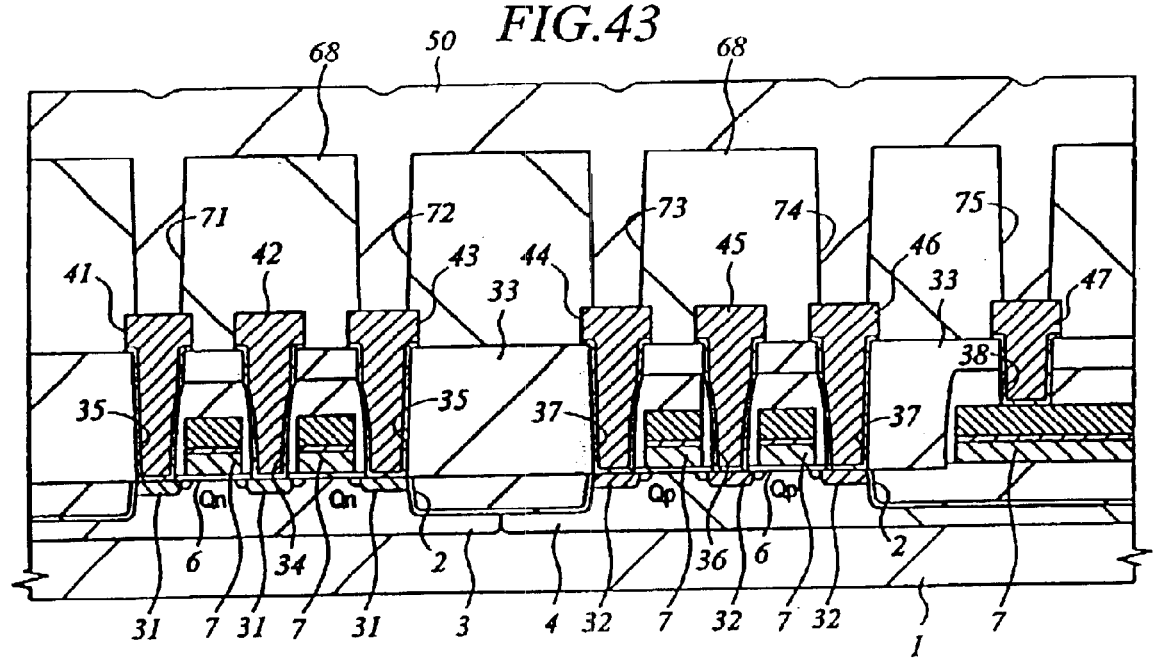
FIG. 43 is a sectional view of the semiconductor substrate, depicting the method of manufacturing a semiconductor integrated circuit device, i.e., Embodiment 5 of this invention.

Next, as shown in FIG. 42, the silicon oxide film 68 is subjected to dry etching using a photoresist film (not shown), thereby making through holes 71 to 75 in the silicon oxide film 68 above the wires 41, 43, 44, 46 and 47. Thereafter, as shown in FIG. 43, a positive-type photoresist film 50 is formed in the through holes 71 to 75 and above the silicon oxide film 68 by means of spin coating.

Figure 44:
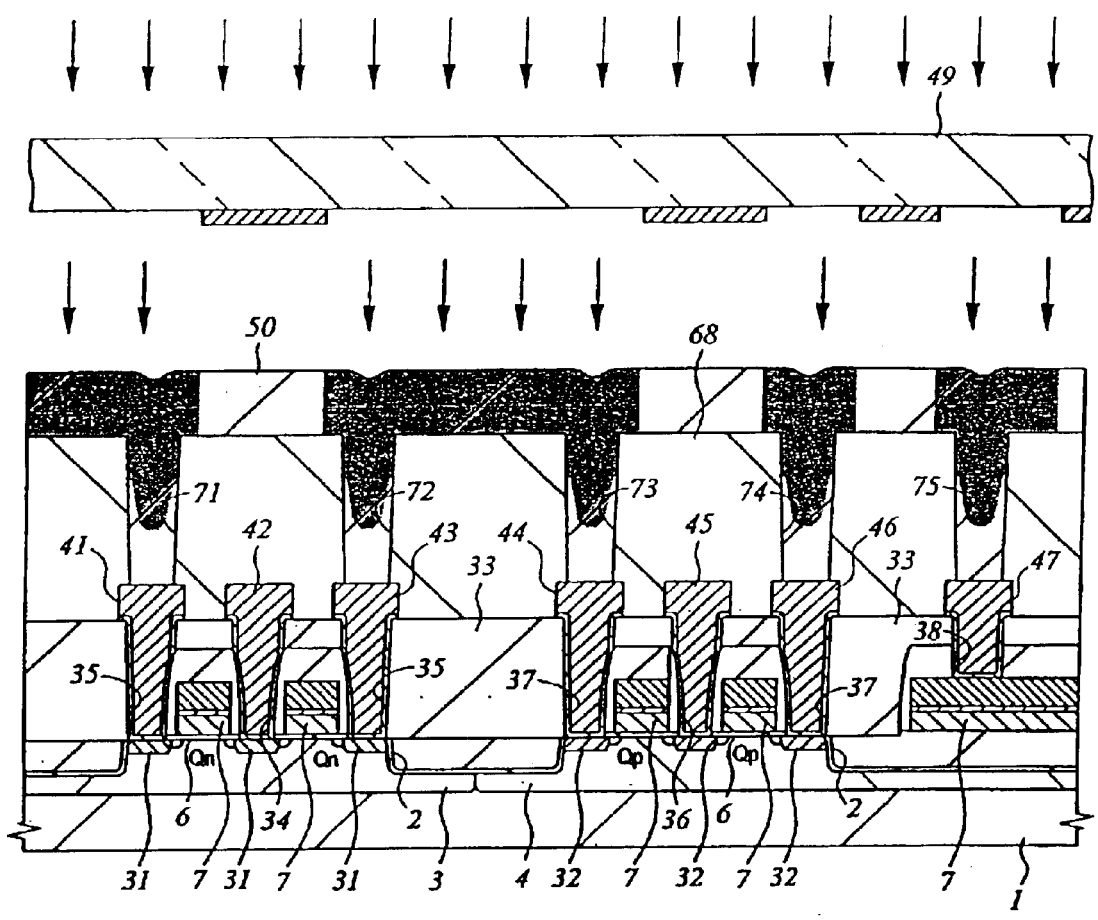
FIG. 44 is a sectional view of the semiconductor substrate, showing the method of manufacturing a semiconductor integrated circuit device, I.e., Embodiment 5 of the present invention.

As FIG. 44 shows, exposure light is applied to selected parts of the positive-type photoresist film 50, through a photomask 49. At this time, those parts of the photoresist film 50, which exist outside the through holes 71 to 75 and near the rims thereof, are exposed to light. By contrast, the other parts provided deep in through holes 71 to 75 are not thoroughly exposed to light.

Figure 45:
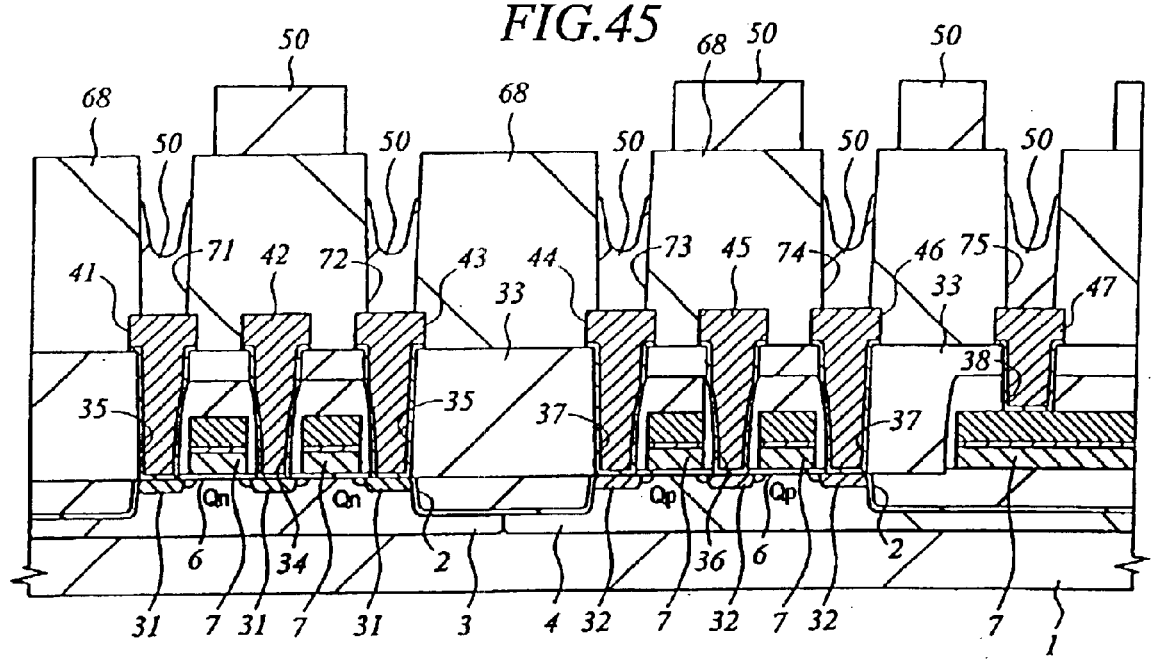
FIG. 45 is a sectional view of the semiconductor substrate, illustrating the method of manufacturing a semiconductor Integrated circuit device, i.e., Embodiment 5 of the invention.

Then, as shown in FIG. 45, the photoresist film 50 is developed, whereby those parts of the film 50 which have been exposed to light are removed, while leaving the other parts of the film 50, not exposed to light, in the through holes 71 to 75. The parts of the photoresist film 50, thus left, fill the lower halves of the through holes 70 to 75.

Figure 46:
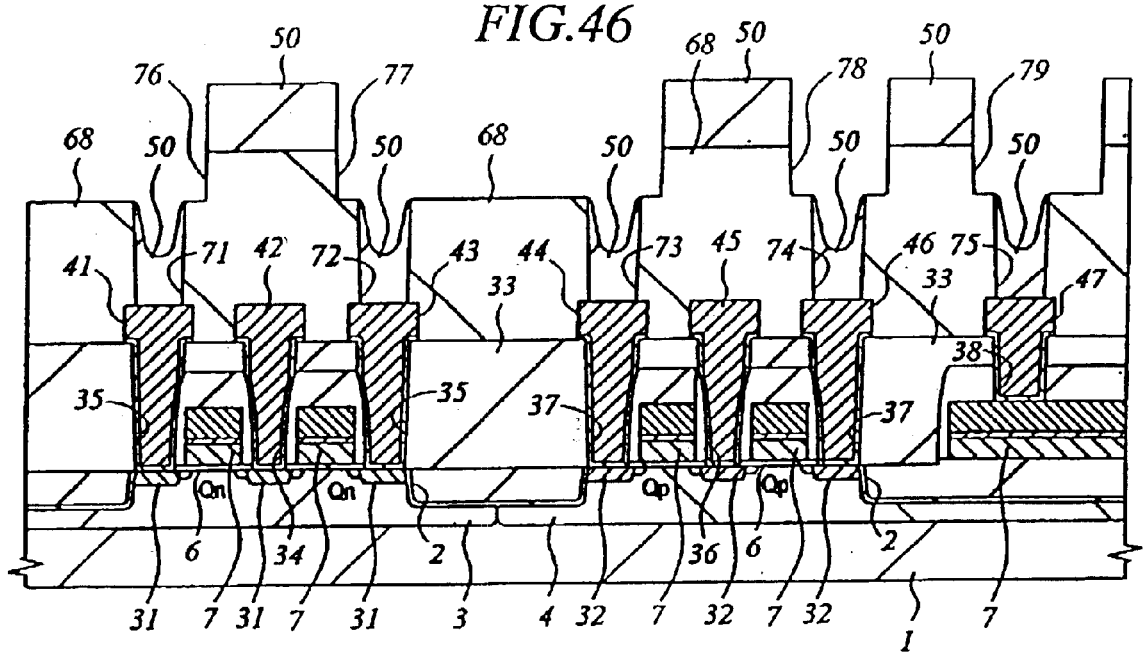
FIG. 46 is a sectional view of the semiconductor substrate, depicting the method of manufacturing a semiconductor integrated circuit device, i.e., Embodiment 5 of this invention.

As shown in FIG. 46, those parts of the silicon oxide film 68, which lie in wire-forming regions, are removed by dry etching using the photoresist film 50 as a mask. Wire trenches 76 to 79 are thereby formed in the silicon oxide film 68. The silicon oxide film 68 is etched at a rate much higher than the rate at which the photoresist film 50 may be etched. Hence, the etching of the film 68 stops at the time the photoresist film 50 in each through hole is exposed at the bottom of the wire trenches 76 to 79.

Figure 47:
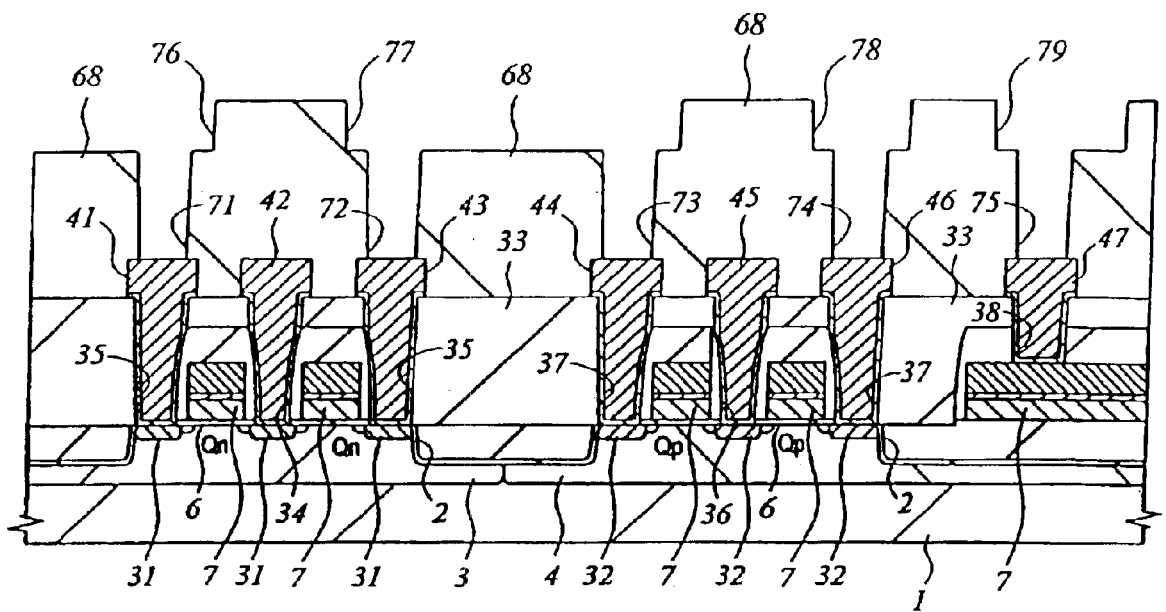
FIG. 47 is a sectional view of the semiconductor substrate, showing the method of manufacturing a semiconductor integrated circuit device, i.e.,. Embodiment 5 of this invention.
Figure 48:
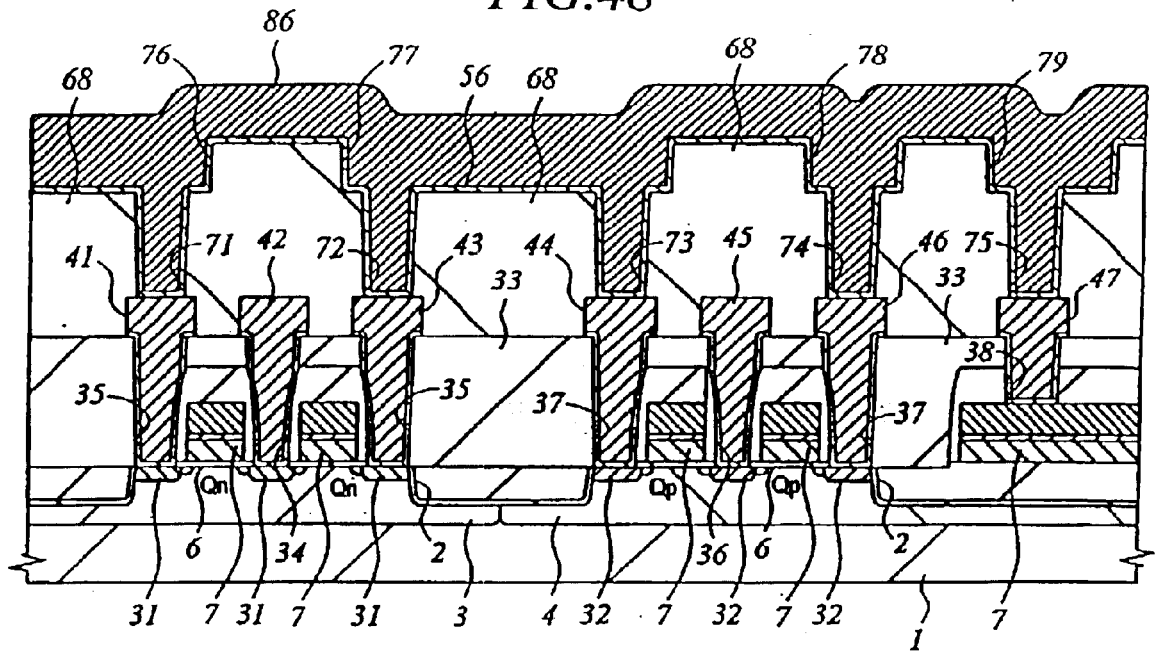
FIG. 48 Is a sectional view of the semiconductor substrate, showing the method of manufacturing a semiconductor integrated circuit device, i.e., Embodiment 5 of the invention.

As is shown in FIG. 47, the photoresist films 50 remaining in the through holes 71 to 75 are removed by means of ashing or the like. Then, as shown in FIG. 48, a barrier metal film 56, which will serve as an adhesive layer, is formed in the wire trenches 76 to 79 and in the through holes 71 to 75 located below the wire trenches 76 to 79. Thereafter, a copper film 86 is deposited above the barrier metal film 56. The barrier metal film 56 is a titanium film deposited by, for example, CVD. The copper film 86 is deposited by means of sputtering or the like.

Figure 49:
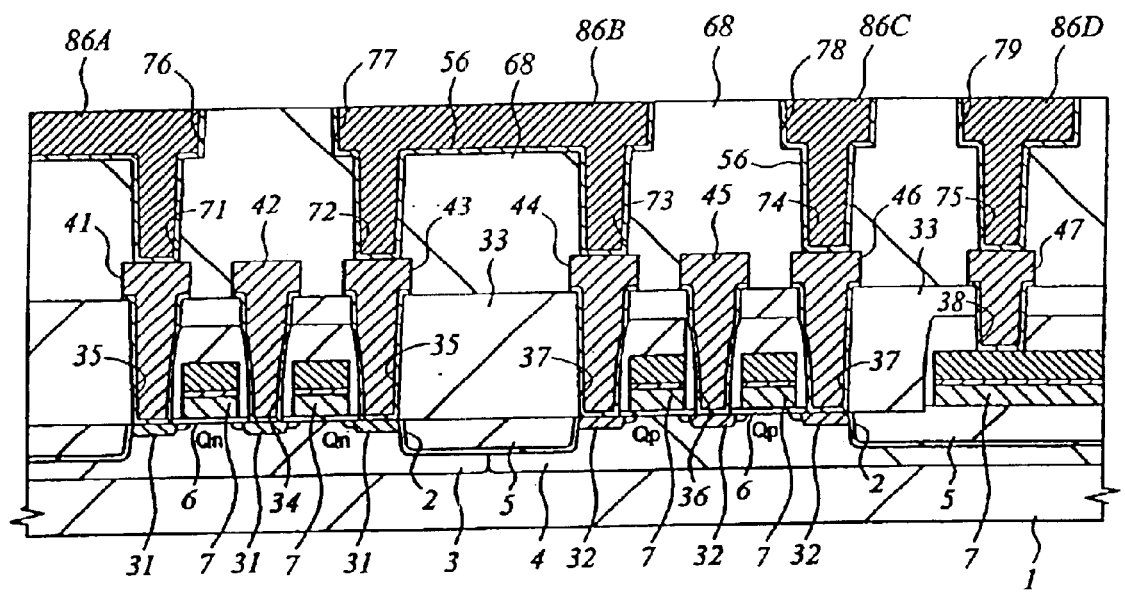
FIG. 49 is a sectional view of the semiconductor substrate, depicting the method of manufacturing a semiconductor integrated circuit device, i.e., Embodiment 5 of the invention.

Further, as shown in FIG. 49, those parts of the copper film 86 which lie outside the wire trenches 76 to 79, and those parts of the barrier metal film 56, which lie outside the trenches 76 to 79, are removed by means of chemical mechanical polishing. Buried copper wires 86A to 86D are thereby formed such that each is in one wire trench and one through hole is located below each wire trench.

In a dual-damascene process, wires trenches and through holes are made in a silicon oxide film and wires are simultaneously buried in the wire trenches and the through holes located below the trenches. To make the trenches and through the holes, an insulating film (e.g., a silicon nitride film) serving as an etching stopper is formed at the interface between the trenches and the through holes. The level where the insulating film is provided determines the depth of the wire trenches. More specifically, the trenches are made in the following way.

At first, a first silicon nitride film is formed on a silicon oxide film. Then, a second silicon oxide film is deposited on the silicon nitride film. Thereafter, dry etching is performed on the second silicon oxide film, the silicon nitride film and the second silicon oxide film, thereby making through holes in these films. Next, the second silicon oxide film is subjected to dry etching using the silicon nitride film as a mask. As a result, the wire trenches are made in the second silicon oxide film. The through holes remain in the silicon nitride film and the first silicon oxide film both of which are located below the second silicon oxide film.

The dual-damascene process is, however, complicated, because the three insulating films (i.e., the first silicon oxide film, the silicon nitride film and the second silicon oxide film) must be formed in order to form one layer of buried wires. Further, if copper wires a formed on the insulating film and one of the insulating films contains silicon nitride having a larger dielectric constant than silicon oxide film, the parasitic capacitance of the insulating films will increase.

By contrast, in the present embodiment, the wire trenches 76 to 79 are made by utilizing the photoresist films buried in the through holes 71 to 75 as etching stoppers. The through holes 71 to 75 and the wire trenches 76 to 79 are made in a single silicon oxide film 68. This shortens the time required to perform the dual-damascene process. In addition, the parasitic capacitance of the copper buried wires 86A to 86E decreases because an insulating film (i.e., silicon nitride film) with a large dielectric constant s not used as an etching stopper.

(Embodiment 6)

A method of making self-aligned contact holes, which is Embodiment 6 of the invention, will be explained, by describing the sequence of manufacturing steps, with reference to FIGS. 50 to 58.

Figure 50:
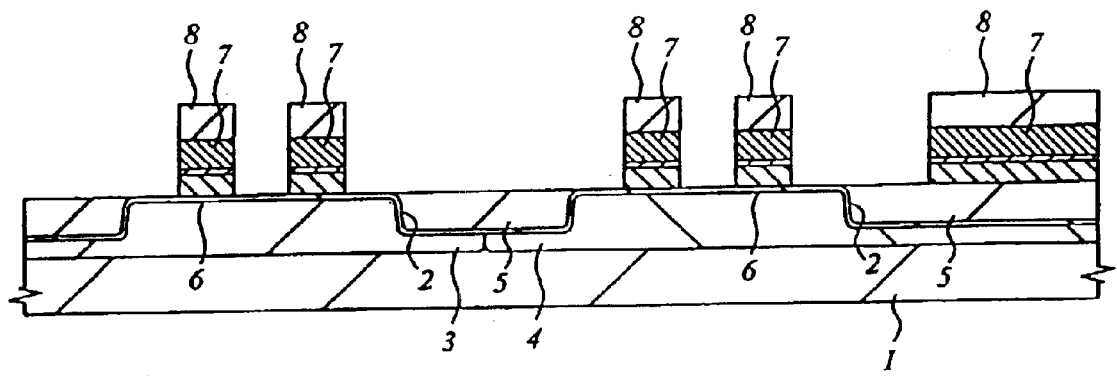
FIG. 50 is a sectional view of a semiconductor substrate, illustrating a method of manufacturing a semiconductor integrated circuit device, i.e., Embodiment 6 of the present Invention.

First, as FIG. 50 shows, a p-type well 3 and an n-type well 4 are formed in the major surface of a substrate 1. Element-isolating trenches 2 are made in the surfaces of the wells 3 and 4. A gate insulating film 6 is formed in the trenches 2 and on the wells 3 and 4. Silicon oxide films 5 are formed, to fill the trenches 2. Thereafter, gate electrodes 7 are formed in the following manner. For example, a polycrystalline silicon film doped with n-type impurities such as phosphorus is deposited on the substrate 1 by CVD. Then, a tungsten nitride film is deposited on the polycrystalline silicon film by sputtering. Further, a tungsten film is also deposited on the tungsten nitride film by sputtering. A silicon nitride film 8 is deposited on the tungsten film by means of CVD. Thereafter, the polycrystalline silicon film, the tungsten nitride film, the tungsten film and the silicon nitride film are patterned by dry etching using a photoresist film as a mask. Each silicon nitride film 8 on one gate electrode 7 is an insulating film that is required to form a contact hole (later described) in self-alignment with the gate electrode 7.

Figure 51:
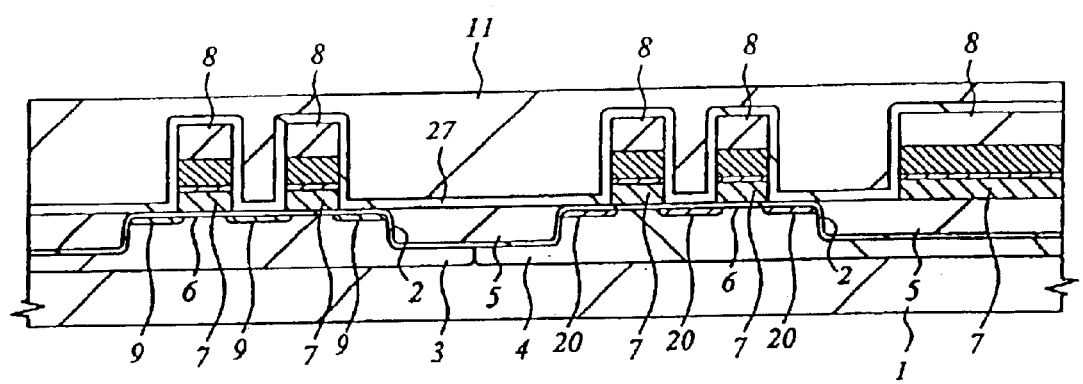
FIG. 51 is a sectional view of the semiconductor substrate, showing the method of manufacturing a semiconductor integrated circuit device, i.e., Embodiment 6 of the invention.

Next, as shown in FIG. 51, n-type impurities such as phosphorus are ion-implanted into the p-type well 3, forming n$^-$-type semiconductor regions 9. Into the n-type well region 4, p-type impurities (boron) are ion-implanted, thus forming p$^-$-type semiconductor regions 20. Then, a silicon-nitride film 27 is deposited by CVD to cover the gate electrodes 7. Further, a silicon oxide film 11 is deposited on the silicon oxide film 27. The silicon oxide film 11 is subjected to chemical mechanical polishing to attain a flat surface. The silicon nitride film 27 is an insulating film required to make contact holes (later described) in self-alignment with the element-isolating trenches 2.

In order to make contact holes in self-alignment with the gate electrodes 7 and the element-isolating trenches 2, the silicon nitride films 8 are provided on the gate electrodes 7, respectively, and the silicon nitride film 27 is provided, to close the element-isolating trenches 2. Thus, a single-layer film, i.e., the silicon nitride film 27, covers the diffusion layers (i.e., the n$^-$-type semiconductor regions 9 and the p-type semiconductor regions 20), whereas a two-layer film composed of the silicon nitride films 8 and 27 covers the gate electrodes 7.

Figure 52:
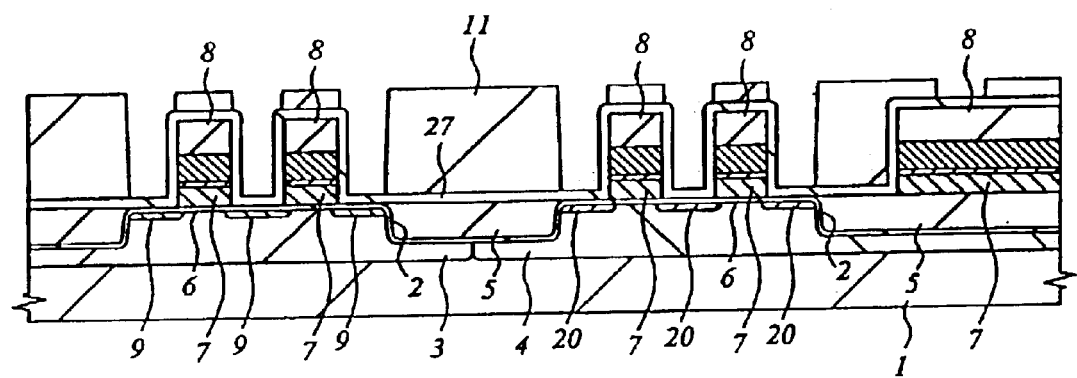
FIG. 52 is a sectional view of the semiconductor substrate, depicting the method of manufacturing a semiconductor integrated circuit device, i.e., Embodiment 6 of the invention.

As shown in FIG. 52, the silicon oxide film 11 provided above the diffusion layers (n$^-$-type semiconductor regions 9 and p$^-$-type semiconductor regions 20) is subjected to dry etching using a photoresist film (not shown) as a mask. At the same time, those parts of the silicon oxide film 11 which lie above the gate electrodes 7 are dry-etched at a rate higher than the rate at which the silicon nitride film 27 may be etched. This prevents the silicon nitride film 27 lying beneath the silicon oxide film 11 from being removed.

If the silicon oxide film 11 is dry-etched by using the silicon nitride film 27 lying beneath the film 11 as a mask, a single-layer film, i.e., the silicon nitride film 27, will remain on the diffusion layers (the n$^-$-type semiconductor regions 9 and the p$^-$-type semiconductor regions 20), and a two-layer film composed of the silicon nitride films 8 and 27 will remain on each gate electrodes 7. The silicon oxide film 5, lying partly on the substrate 1 and partly in the element-isolating trenches 2, will be etched excessively if the silicon nitride films 8 and 27 provided on each gate electrode 7 are dry-etched in the next step, together with the silicon nitride film 27 provided on the diffusion layers (the n$^-$-type semiconductor regions 9 and the p$^-$-type semiconductor regions 20), in order to make contact holes that reach these diffusion layers. Consequently, the leakage current in each element will increase thereby deteriorating the characteristics of the element. It is necessary to prevent excessive etching of the substrate 1 and the silicon oxide film 5. To this end, the silicon nitride film 8 that lies above each gate electrode 7 and that part of the silicon nitride film 27 which lies on the film 8 need to be etched in one step, and those parts of the silicon nitride film 27 which lie on the diffusion layers (n$^-$-type semiconductor regions 9 and p$^-$-type semiconductor regions 20) needs to be etched in another step. Hence, it would be necessary to use two photomasks.

Figure 53:
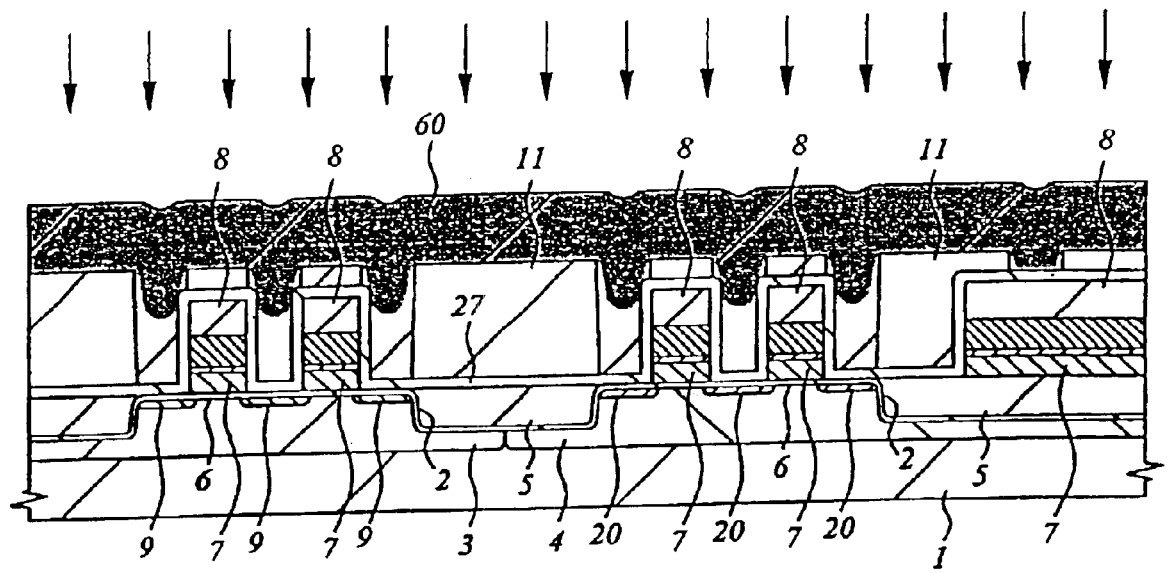
FIG. 53 is a sectional view of the semiconductor substrate, showing the method of manufacturing a semiconductor integrated circuit device, i.e., Embodiment 6 of this invention.

Then, in the present embodiment, the silicon oxide film 11 is dry-etched by using the silicon nitride film 27, which lies beneath the silicon oxide film 11, as etching stopper. Thereafter, as shown in FIG. 53, a positive-type photoresist film 60 is spin-coated on the silicon oxide film 11. Exposure light is applied to the entire surface of the photoresist film 60. At this time, those parts of the photoresist film 60 which lie above the gate electrode 7 are thin and therefore thoroughly affected by the light. Those parts of the photoresist film 60 which lie above the diffusion layers (the n$^-$-type semiconductor regions 9 and the p$^-$-type semiconductor regions 20) are thick and affected by the light at only the upper part.

Figure 54:
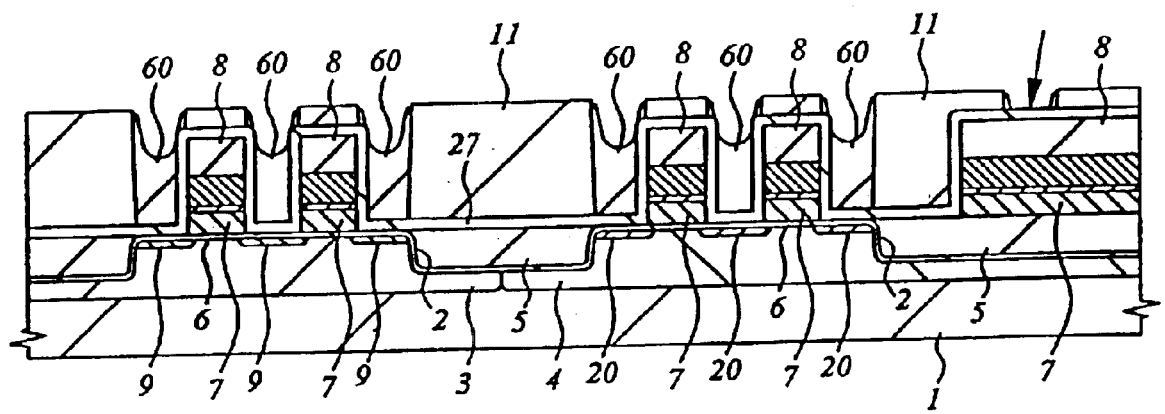
FIG. 54 is a sectional view of the semiconductor substrate, illustrating the method of manufacturing a semiconductor integrated circuit device, i.e., Embodiment 6 of the present invention.

Next, as shown in FIG. 54, the photoresist film 60 is developed, whereby those parts exposed to light are removed. At this time, those parts of the silicon nitride film 27, which lie above the gate electrodes 7 and which are indicated by arrows, are thereby exposed. On the other hand, the other parts of the film 27, which lie on the diffusion layers (the n⁻-type semiconductor regions 9 and the p⁻-type semiconductor regions 20), are not exposed. This is because the parts of the photoresist film 60, which have not been exposed to light, remain above the diffusion layers.

Figure 55:
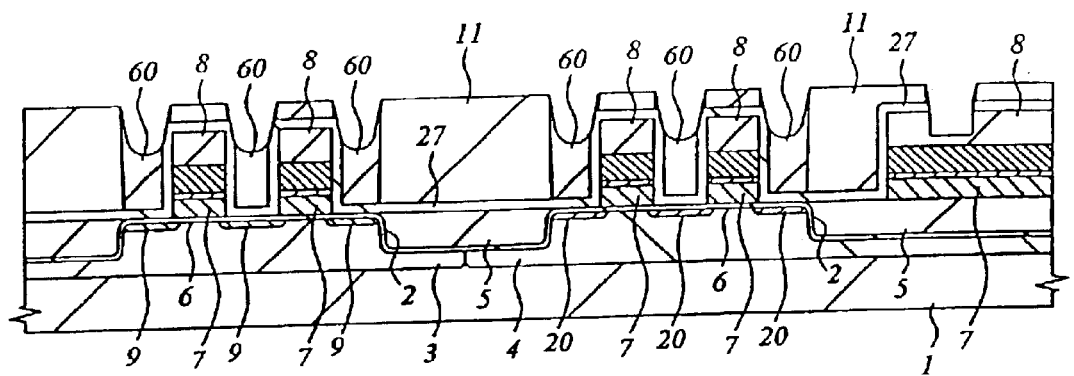
FIG. 55 is a sectional view of the semiconductor substrate, showing the method of manufacturing a semiconductor integrated circuit device, i.e., Embodiment 6 of the invention.

As shown in FIG. 55, those parts of the silicon nitride film 27 and 8, which lie above the gate electrode 7 is subjected to dry etching using, as a mask, the those parts of the photoresist film 60 which lie above the diffusion layers (the n⁻-type semiconductor regions 9 and the p⁻-type semiconductor regions 20). The silicon nitride films 27 and 8 are etched at a rate much higher than the rate at which the silicon oxide film 11 may be etched. Therefore, the etching is stopped at the time when the silicon nitride film 8 (covering the gate electrode 7) is etched to almost the same thickness as that of the silicon nitride film 27 covering the diffusion layers (i.e., the n⁻-type semiconductor regions 9 and the p⁻-type semiconductor regions 20).

Figure 56:
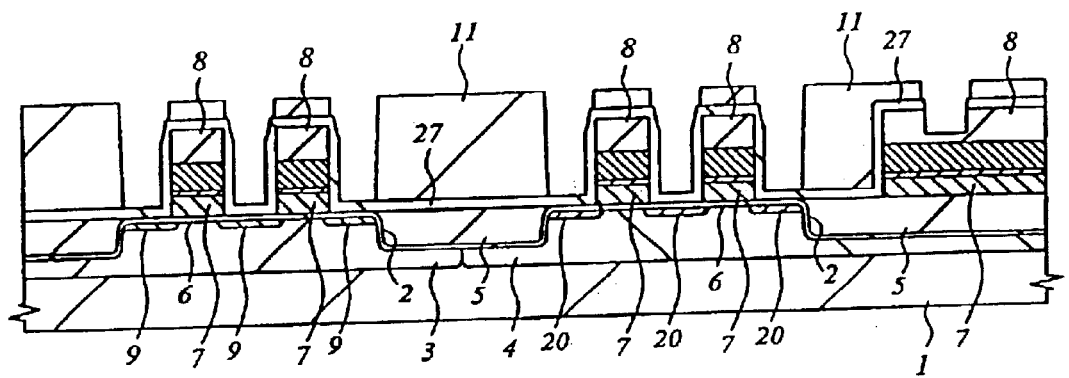
FIG. 56 is a sectional view of the semiconductor substrate, depicting the method of manufacturing a semiconductor integrated circuit device, i.e., Embodiment 6 of this invention.
Figure 57:
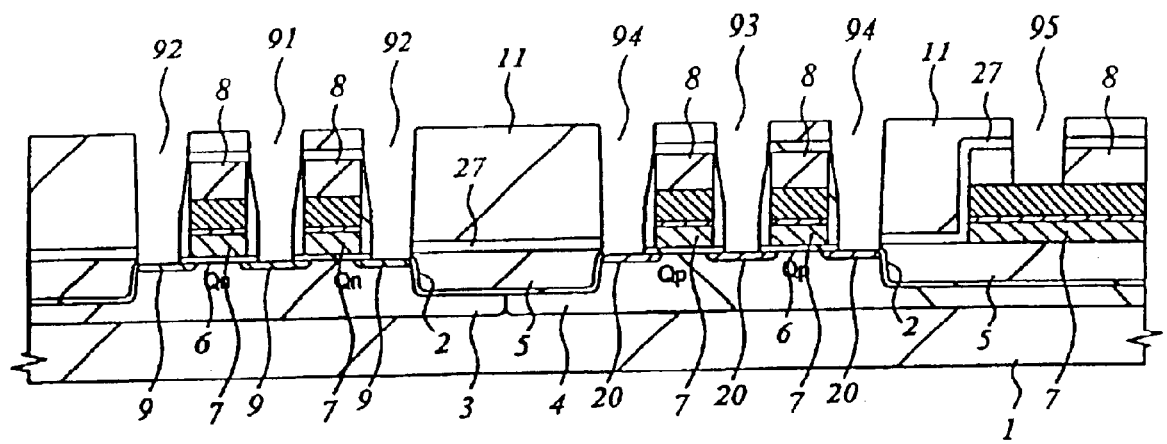
FIG. 57 is a sectional view of the semiconductor substrate, illustrating the method of manufacturing a semiconductor integrated circuit device, i.e., Embodiment 6 of the invention.

As shown in FIG. 56, those parts of the photoresist film 60, which remain above the diffusion layers (the n⁻-type semiconductor regions 9 and the p⁻-type semiconductor regions 20), are removed by means of ozone ashing. Then, as shown in FIG. 57, those parts of the silicon nitride films 27 which covers the diffusion layers (the n⁻-type semiconductor regions 9 and the p⁻-type semiconductor regions 20) are removed by dry etching. And, that part of the silicon nitride film 8 which covers the gate electrode 7 is also removed by dry etching. As a result, contact holes 91 and 92 are thereby made, thereby exposing the n⁻-type semiconductor regions 9, and contact holes 93 and 94 are made thereby exposing the p⁻-type semiconductor regions 20, and a contact hole 95 is made thereby exposing the gate electrode 7. The silicon nitride films 8 and 27 are subjected to anisotropic etching, thereby leaving silicon nitride films 27 on the sides of every gate electrode 7.

The silicon nitride film 8 and 27 are etched after those parts of these films which lie above the diffusion layers (the n⁻-type semiconductor regions 9 and the p⁻-type semiconductor regions 20), and the gate electrode 7 have been etched to almost the same thickness. Hence the silicon oxide film 5 provided in the element-isolating trenches 2 or the substrate 1 would not be etched excessively even if the silicon nitride films 8 and 27 were etched at the same time.

In Embodiment 6, the contact hole 95, exposing the gate electrode 7 can be made at the same time the contact holes 91 to 94 are made in self-alignment with respect to the other gate electrodes 7 and the element-isolating trenches 2. Therefore, it suffices to use only one photomask to make the contact holes 91 to 95.

Figure 58:
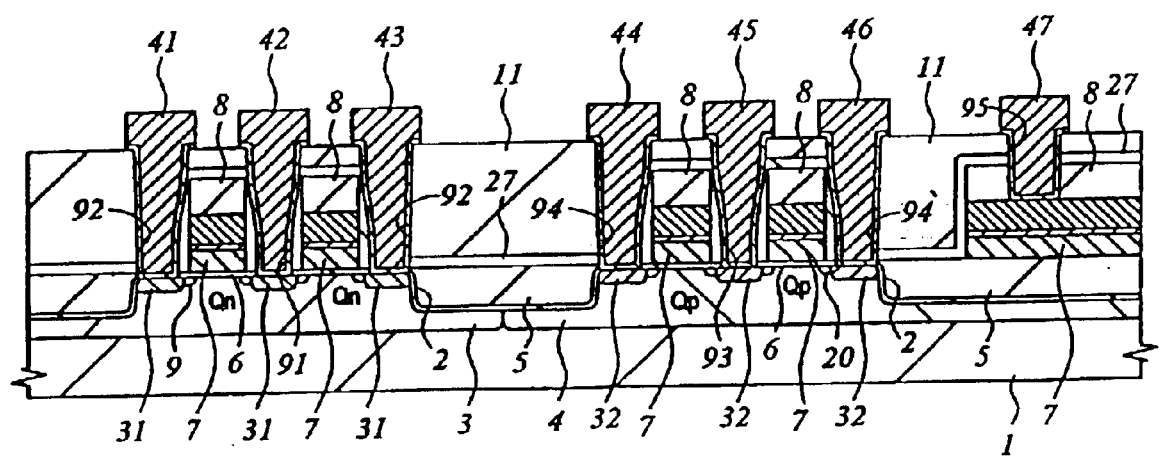
FIG. 58 is a sectional view of the semiconductor substrate, showing the method of manufacturing a semiconductor integrated circuit device, i.e., Embodiment 6 of the present invention.

Next, as shown in FIG. 58, n-type impurities (phosphorus or arsenic) are ion-implanted into the p-type well 3 through the contact holes 91 and 92, thereby forming n⁺-type semiconductor regions (source and drain) 31, whereby n-channel MISFETs Qn are formed. Further, p-type impurities (boron) are ion-implanted into the n-type well 4 through the contact holes 93 and 94, thereby forming p⁺-type semiconductor regions (source and drain) 32, whereby p-channel MISFETs Qp are formed. Thereafter, first-layer wires 41 to 47 are formed on the silicon oxide film 11 in the same way as in Embodiments 3 to 5.

The invention has been described, with reference to some embodiments. The present invention is not limited to these embodiments. Rather, various changes and modification can be made without departing the spirit and scope of the invention.

Some of the various advantages achieved by this invention are as follows:

(1) The invention enhances the reliability and manufacturing yield of a DRAM having data-storing capacitive elements, each having its lower electrode formed in a trench made in an insulating film.

(2) The invention makes it possible to form, with a high yield, conductive layers in the trenches Or through holes made in an insulating film.

(3) The invention renders it possible to form conductive layers in the trenches or through holes made in an insulating film, by performing few manufacturing steps.

What is claimed is:

1. A method of manufacturing a semiconductor integrated circuit device having at least one memory cell composed of a cell-selecting MISFET formed in a major surface of a semiconductor substrate and a data-storing capacitive element provided above the cell-selecting MISFET, said method comprising the steps of:

(a) forming the cell-selecting MISFET on a surface of a semiconductor substrate, forming a first insulating film on the cell-selecting MISFET, and forming, in a through hole made in the first insulating film, a first conductive film electrically connected to a source or drain of the cell-selecting MISFET;

(b) forming a second insulating film on the first insulating film and making a trench in the second insulating film;

(c) forming a second conductive film in the trench and on the second insulating film, said second conductive film extending through the trench and electrically connected to the first conductive film;

(d) convering the second conductive film with a photoresist film and applying exposure light to the photoresist film, thereby exposing a part of the photoresist film which lies outside the trench to light;

(e) removing the part of the photoresist film which has been exposed to light, thereby leaving, in the trench, the other part of the photoresist film which is not exposed to light;

(f) removing a part of the second conductive film which is not covered with said other part of the photoresist film, thereby leaving the other part of the second conductive film in the trench; and (g) removing said other part of the photoresist film that lies in the trench, and then forming a third insulating film in the trench and on the remaining second insulating film and forming a third conductive film on the third insulating film, thereby forming the data-storing capacitive element composed of a first electrode, a capacitive insulating film and a second electrode which are said made of said remaining second conductive film, said third insulating film and said third conductive film, respectively.

2. A method of manufacturing a semiconductor integrated circuit device having at least one memory cell composed of a cell-selecting MISFET formed in a major surface of a semiconductor substrate and a data-storing capacitive element provided above the cell-selecting MISFET, said method comprising the steps of:

(a) forming the cell-selecting MISFET on the surface of the semiconductor substrate, forming a first insulating film on the cell-selecting MISFET, and forming, in a through hole made in the first insulating film, a first conductive film electrically connected to a source or drain of the cell-selecting MISFET;

(b) forming a second insulating film on the first insulating film and making a trench in the second insulating film;

(c) forming, in the trench and on the second insulating film, a second conductive film made of amorphous silicon and electrically connected to the first conductive film via the trench;

(d) covering the second conductive film with a photoresist film and applying exposure light to the phororesist film, thereby exposing a part of a the photoresist film which lies outside the trench to light;

(e) removing said part of the photoresist film which has been exposed to light, thereby leaving, in the trench, the other part of the photoresist film which is not exposed to light;

(f) removing a part of the second conductive film which is not covered with said other part of the photoresist film, thereby leaving the remaining of the second conductive film in the trench;

(g) removing said other part of the photoresist film which lies in the trench and forming depressions and projections in and on the surface of the second conductive film exposed in the trench;

(h) heat-treating said remaining second conductive film, converting amorphous silicon to a polyorystalline film; and (i) forming a third insulating film in the trench and on the second insulating film and forming a third conductive film on the third insulating film, thereby forming the data-storing capacitive element composed of a first electrode, a capacitive insulating film and a second electrode which are made of said remaining second conductive film, said third insulating film and said third conductive film, respectively.

3. A method of manufacturing a semiconductor integrated circuit device having at least one memory cell composed of a cell-selecting MISFET formed in a major surface of a semiconductor substrate and a data-storing capacitive element provided above cell-selecting MISFET, said method comprising the steps of:

(a) forming the cell-selecting MISFET on a surface of a semiconductor substrate, forming a first insulating film on the cell-selecting MISFET, and forming, in a through hole made in the first insulating film, a first conductive film electrically connected to a source or drain of the cell-selecting MISFET;

(b) forming a second insulating film on the first insulating film and making a trench in the second insulating film;

(c) forming, in the trench and on the second insulating film, a second conductive film made amorphous silicon and electrically connected to the first conductive film via the trench;

(d) forming depressions and projections in and on the surface of the second conductive film;

(e) heat-treating the second conductive film, converting the same to a polycrystalline film; and (f) convering the second conductive film with a photoresist film and applying exposure light to the photoresist film, thereby exposing a part of the photoresist film which lies outside the trench to light;

(g) removing said part of the photoresist film which has been exposed to light, thereby leaving the other part of the photoresist film which lies in the trench;

(h) removing a part of the second conductive film which is not covered with said other part of the photoresist film, thereby leaving the remaining second conductive film in the trench;

(i) removing said other part of the photoresist film which lies in the trench, then forming a third insulating film in the trench and on said second insulating film and forming a third conductive film on the third insulating film, thereby forming the data-storing capacitive element composed of a first electrode, a capacitive insulating film and a second electrode which are made of said remaining second conductive film, said third insulating film and said third conductive film, respectively.

4. The method of manufacturing a semiconductor integrated circuit device, according the claim 2, wherein said part of the second conductive film which is not covered with said other part of the photoresist film is removed by means of etching using said other part of the photoresist film as a mask.

5. The method of manufacturing a semiconductor integrated circuit device, according to claim 2, wherein the depressions and projections are formed in and on the remaining second conductive film, by growing silicon grains on the surface of the remaining second conductive film made of amorphous silicon.

6. The method of manufacturing a semiconductor integrated circuit device, according to claim 2, wherein when said part of the second conductive film which is not covered with said remaining photoresist film is removed, an upper edge of said remaining part of the second conductive film which lies in the trench is made to recede below a rim of the trench.

7. The method of manufacturing a semiconductor integrated circuit device, according to claim 6, wherein the upper edge of the remaining second conductive film is made to recede by a distance substantially equal to a diameter of the depressions and projections formed in and on the surface of the remaining conductive film.

8. The method of manufacturing a semiconductor integrated circuit device, according to claim 1, wherein the second insulating film is a silicon oxide film.

9. The method of manufacturing a semiconductor integrated circuit device, according to claim 1, wherein the third insulating film is a film having a large dielectric constant or a ferroelectric film.

* * * * *